United States Patent
Yamanaka et al.

(10) Patent No.: US 6,521,525 B2
(45) Date of Patent: Feb. 18, 2003

(54) ELECTRO-OPTIC DEVICE, DRIVE SUBSTRATE FOR ELECTRO-OPTIC DEVICE AND METHOD OF MANUFACTURING THE SAME

(75) Inventors: Hideo Yamanaka, Kanagawa (JP); Hisayoshi Yamoto, Kanagawa (JP); Yuichi Satou, Kanagawa (JP); Hajime Yagi, Tokyo (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 09/993,765

(22) Filed: Nov. 27, 2001

(65) Prior Publication Data

US 2002/0056837 A1 May 16, 2002

Related U.S. Application Data

(62) Division of application No. 09/413,497, filed on Oct. 6, 1999, now Pat. No. 6,346,718.

(30) Foreign Application Priority Data

Oct. 7, 1998 (JP) .............................................. 10-285476

(51) Int. Cl.[7] ....................... H01L 31/119; H01L 29/04; H01L 31/036
(52) U.S. Cl. ........................... 438/637; 438/638; 257/59
(58) Field of Search .................................. 438/637, 638, 438/687; 257/59

(56) References Cited

U.S. PATENT DOCUMENTS

| 4,358,326 A | * | 11/1982 | Doo |
| 5,447,117 A | * | 9/1995 | Yonehara et al. |
| 6,218,302 B1 | * | 4/2001 | Braeckelmann et al. |
| 6,372,665 B1 | * | 4/2002 | Watanabe et al. |

OTHER PUBLICATIONS

"Dendritic Polysilicon for DRAM Capacitors", IBM Tech Disclosure Bullitin, vol. 36 #11, pp 493–494, Nov. 1, 1993.*

\* cited by examiner

*Primary Examiner*—Stephen D. Meier
(74) *Attorney, Agent, or Firm*—Rader, Fishman, & Grauer PLLC; Ronald P. Kananen, Esq.

(57) ABSTRACT

An electro-optic device, such as an LCD, includes a display unit and a peripheral drive circuit unit on a single substrate. A gate comprising a gate electrode and gate insulation film is formed on a surface of the substrate. A layer of a substance having good lattice compatibility with manocrystalline silicon is formed over the gate insulation film. A layer of monocrystalline silicon is formed over the substance layer. Manocrystalline silicon is heteroepitaxially grown by catalytic CVD or the like using a crystalline sapphire film formed on the substrate to form the monocrystalline silicon layer. The monocrystalline silican layer is used as a dual gate MOSTFT of the electro-optic device.

94 Claims, 76 Drawing Sheets

FORMING OF REFLECTION FILM (e.g., ALUMINUM FILM)

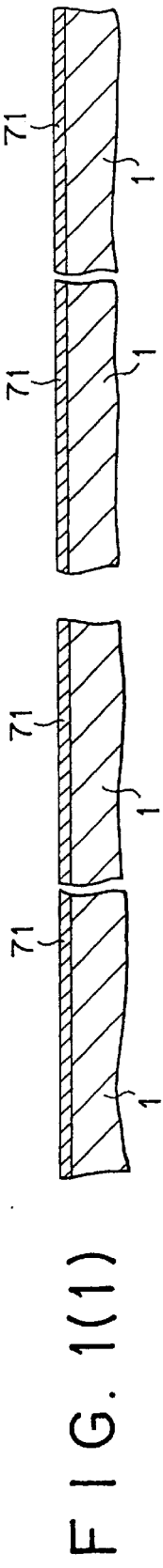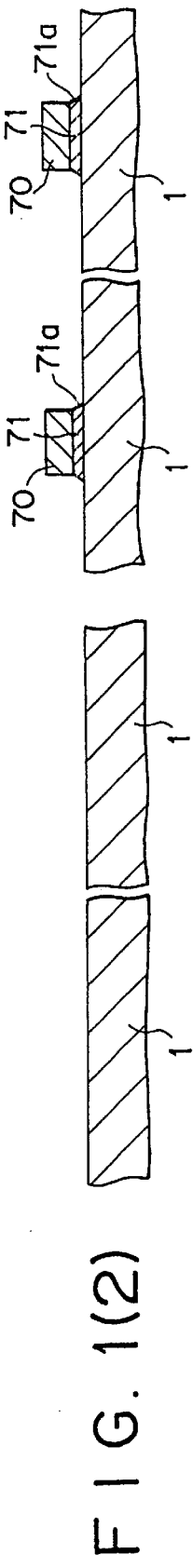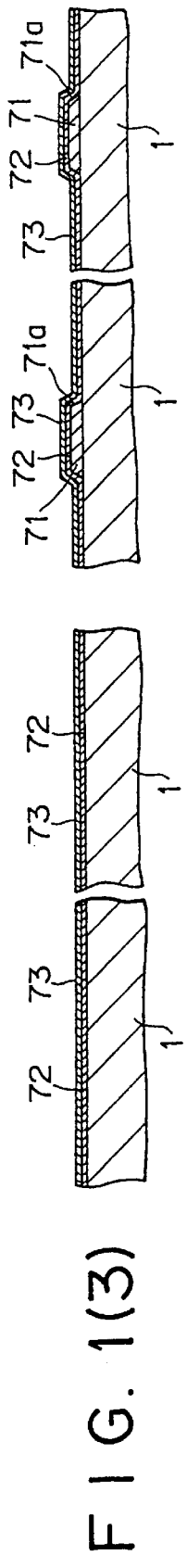

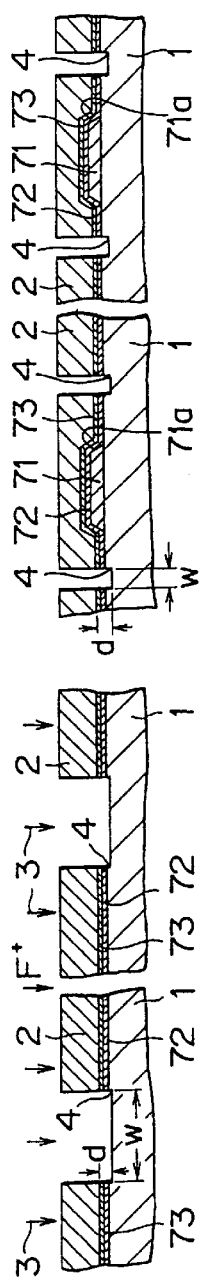
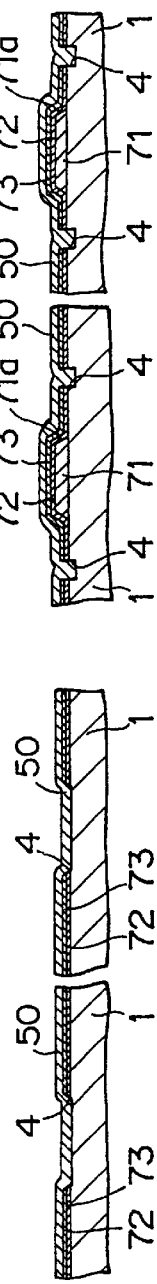
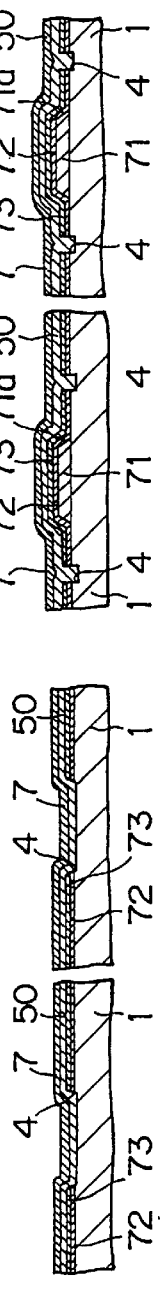
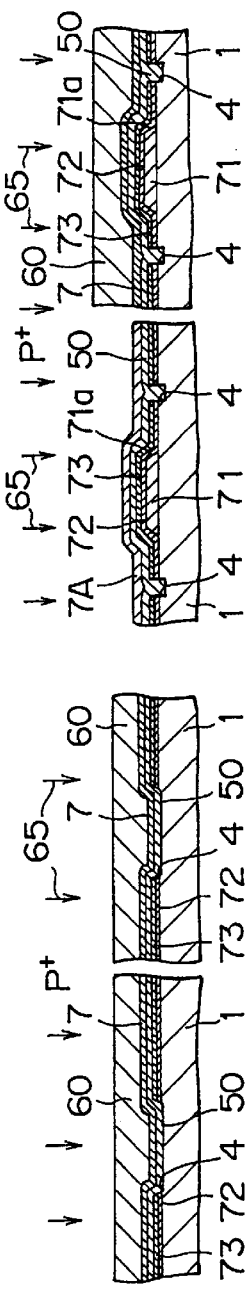
FIG. 2(4) FORMING OF STEP ON SUBSTRATE
FIG. 2(5) FORMING OF CRYSTALLINE SAPPHIRE FILM
FIG. 2(6) HETEROEPITAXIAL GROWTH OF MONOCRYSTALLINE SILICON BY CATALYTIC CVD
FIG. 2(7) ADJUSTMENT OF RESISTIVITY AND FORMING OF PHOTORESIST AND N TYPE WELL

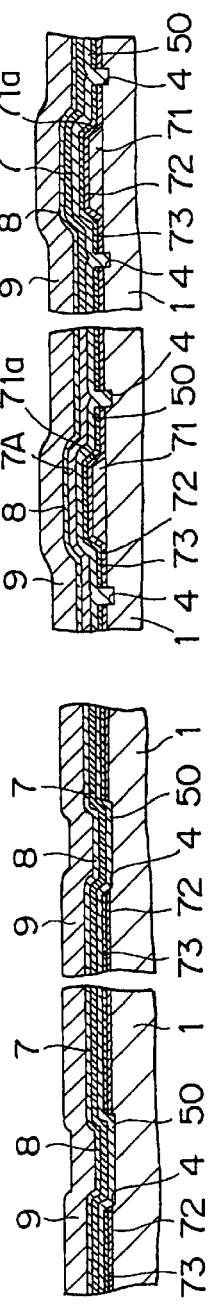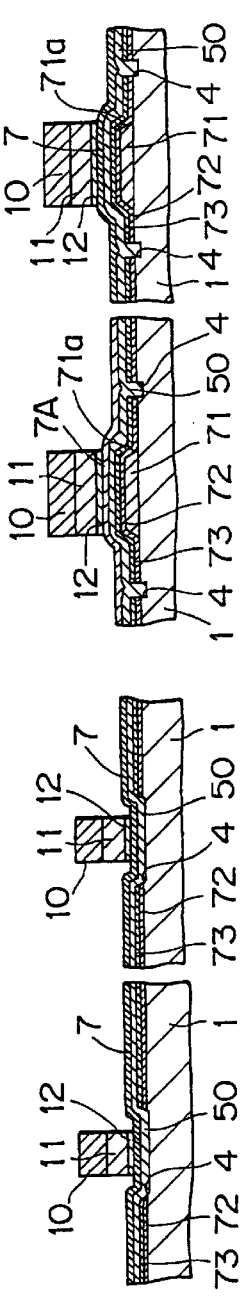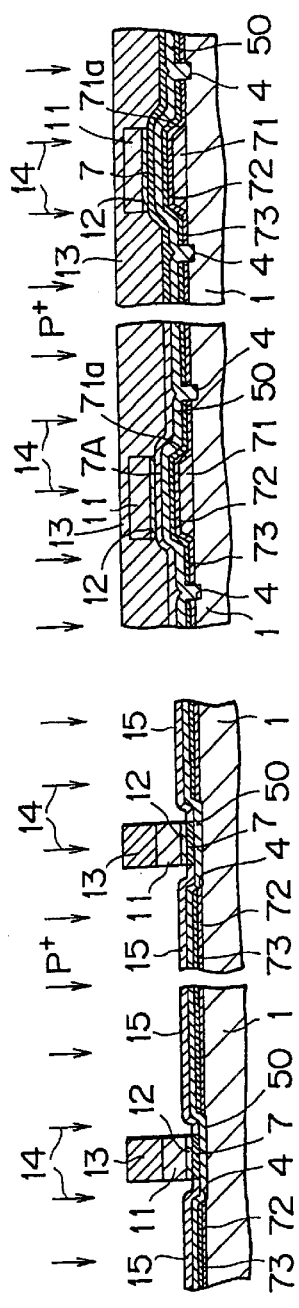
F I G. 3(8) FORMING OF TOP GATE INSULATING FILM (SiO2/SiN FILM) AND FORMING OF TOP GATE ELECTRODE MATERIAL FILM (MOLYBDENUM/TANTALUM ALLOY)
F I G. 3(9) FORMING OF TOP GATE INSULATING FILM (NITRIDE FILM/OXIDE FILM) AND FORMING OF TOP GATE ELECTRODE (Mo/Ta)
F I G. 3(10) FORMING OF PHOTORESIST AND FORMING OF DISPLAL UNIT nMOSTFT LDD

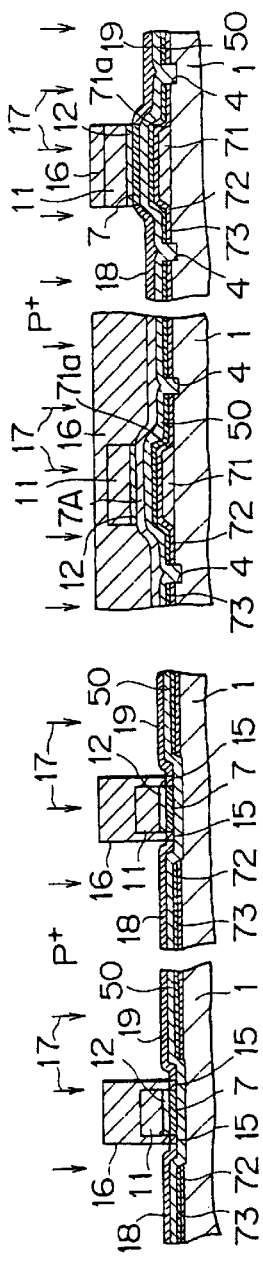
F I G. 4(11)
FORMING OF SOURCE/DRAIN OF nMOSTFT
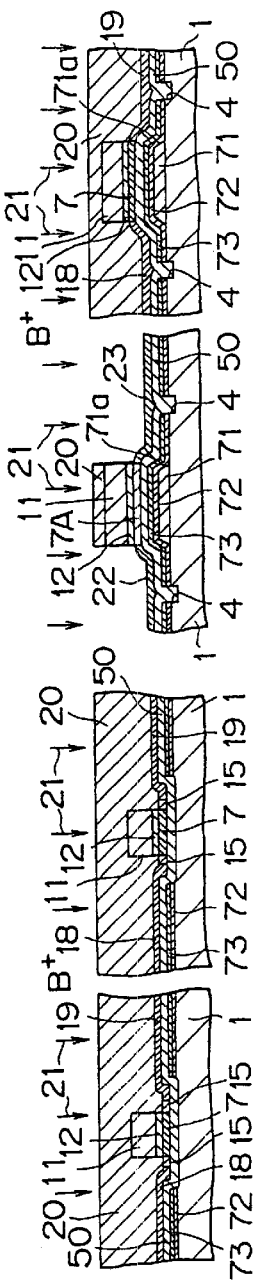
F I G. 4(12)
FORMING OF SOURCE/DRAIN OF pMOSTFT OF PERIPHERAN DRIVE CIRCUIT UNIT
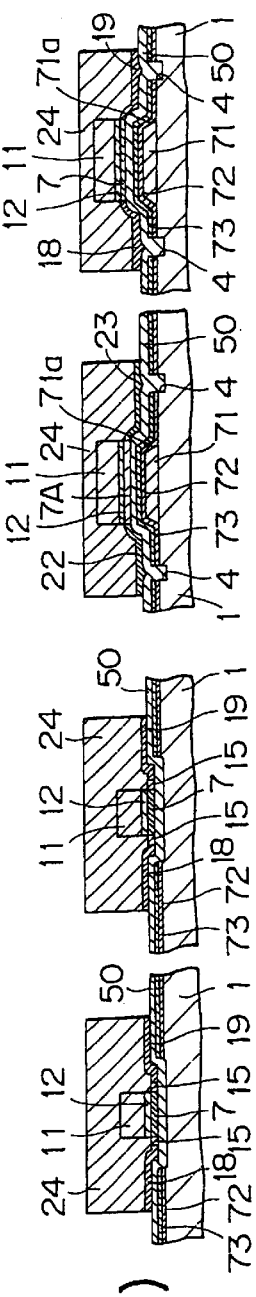
F I G. 4(13)
ISLAND FORMING OF ACTIVE ELEMENT AND PASSIVE ELEMENT UNIT

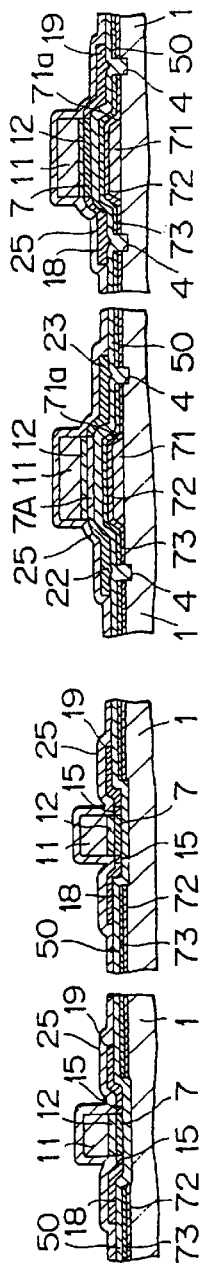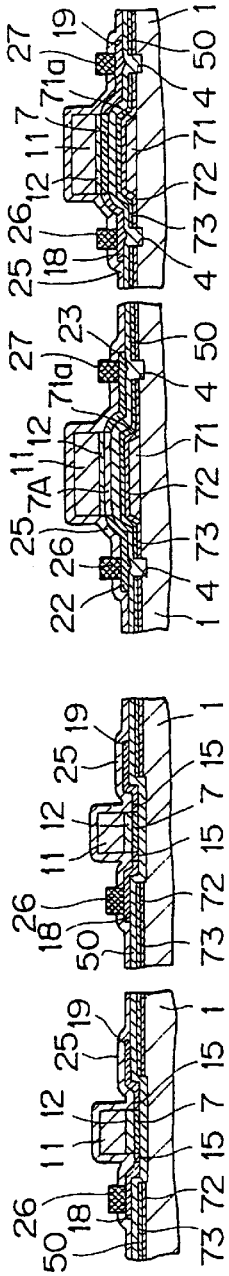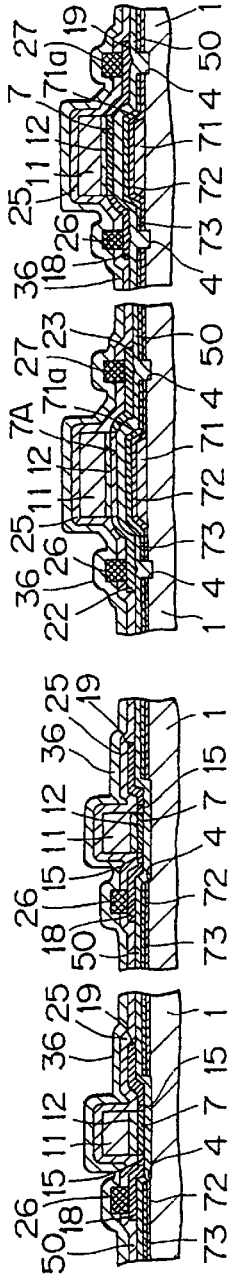
F I G. 5(14) FORMING AND ACTIVATION OF PROTECTIVE FILM (PSG/SiO2)
F I G. 5(15) FORMING OF DISPLAY UNIT SOURCE AND PERIPHERAL DRIVE CIRCUIT UNIT SOURCE/DRAIN UNIT SOURCE ELECTRODE AND PERIPHERAL DRIVE CIRCUIT UNIT SOURCE/DRAIN ELECTRODE
F I G. 5(16) FORMING OF SiN/PSG FILM F I G. 10A
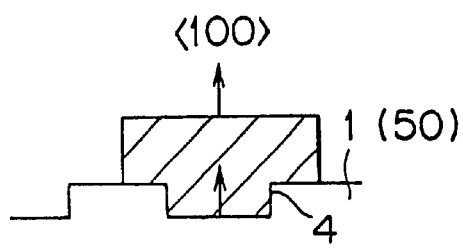
F I G. 10B
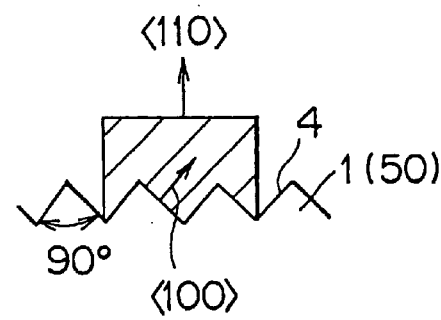
F I G. 10C
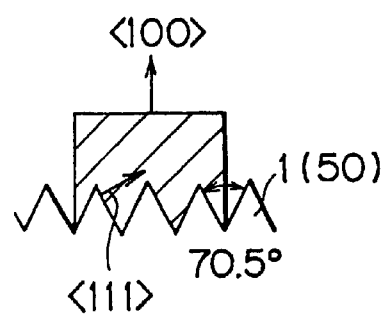
F I G. 10D
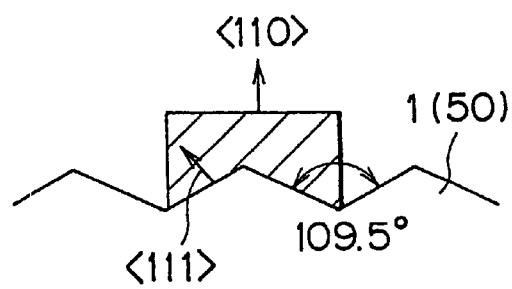
F I G. 10E
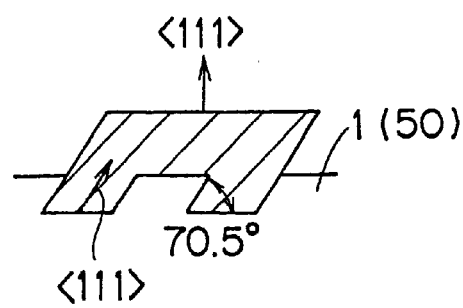
F I G. 10F
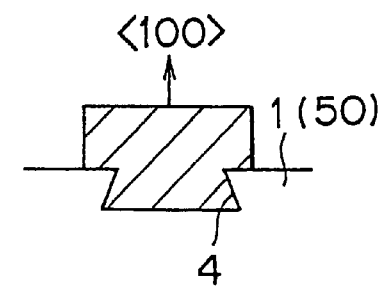

FIG. 13

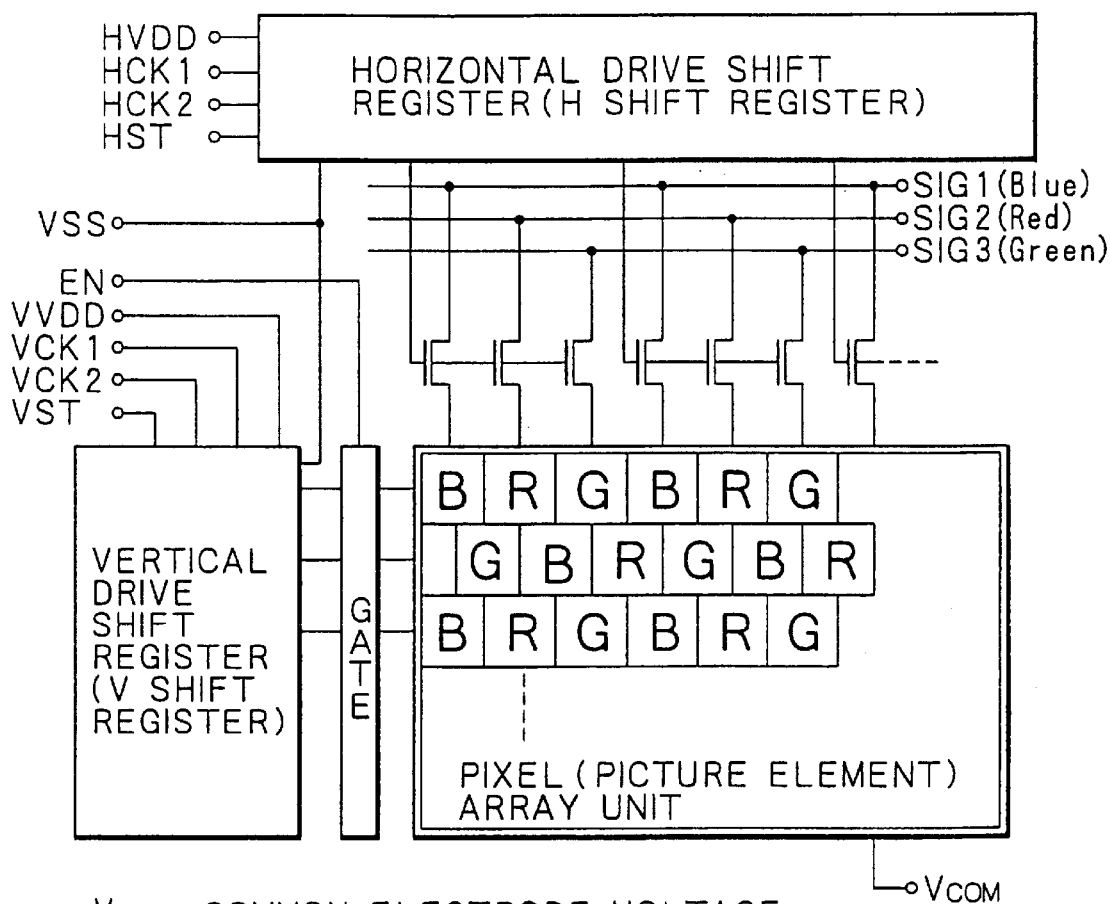

- Vcom: COMMON ELECTRODE VOLTAGE
- HVDD: H DRIVER POWER INPUT TERMINAL
- VVDD: V DRIVER POWER INPUT TERMINAL
- HCK1: H SHIFT REGISTER DRIVE CLOCK INPUT TERMINAL
- HCK2: H SHIFT REGISTER DRIVE CLOCK INPUT TERMINAL
- VCK1: V SHIFT RESISTER DRIVE CLOCK INPUT TERMINAL
- VCK2: V SHIFT REGISTER DRIVE CLOCK INPUT TERMINAL
- HST: H SHIFT REGISTER START PULSE INPUT TERMINAL
- VST: V SHIFT REGISTER START PULSE INPUT TERMINAL
- VSS: H, V DRIVER GND TERMINAL
- SIG1: VIDEO SIGNAL INPUT TERMINAL (BLUE)
- SIG2: VIDEO SIGNAL INPUT TERMINAL (RED)
- SIG3: VIDEO SIGNAL INPUT TERMINAL (GREEN)

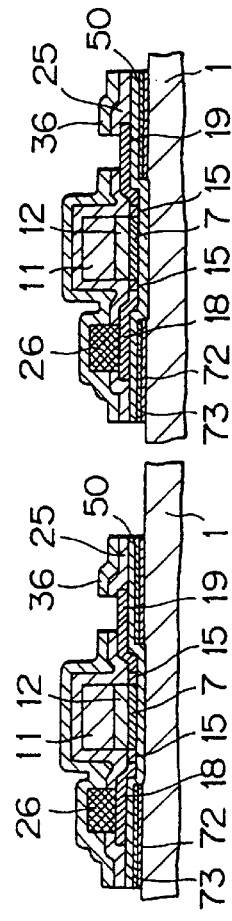
F I G. 14(17)
DRAIN CONTACT OPENING
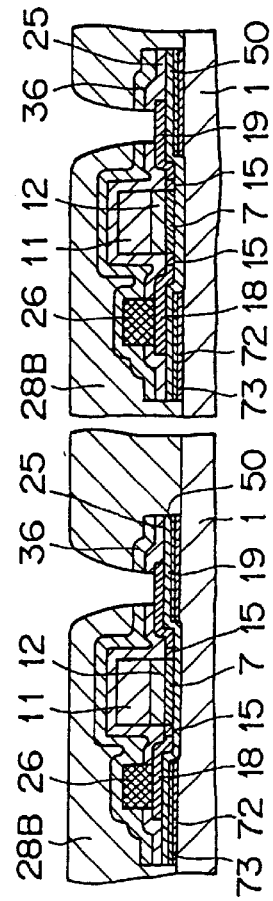
F I G. 14(18)
FORMING OF TRANSPARENT FLATTENING FILM AND DRAIN CONTACT OPENING
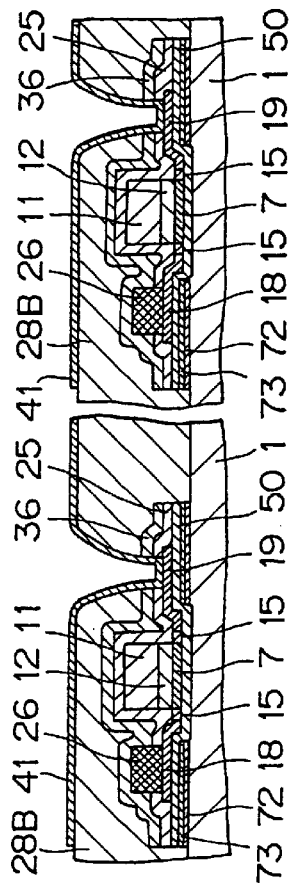
F I G. 14(19)
FORMING OF TRANSPARENT ELECTRODE (e.g., ITO ELECTRODE)

FORMING OF SOURCE/DRAIN
CONTACT OPENING
ELECTRODE, Sin/PSG FILM
F I G. 16(17)
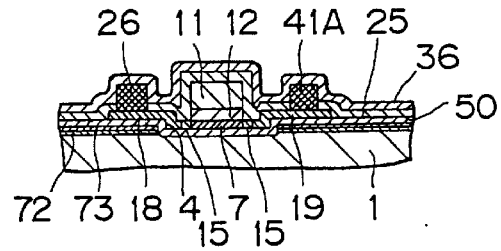
FORMING OF COLOR FILTER
F I G. 16(18)
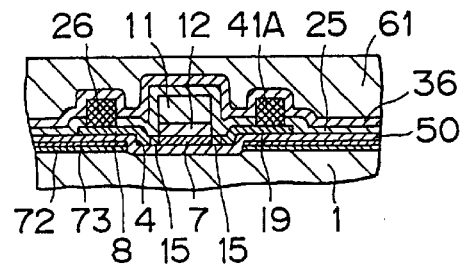
FORMING OF DRAIN CONTACT
OPENING AND BLACK MASK LAYER
F I G. 16(19)
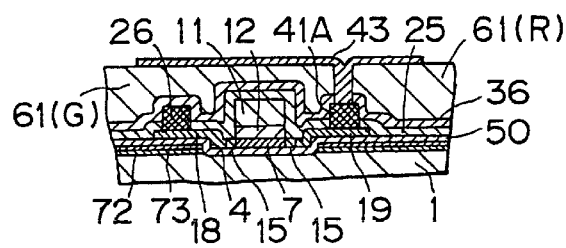
FORMING OF FLATTENING FILM,
FORMING OF PIXEL ELECTRODE
F I G. 16(20)
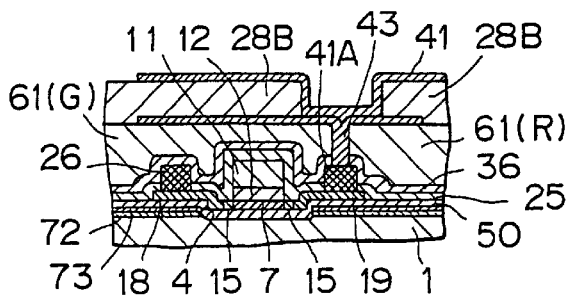

FIG. 17A
FIG. 17B
FIG. 17C

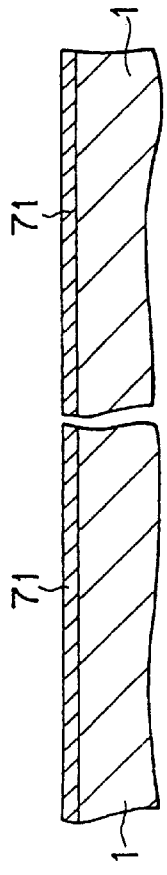
FIG. 18(1) FORMING OF GATE ELECTRODE MATERIAL FILM (Mo/Ta)
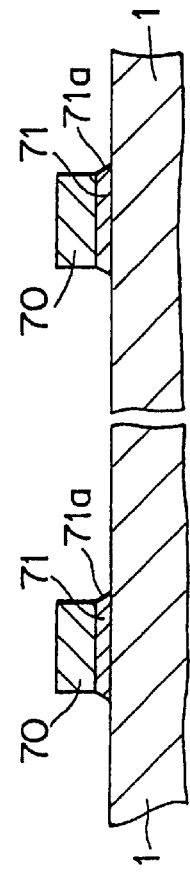
FIG. 18(2) TOP ELECTRODE MATERIAL FILM TAPER ETCHING (FORMING OF GATE ELECTRODE)
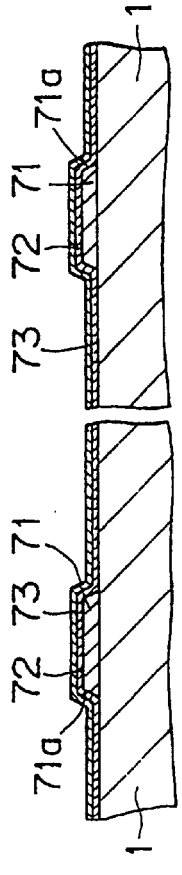
FIG. 18(3) FORMING OF GATE INSULATING FILM (SiO2/SiN FILM)

FORMING OF STEP ON SUBSTRATE
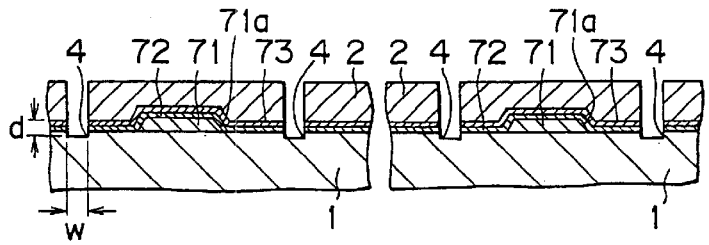
F I G. 19(4)
FORMING OF CRYSTALLINE SAPPHIRE FILM
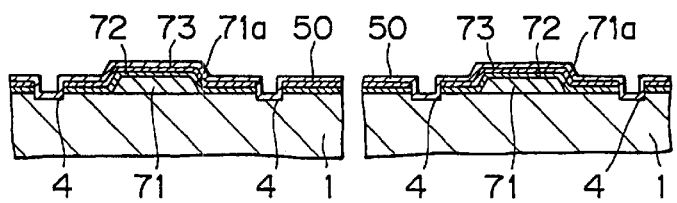
F I G. 19(5)
HETEROEPITAXIAL GROWTH OF MONOCRYSTALLINE SILICON BY CATALYTIC CVD
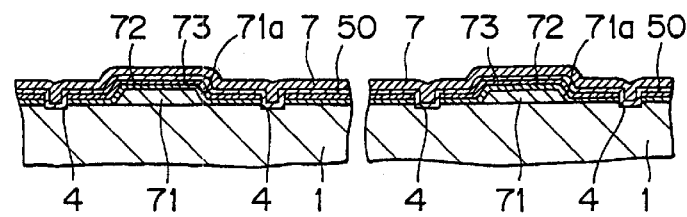
F I G. 19(6)
FORMING OF DISPLAY UNIT nMOSTFT LDD LAYER
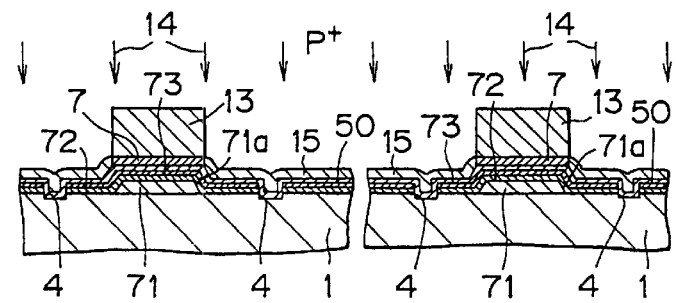
F I G. 19(7)

FORMING OF SOURCE/DRAIN
OF nMOSTFT

FORMING OF RESIST

ISLAND FORMING OF ACTIVE ELEMENT
UNIT AND PASSIVE ELEMENT UNIT

FORMING AND ACTIVATION OF
PROTECTIVE FILM (PSG/SiO2)

FORMING OF SOURCE CONTACT
OPENING AND SOURCE ELECTRODE

FORMING OF PRTECTIVE FILM (Sin/PSG)
AND DRAIN OPENING

FORMING OF PHOTOSENSITIVE RESIN FILM

SURFACE ROUGHNING OF PHOTOSENSITIVG
FILM, DRAIN OPENING AND
REFLECTION FILM (e.g., ALUMINUM FILM)

<DISPLAY UNIT>

FORMING OF GATE INSULATING FILM BY ANODE OXIDATION

HETEROEPITAXIAL GROWTH OF MONOCRYSTALLINE SILICON BY CATALYTIC CVD

SURFACE ROUGHENING OF PHOTOSENSITIVE FILM, DRAIN OPENING AND REFLECTION FILM (e.g., ALUMINUM FILM)

<DISPLAY UNIT>
FORMING OF TOP GATE INSULATING FILM,
TOP GATE ELECTRODE MATERIAL FILM
F I G. 23(7)
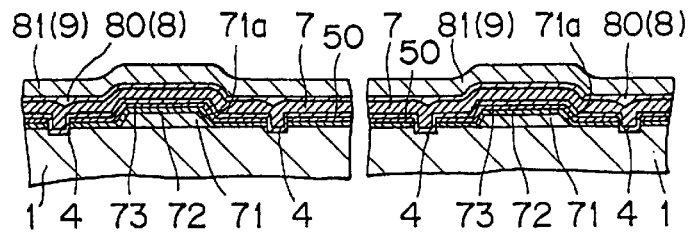
PATTERNING OF TOP GATE INSULATING FILM,
TOP GATE ELECTRODE
F I G. 23(8)
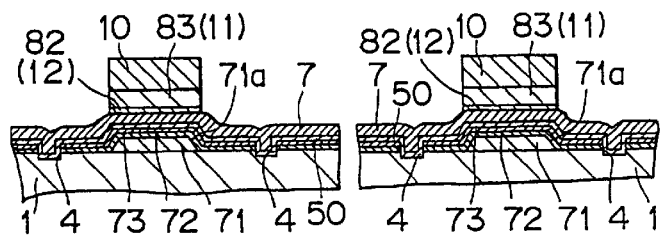
FORMING OF DISPLAY nMOSTFT LDD LAYER
F I G. 23(9)
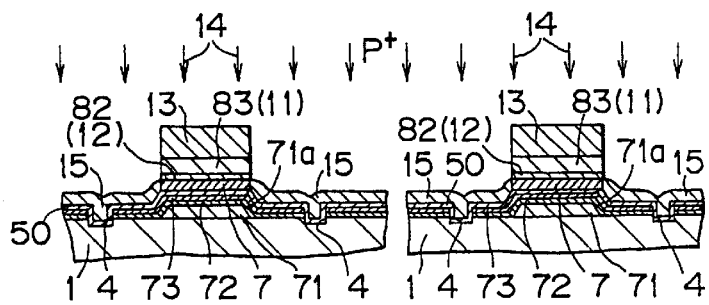
FORMING OF SOURCE/DRAIN OF nMOSTET
F I G. 23(10)
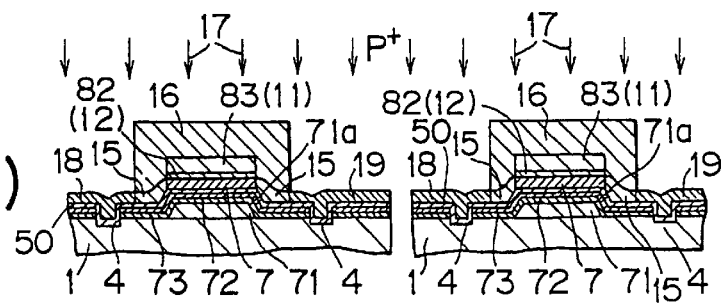

FORMING OF RESIST

ISLAND FORMING OF ACTIVE ELEMENT UNIT AND PASSIVE ELEMENT UNIT

FORMING AND ACTIVATION OF PROTECTIVE FILM (PSG/SiO2)

FORMING OF SOURCE CONTACT OPENING AND SOURCE ELECTRODE

INSULATING FILM (SiN/PSG) AND DRAIN OPENING
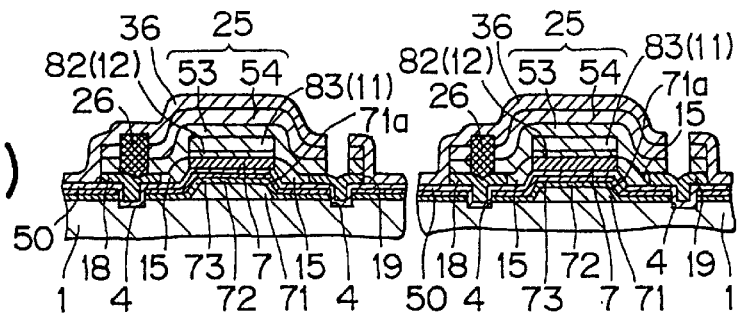
F I G. 25(15)
FORMING OF PHOTOSENSITIVE RESIN FILM
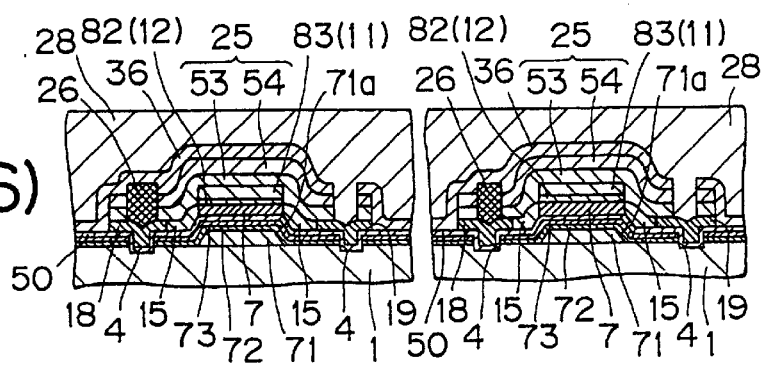
F I G. 25(16)
SURFACE ROUGHENING OF PHOTOSENSITIVE FILM, DRAIN OPENING AND REFLECTION (e.g., ALUMINUM FILM)
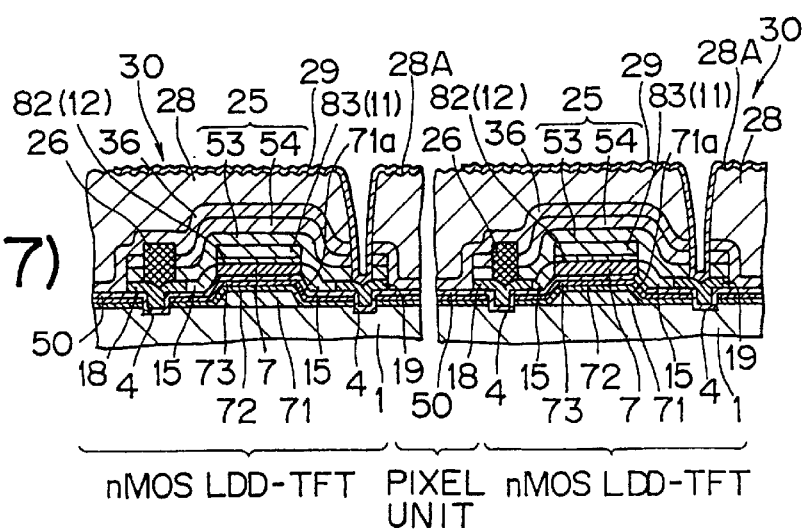
F I G. 25(17)

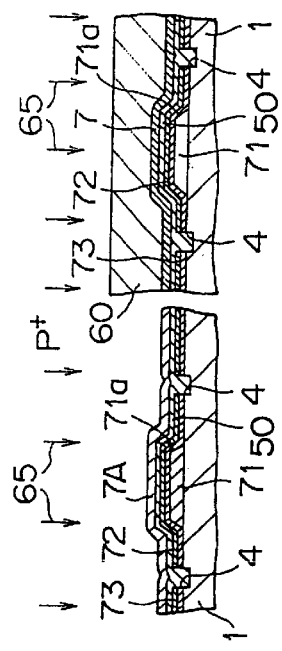
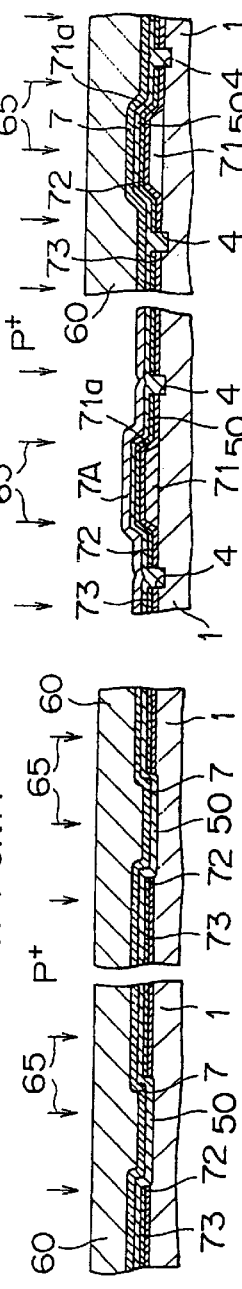
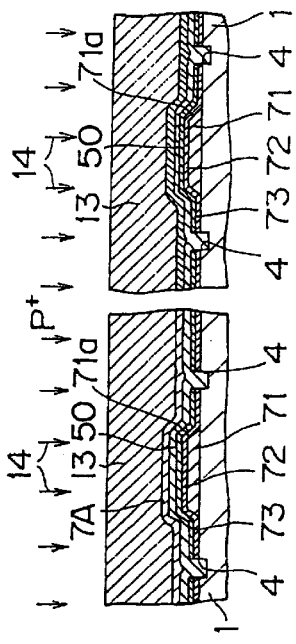
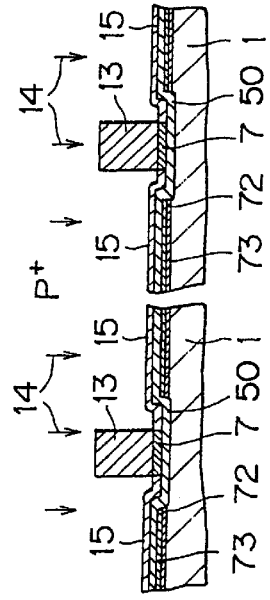
F I G. 26(7)
F I G. 26(8)

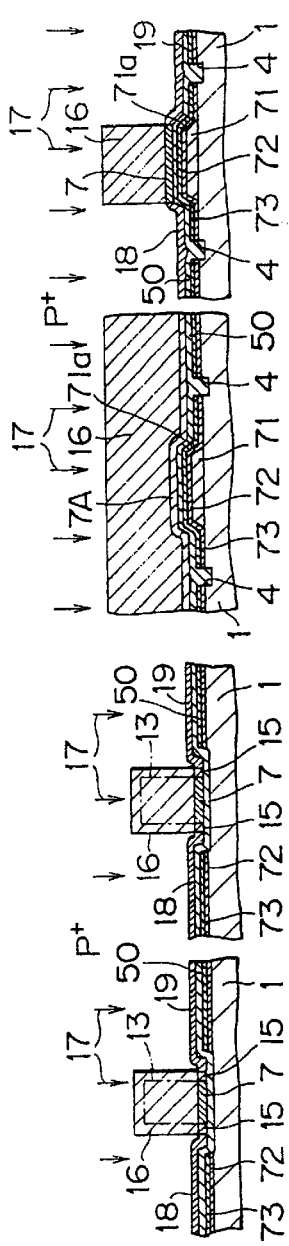
F I G. 27(9)
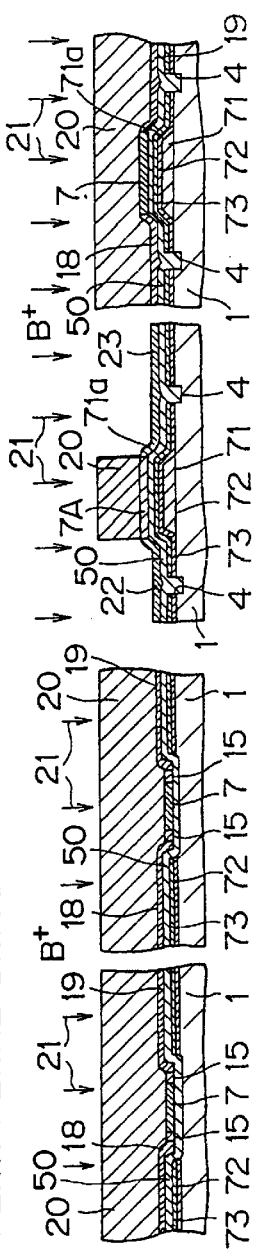
F I G. 27(10)
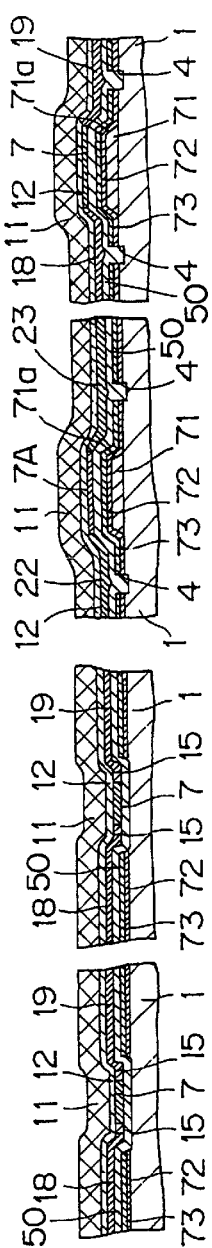
F I G. 27(11)

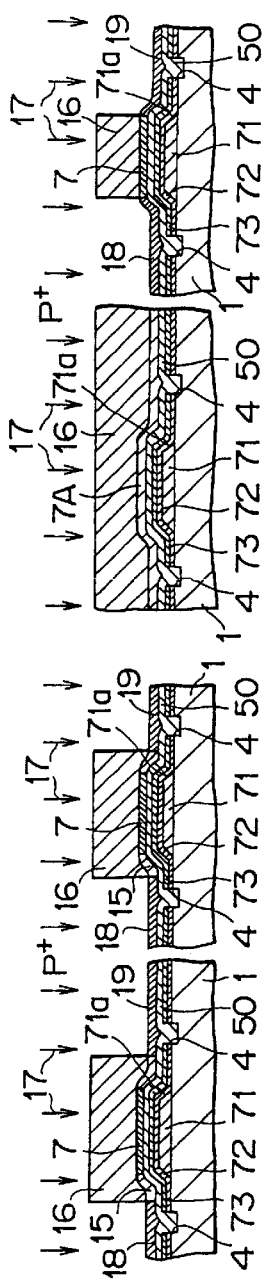
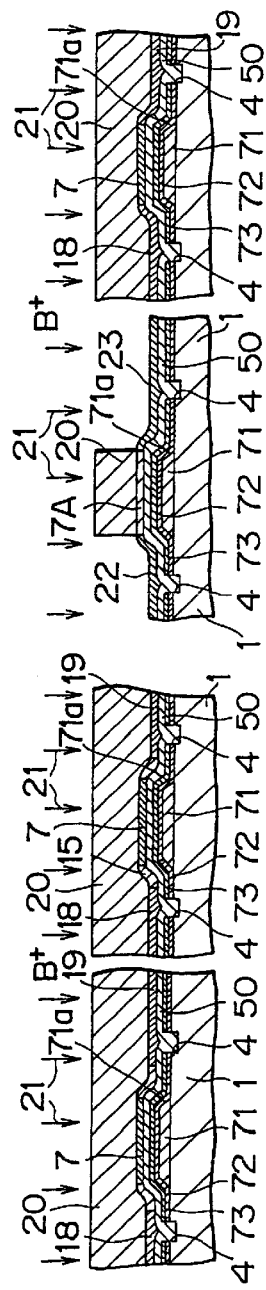
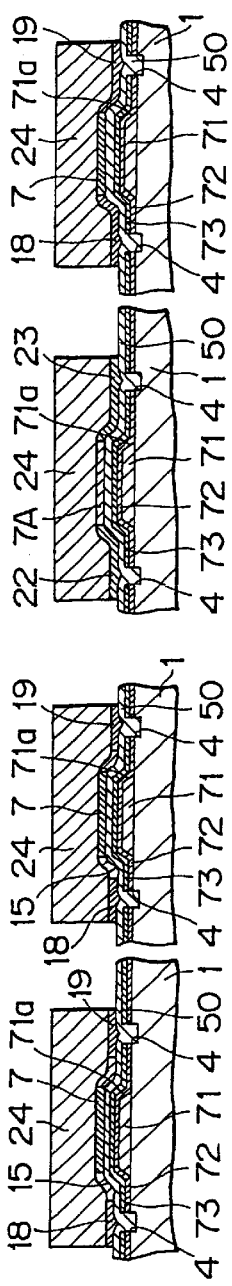

FORMING OF STEP ON GLASS SUBSTRATE

FORMING OF STEP ON SiN FILM OR CRYSTALLINE SAPPHIRE FILM

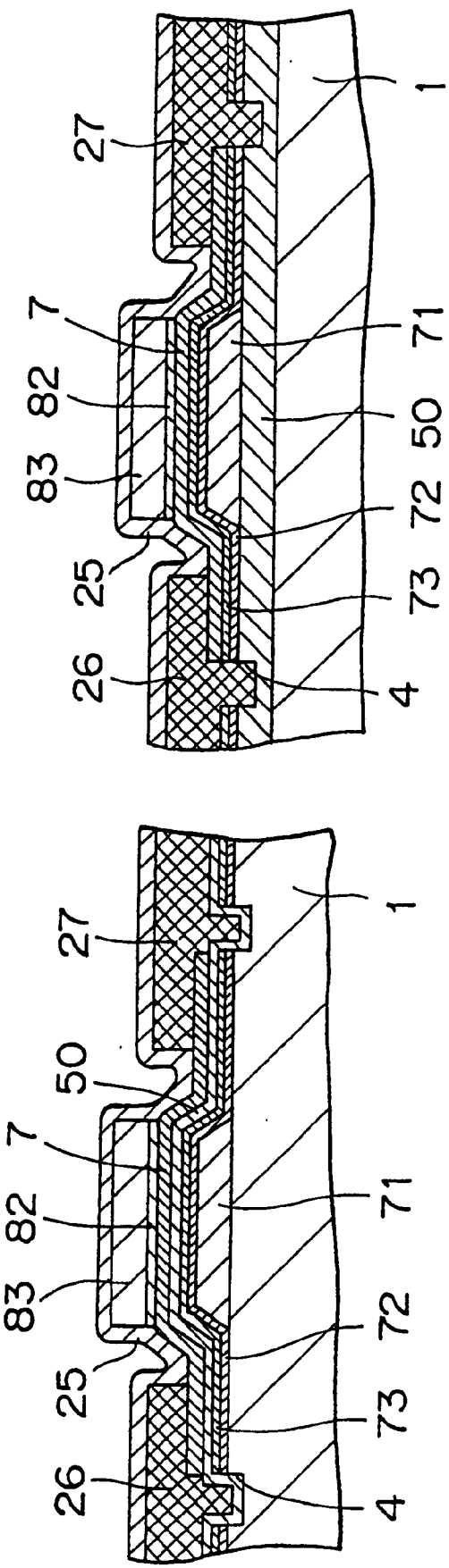

FIG. 37
EXAMPLE OF TOP GATE TYPE nMOSTFT
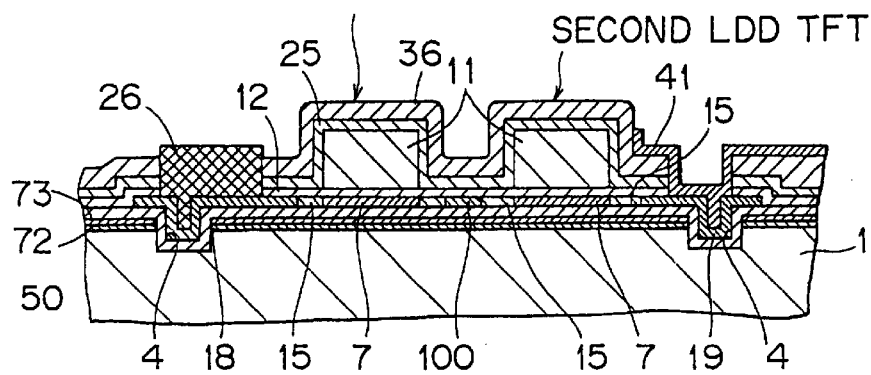
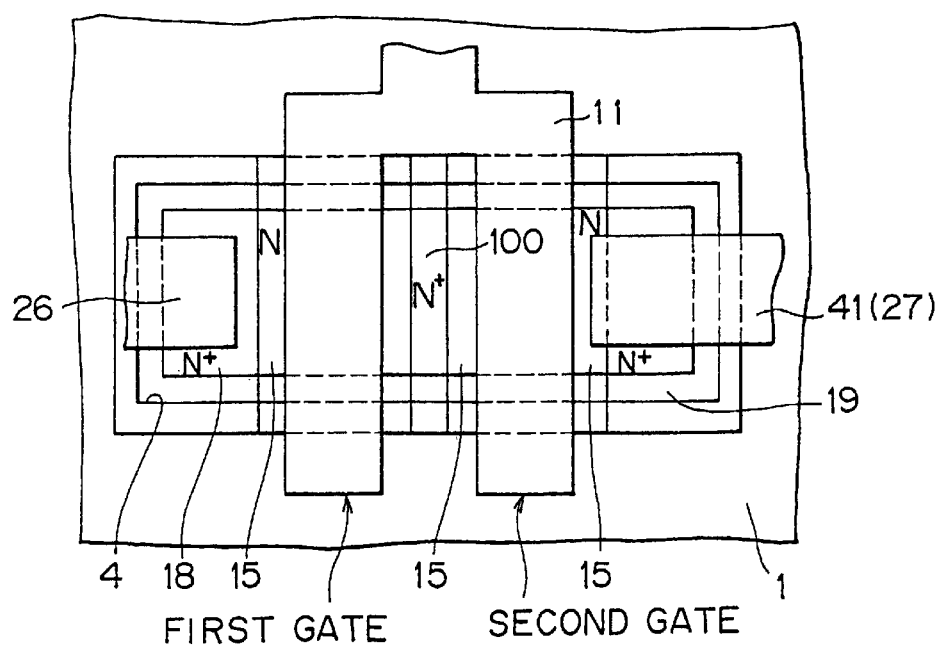

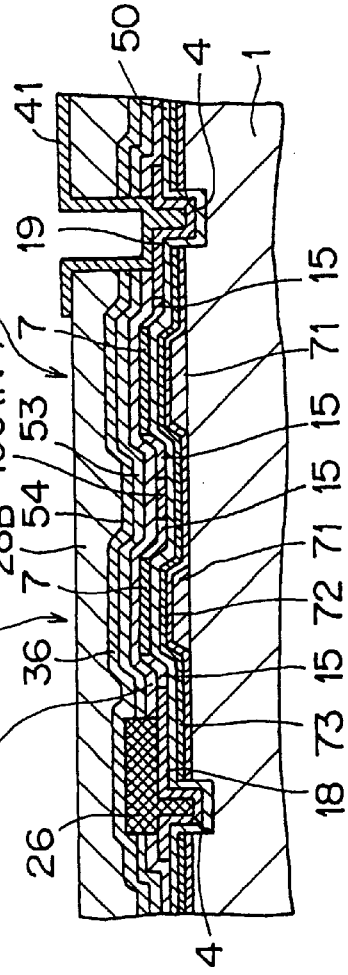
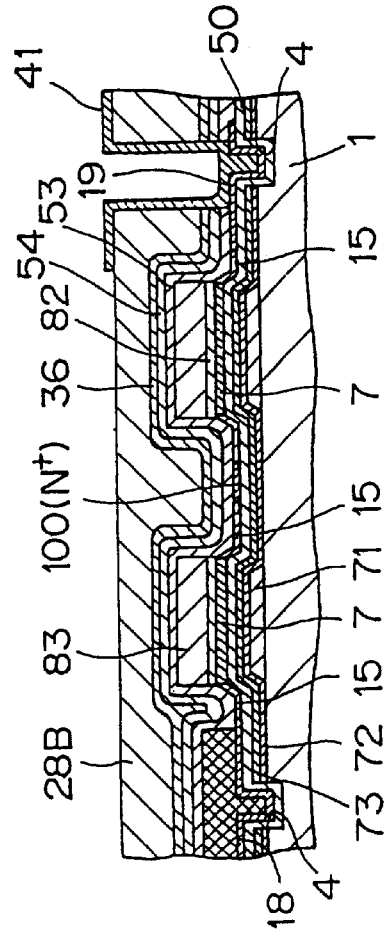
F I G. 38A
F I G. 38B

FIG. 39
TOP GATE TYPE OR
BOTTOM GATE TYPE
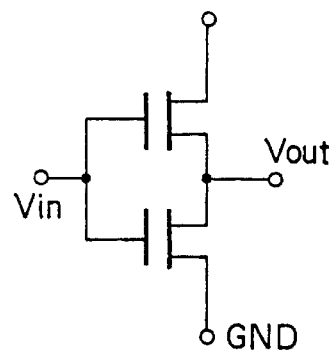
DUAL GATE TYPE
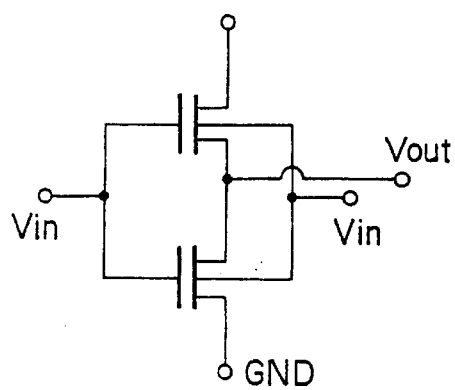 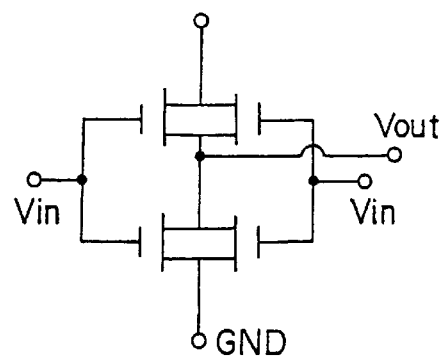

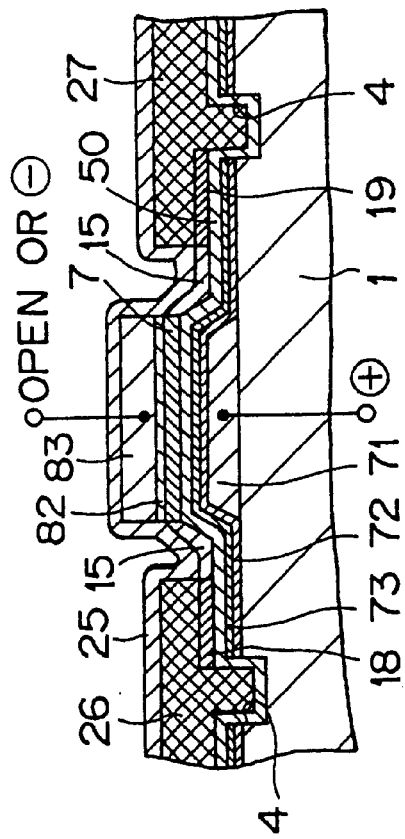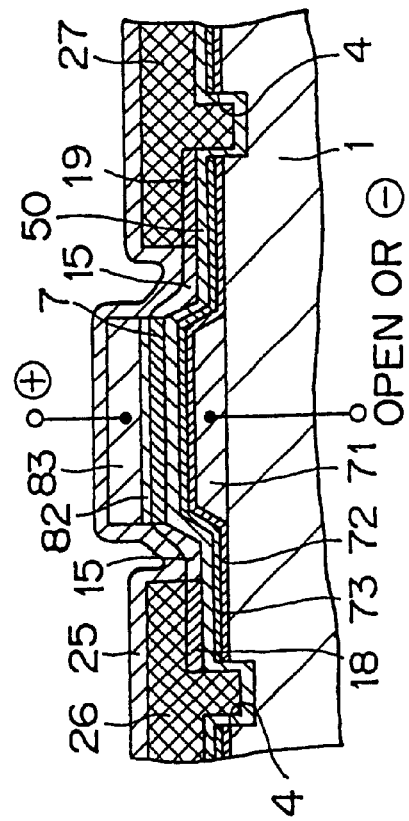
FIG. 40A
WHEN USING BOTTOM GATE TYPE nMOSTFT
FIG. 40B
WHEN USING TOP GATE nMOSTFT

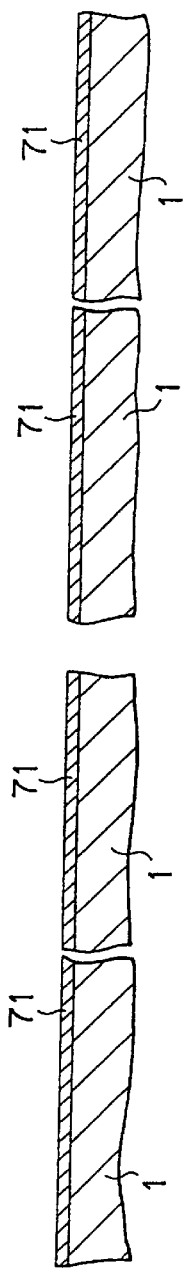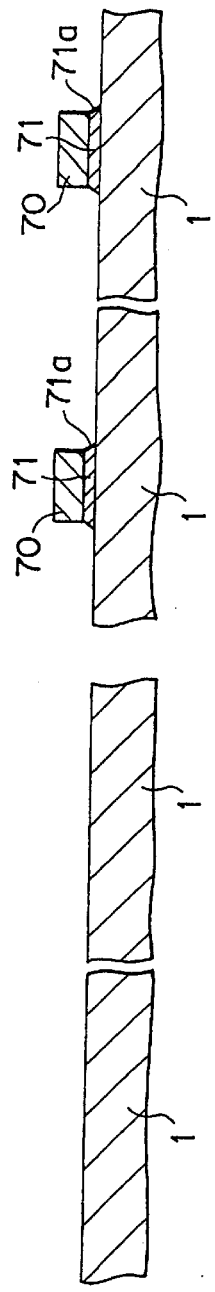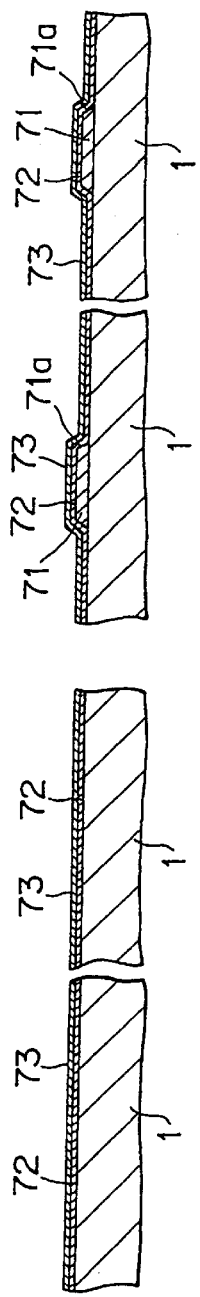

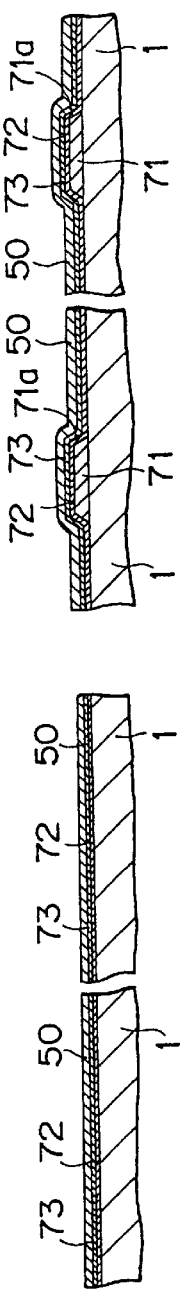
FIG. 42(4) FORMING OF CRYSTALLINE SAPPHIRE FILM
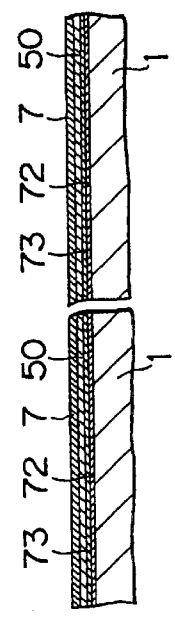
FIG. 42(5) HETEROEPITAXIAL GROWTH OF MONOCRYSTALLINE SILICON BY CATALYTIC CVD
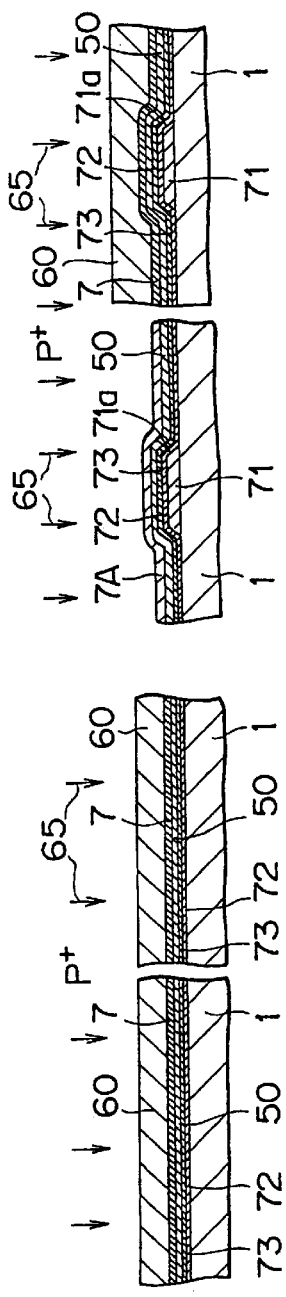
FIG. 42(6) ADJUSTMENT OF RESISTIVITY, AND FORMING OF PHOTORESIST AND N TYPE WELL

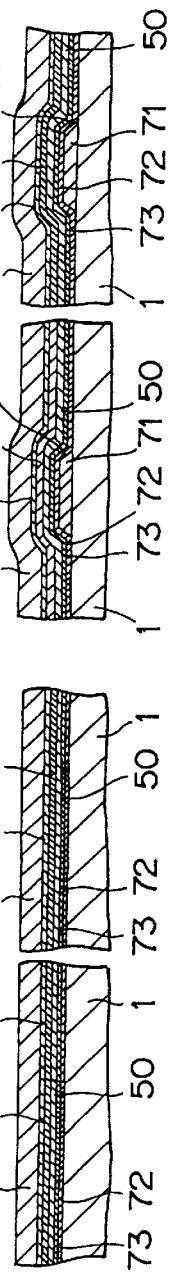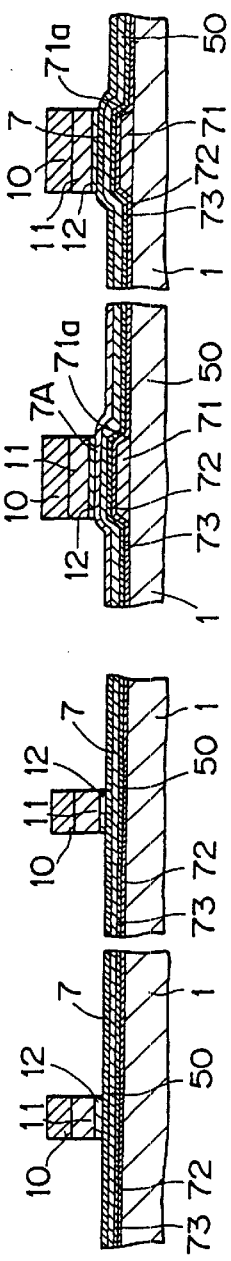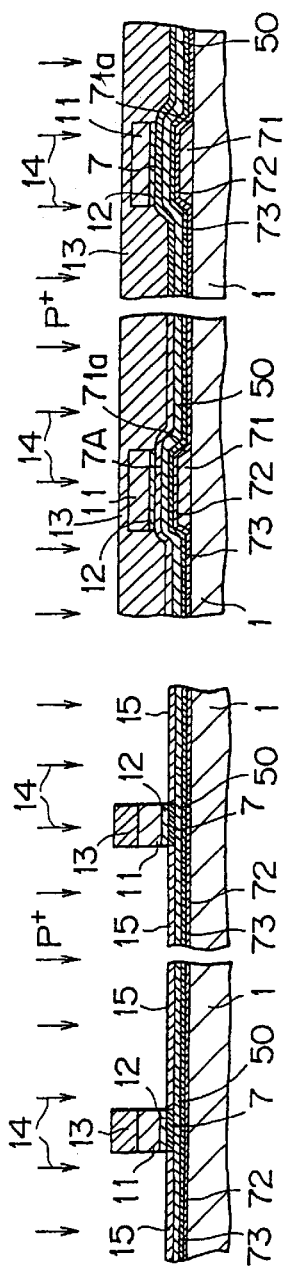
FIG. 43(7) FIG. 43(8) FIG. 43(9)

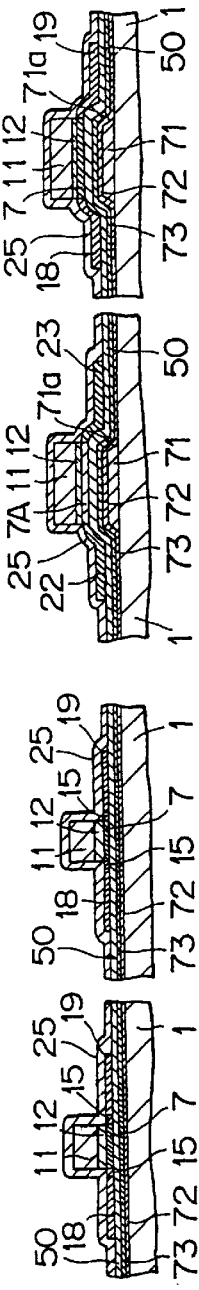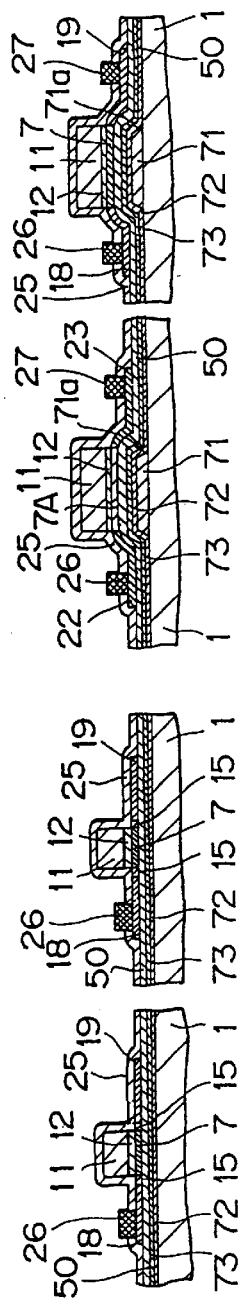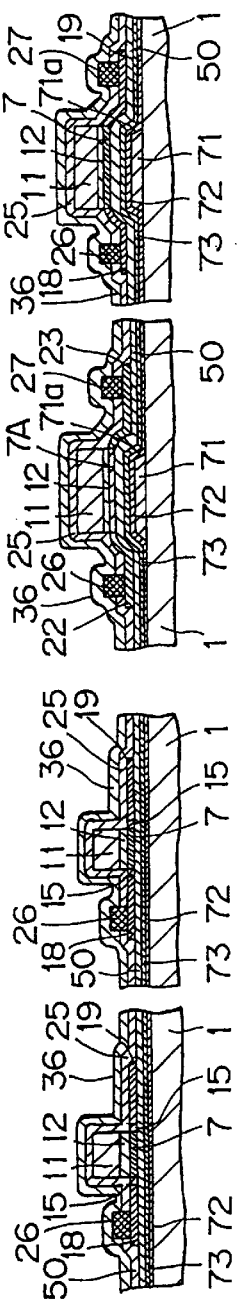

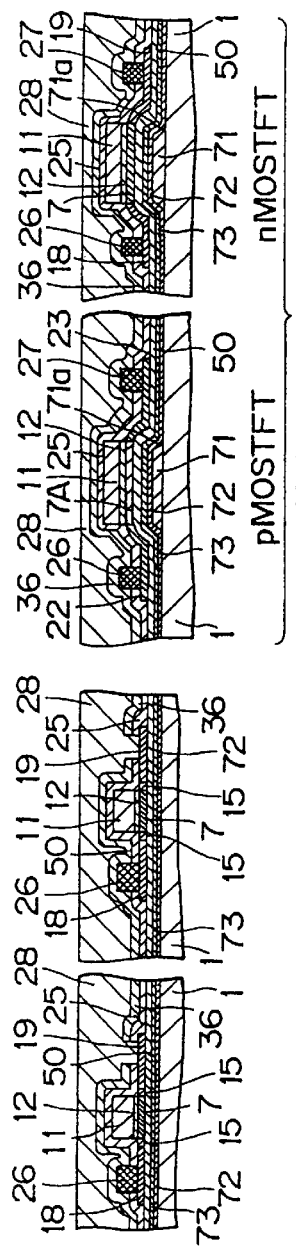
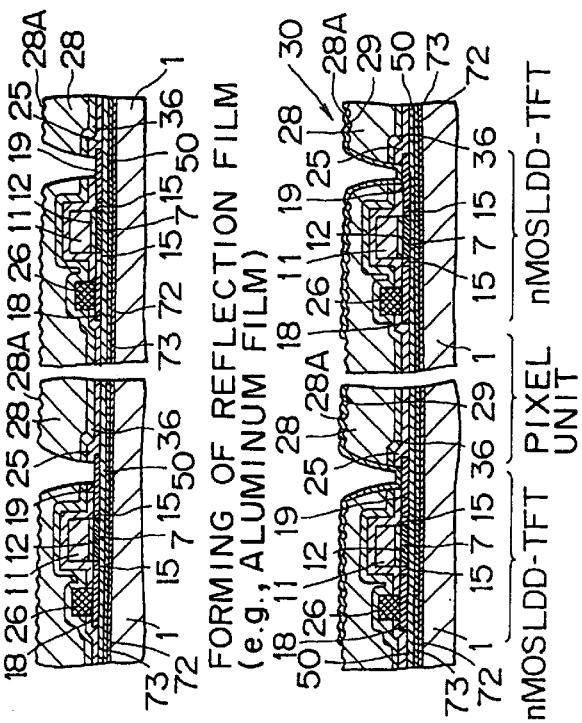
FIG. 46(16)
FIG. 46(17)
FIG. 46(18)

FIG. 50(15) FORMING OF SOURCE/DRAIN CONTACT OPENING AND ELECTRODE, FORMATION OF SiN/PSG FILM
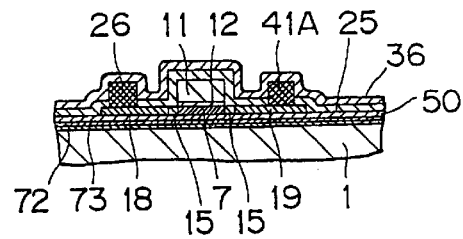
FIG. 50(16) FORMING OF COLOR FILTER LAYER
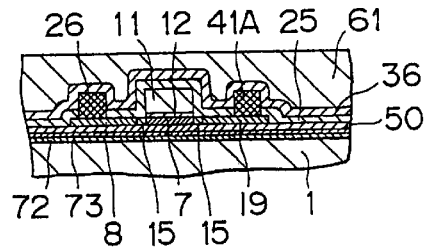
FIG. 50(17) FORMING OF DRAIN CONTACT OPENING AND BLACK MASK LAYER
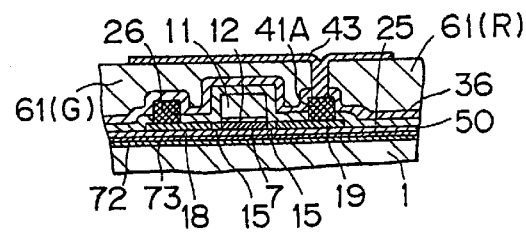
FIG. 50(18) FORMING OF FLATTENING FILM, FORMING OF PIXEL ELECTRODE
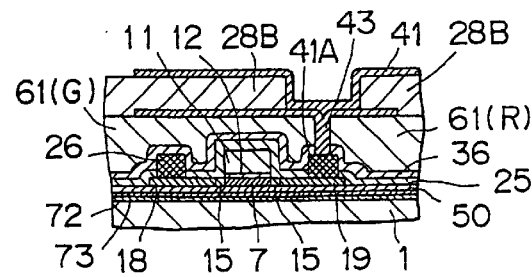

FORMING OF CRYSTALLINE SAPPHIRE FILM
F I G. 53(4) 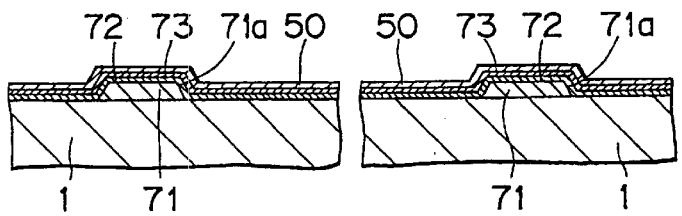
HETEROEPITAXIAL GROWTH OF MONOCRYSTALLINE SILICON BY CATALYTIC CVD
F I G. 53(5) 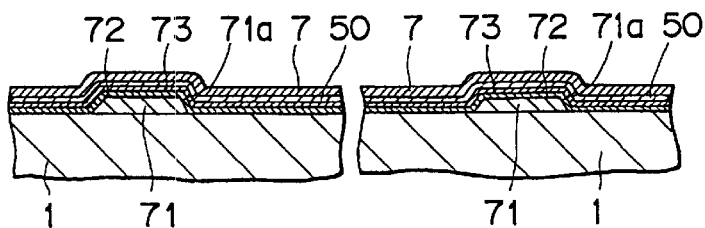
FORMING OF LDD LAYER OF DISPLAY nMOSTFT
F I G. 53(6) 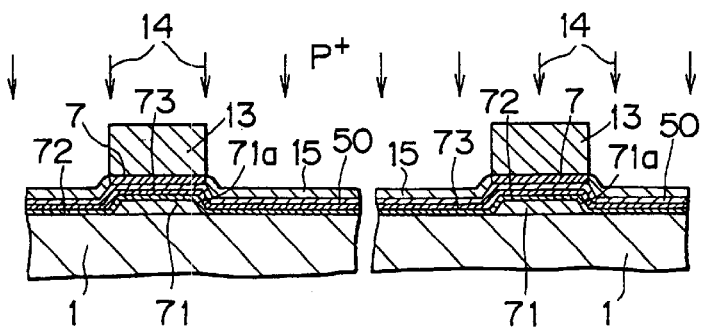

FORMING OF nMOSTFT SOURCE/DRAIN

FORMING OF RESISTS

ISLAND FORMING OF ACTIVE ELEMENT UNIT AND PASSIVE ELEMENT UNIT

ACTIVATION OF PROTECTIVE FILM (PSG/SiO2)

FORMING OF SOURCE CONTACT
OPENING AND SOURCE ELECTRODE

FORMING OF PROTECTIVE FILM
(SiN/PSG FILM) AND DRAIN OPENING

FORMING OF PHOTOSENSITIVE
RESIN FILM

SURFACE ROUGHENING OF PHOTOSENSITIVE
FILM, DRAIN OPENING AND REFLECTION
FILM (e.g., ALUMINUM FILM)

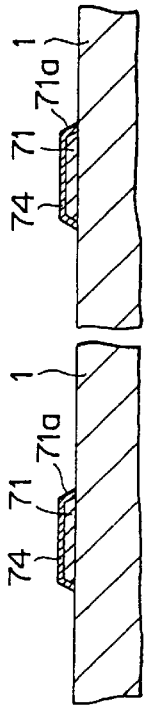
F I G. 56(3)
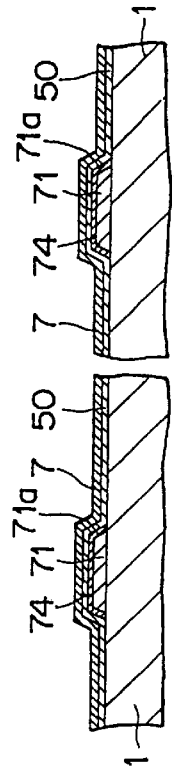
F I G. 56(4)
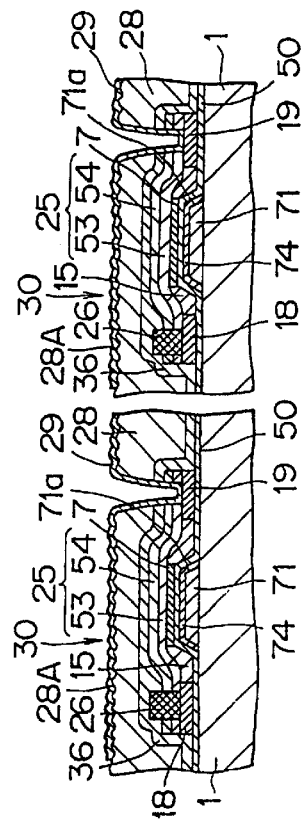
F I G. 56(5)

FORMING OF TOP GATE INSULATING FILM, TOP GATE ELECTRODE MATERIAL FILM
F I G. 57(6) 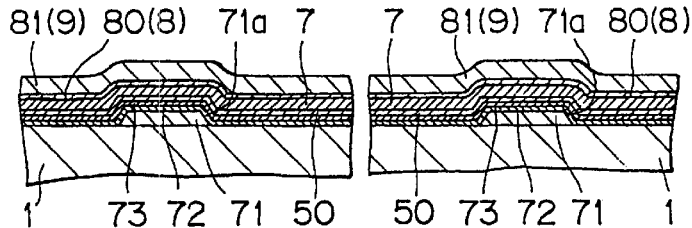
PATTERNING OF TOP GATE INSULATING FILM, TOP GATE ELECTRODE
F I G. 57(7) 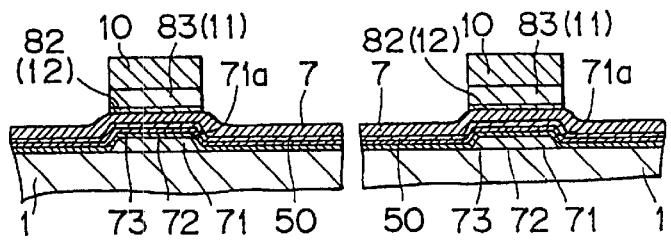
FORMING OF DISPLAY nMOSTFT LDD LAYER
F I G. 57(8) 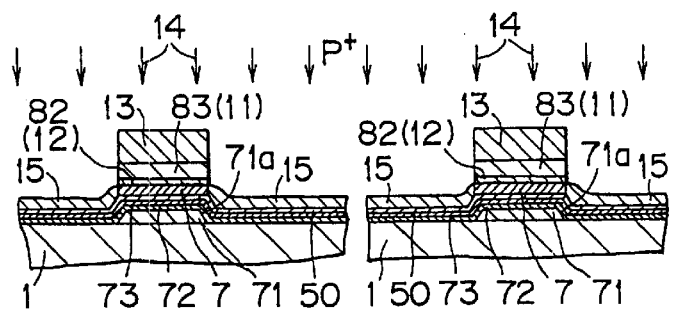
FORMING OF SOURCE/DRAIN OF nMOSTFT
F I G. 57(9) 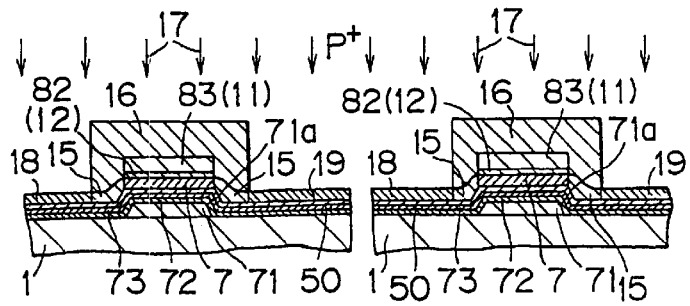

FORMING OF RESIST
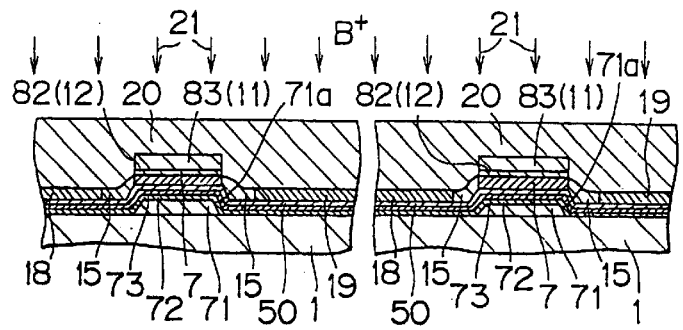
F I G. 58(10)
ISLAND FORMING OF ACTIVE ELEMENT UNIT AND PASSIVE ELEMENT UNIT
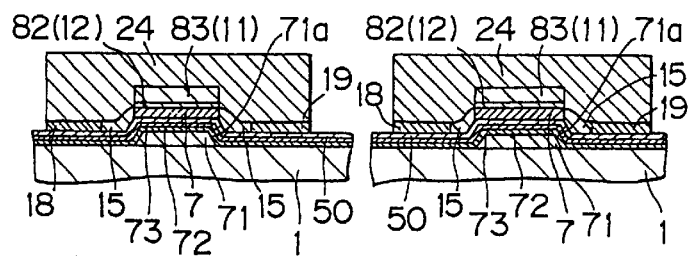
F I G. 58(11)
FORMING AND ACTIVATION OF PROTECTIVE FILM (PSG/SiO2)
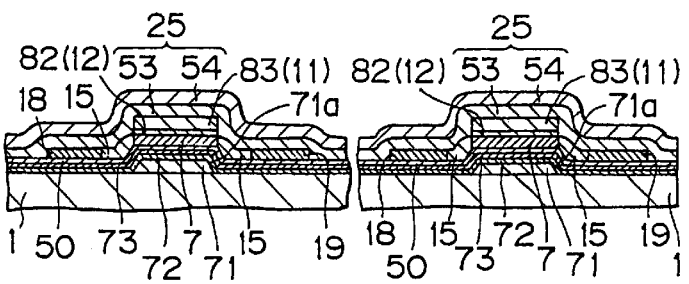
F I G. 58(12)
FORMING OF SOURCE CONTACT OPENING AND SOURCE ELECTRODE
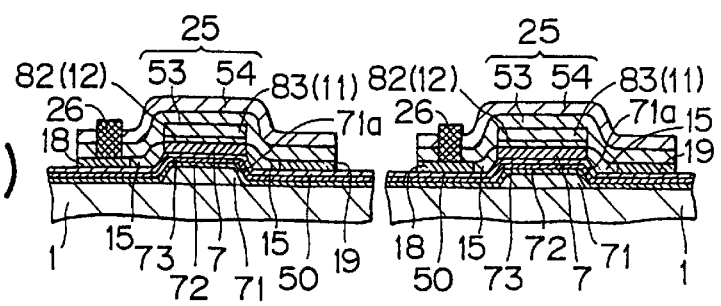
F I G. 58(13)

INSULATING FILM (SiN/PSG)
AND DRAIN OPENING

FORMING OF PHOTOSENSITIVE
RESIN FILM

SURFACE ROUGHENING OF
PHOTOSENSITIVE FILM, DRAIN
OPENING AND REFLECTION
FILM (e.g ALUMINUM FILM)

nMOS LDD-TFT   PIXEL   nMOS LDD-TFT
               ELECTRODE

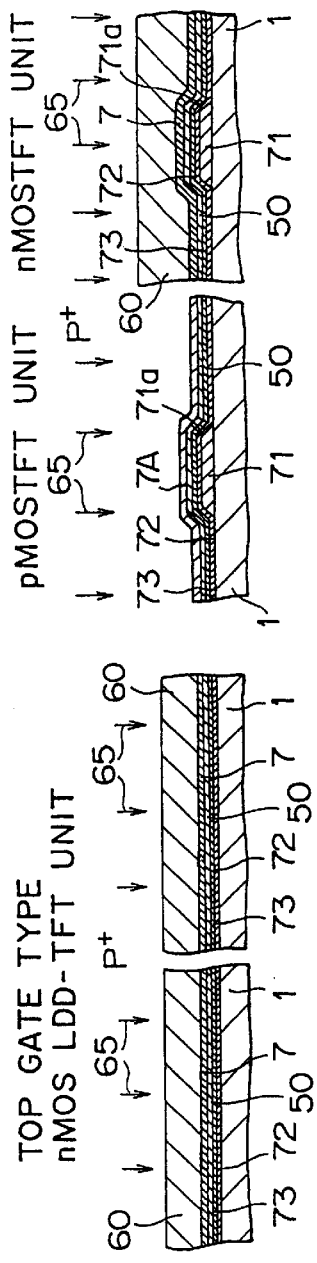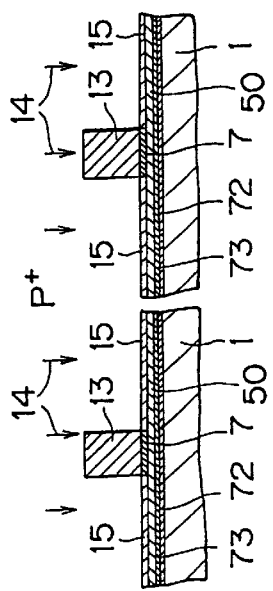
FIG. 60(6)
FIG. 60(7)

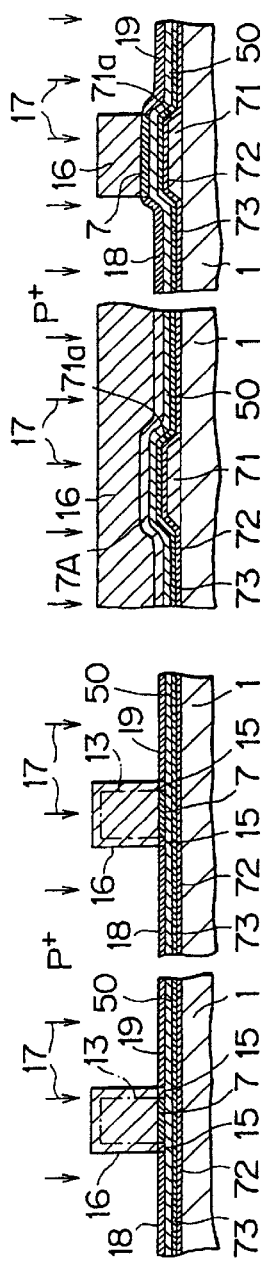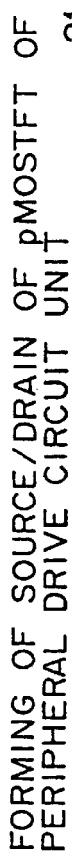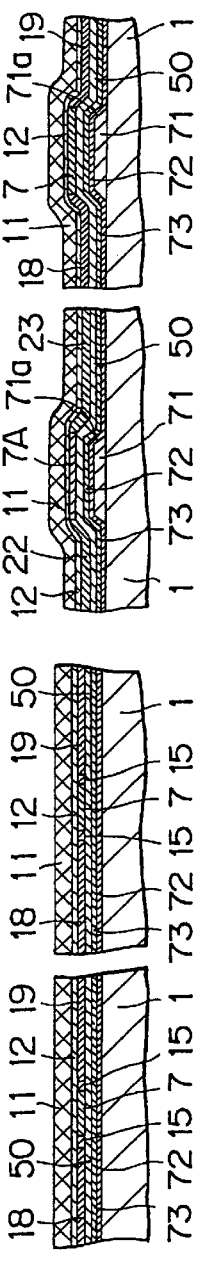
FIG. 61(8) FORMING OF SOURCE/DRAIN nMOSTFT
FIG. 61(9) FORMING OF SOURCE/DRAIN OF pMOSTFT OF PERIPHERAL DRIVE CIRCUIT UNIT
FIG. 61(10) ACTIVATION AND FORMING OF TOP GATE INSULATING FILM (SiO2/SiN) AND GATE ELECTRODE MATERIAL FILM (e.g., ALUMINUM LAYER)

FIG. 63
EXAMPLE OF TOP GATE TYPE nMOSTFT
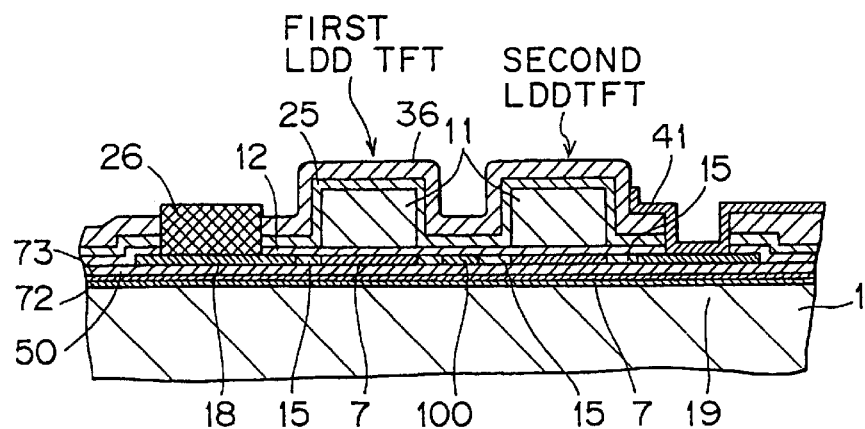
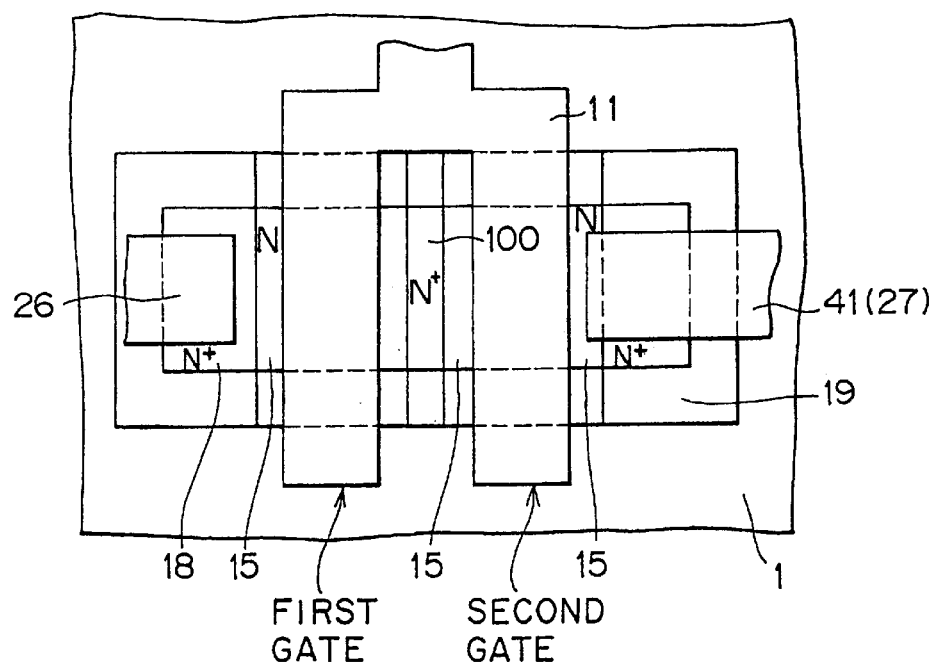

FIG. 65

MOSTFT COMBINATIONS OF EACH UNIT

| NO. | PERIPHERAL DRIVE CIRCUIT UNIT | DISPLAY UNIT |
|---|---|---|
| 1 | DUAL GATE TYPE | TOP GATE TYPE |
| 2 | DUAL GATE TYPE | BOTTOM GATE TYPE |
| 3 | DUAL GATE TYPE | DUAL GATE TYPE |
| 4 | TOP GATE TYPE + DUAL GATE TYPE | TOP GATE TYPE |
| 5 | TOP GATE TYPE + DUAL GATE TYPE | BOTTOM GATE TYPE |
| 6 | TOP GATE TYPE + DUAL GATE TYPE | DUAL GATE TYPE |
| 7 | BOTTOM GATE TYPE + DUAL GATE TYPE | TOP GATE TYPE |
| 8 | BOTTOM GATE TYPE + DUAL GATE TYPE | BOTTOM GATE TYPE |
| 9 | BOTTOM GATE TYPE + DUAL GATE TYPE | DUAL GATE TYPE |
| 10 | TOP GATE TYPE + BOTTOM GATE TYPE + DUAL GATE TYPE | TOP GATE TYPE |
| 11 | TOP GATE TYPE + BOTTOM GATE TYPE + DUAL GATE TYPE | BOTTOM GATE TYPE |
| 12 | TOP GATE TYPE + BOTTOM GATE TYPE + DUAL GATE TYPE | DUAL GATE TYPE |

FIG. 66

(NO LDD STRUCTURE IN DISPLAY UNIT MOSTFT)

| NO. | PERIPHERAL DRIVE CIRCUIT UNIT TFE'S | | DISPLAY UNIT TFT | |
|---|---|---|---|---|
| | GATE STRUCTURE | CHANNEL CONDUCTION TYPE | GATE STRUCTURE | CHANNEL CONDUCTION TYPE |
| 1 | DUAL GATE | p | TOP GATE | p |
| 2 | DUAL GATE | p | TOP GATE | n |
| 3 | DUAL GATE | n | TOP GATE | n |
| 4 | DUAL GATE | n | TOP GATE | p |
| 5 | DUAL GATE | c | TOP GATE | p |
| 6 | DUAL GATE | c | TOP GATE | n |
| 7 | DUAL GATE | c | TOP GATE | c |
| 8 | DUAL GATE | p | TOP GATE | c |
| 9 | DUAL GATE | n | TOP GATE | c |
| 10 | DUAL GATE | p | BOTTOM GATE | p |
| 11 | DUAL GATE | p | BOTTOM GATE | n |
| 12 | DUAL GATE | n | BOTTOM GATE | n |
| 13 | DUAL GATE | n | BOTTOM GATE | p |
| 14 | DUAL GATE | c | BOTTOM GATE | p |
| 15 | DUAL GATE | c | BOTTOM GATE | n |
| 16 | DUAL GATE | c | BOTTOM GATE | c |
| 17 | DUAL GATE | p | BOTTOM GATE | c |
| 18 | DUAL GATE | n | BOTTOM GATE | c |
| 19 | DUAL GATE | p | DUAL GATE | p |
| 20 | DUAL GATE | p | DUAL GATE | n |
| 21 | DUAL GATE | n | DUAL GATE | n |
| 22 | DUAL GATE | n | DUAL GATE | p |
| 23 | DUAL GATE | c | DUAL GATE | p |
| 24 | DUAL GATE | c | DUAL GATE | n |
| 25 | DUAL GATE | c | DUAL GATE | c |
| 26 | DUAL GATE | p | DUAL GATE | c |
| 27 | DUAL GATE | n | DUAL GATE | c | p : p CHANNEL TYPE
n : n CHANNEL TYPE
c : COMPLEMENTARY TYPE COMPRISING A COMBINATION OF p CHANNEL TYPE AND n CHANNEL TYPE (HEREAFTER IDEM)

FIG. 67

(NO LDD STRUCTURE IN DISPLAY UNIT MOSTFT)

| NO. | PERIPHERAL DRIVE CIRCUIT UNIT TFE'S | | DISPLAY UNIT TFT | |
|---|---|---|---|---|
| | GATE STRUCTURE | CHANNEL CONDUCTION TYPE | GATE STRUCTURE | CHANNEL CONDUCTION TYPE |
| 28 | DUAL GATE | c+n | TOP GATE | p |
| 29 | DUAL GATE | c+n | TOP GATE | n |
| 30 | DUAL GATE | c+n | TOP GATE | c |
| 31 | DUAL GATE | c+p | TOP GATE | p |
| 32 | DUAL GATE | c+p | TOP GATE | n |
| 33 | DUAL GATE | c+p | TOP GATE | c |
| 34 | DUAL GATE | c+n+p | TOP GATE | p |
| 35 | DUAL GATE | c+n+p | TOP GATE | n |
| 36 | DUAL GATE | c+n+p | TOP GATE | c |
| 37 | DUAL GATE | c+n | BOTTOM GATE | p |
| 38 | DUAL GATE | c+n | BOTTOM GATE | n |
| 39 | DUAL GATE | c+n | BOTTOM GATE | c |
| 40 | DUAL GATE | c+p | BOTTOM GATE | p |
| 41 | DUAL GATE | c+p | BOTTOM GATE | n |
| 42 | DUAL GATE | c+p | BOTTOM GATE | c |
| 43 | DUAL GATE | c+n+p | BOTTOM GATE | p |
| 44 | DUAL GATE | c+n+p | BOTTOM GATE | n |
| 45 | DUAL GATE | c+n+p | BOTTOM GATE | c |
| 46 | DUAL GATE | c+n | DUAL GATE | p |
| 47 | DUAL GATE | c+n | DUAL GATE | n |
| 48 | DUAL GATE | c+n | DUAL GATE | c |
| 49 | DUAL GATE | c+p | DUAL GATE | p |
| 50 | DUAL GATE | c+p | DUAL GATE | n |
| 51 | DUAL GATE | c+p | DUAL GATE | c |
| 52 | DUAL GATE | c+n+p | DUAL GATE | p |
| 53 | DUAL GATE | c+n+p | DUAL GATE | n |
| 54 | DUAL GATE | c+n+p | DUAL GATE | c |

FIG. 68

(WITH LDD STRUCTURE IN DISPLAY UNIT MOSTFT)

| NO. | PERIPHERAL DRIVE CIRCUIT UNIT TFE'S | | DISPLAY UNIT TFT | |
|---|---|---|---|---|
| | GATE STRUCTURE | CHANNEL CONDUCTION TYPE | GATE STRUCTURE | CHANNEL CONDUCTION TYPE |
| 55 | DUAL GATE | p | TOP GATE | p |
| 56 | DUAL GATE | p | TOP GATE | n |
| 57 | DUAL GATE | n | TOP GATE | n |
| 58 | DUAL GATE | n | TOP GATE | p |
| 59 | DUAL GATE | c | TOP GATE | p |
| 60 | DUAL GATE | c | TOP GATE | n |
| 61 | DUAL GATE | c | TOP GATE | c |
| 62 | DUAL GATE | p | TOP GATE | c |
| 63 | DUAL GATE | n | TOP GATE | c |
| 64 | DUAL GATE | p | BOTTOM GATE | p |
| 65 | DUAL GATE | p | BOTTOM GATE | n |
| 66 | DUAL GATE | n | BOTTOM GATE | n |
| 67 | DUAL GATE | n | BOTTOM GATE | p |
| 68 | DUAL GATE | c | BOTTOM GATE | p |
| 69 | DUAL GATE | c | BOTTOM GATE | n |
| 70 | DUAL GATE | c | BOTTOM GATE | c |
| 71 | DUAL GATE | p | BOTTOM GATE | c |
| 72 | DUAL GATE | n | BOTTOM GATE | c |
| 73 | DUAL GATE | p | DUAL GATE | p |
| 74 | DUAL GATE | p | DUAL GATE | n |
| 75 | DUAL GATE | n | DUAL GATE | n |
| 76 | DUAL GATE | n | DUAL GATE | p |
| 77 | DUAL GATE | c | DUAL GATE | p |
| 78 | DUAL GATE | c | DUAL GATE | n |
| 79 | DUAL GATE | c | DUAL GATE | c |
| 80 | DUAL GATE | p | DUAL GATE | c |
| 81 | DUAL GATE | n | DUAL GATE | c |

FIG. 69

(WITH LDD STRUCTURE IN DISPLAY UNIT MOSTFT)

| NO. | PERIPHERAL DRIVE CIRCUIT UNIT TFE'S | | DISPLAY UNIT TFT | |
|---|---|---|---|---|
| | GATE STRUCTURE | CHANNEL CONDUCTION TYPE | GATE STRUCTURE | CHANNEL CONDUCTION TYPE |
| 82 | DUAL GATE | c+n | TOP GATE | p |
| 83 | DUAL GATE | c+n | TOP GATE | n |
| 84 | DUAL GATE | c+n | TOP GATE | c |
| 85 | DUAL GATE | c+p | TOP GATE | p |
| 86 | DUAL GATE | c+p | TOP GATE | n |
| 87 | DUAL GATE | c+p | TOP GATE | c |
| 88 | DUAL GATE | c+n+p | TOP GATE | p |
| 89 | DUAL GATE | c+n+p | TOP GATE | n |
| 90 | DUAL GATE | c+n+p | TOP GATE | c |
| 91 | DUAL GATE | c+n | BOTTOM GATE | p |
| 92 | DUAL GATE | c+n | BOTTOM GATE | n |
| 93 | DUAL GATE | c+n | BOTTOM GATE | c |
| 94 | DUAL GATE | c+p | BOTTOM GATE | p |
| 95 | DUAL GATE | c+p | BOTTOM GATE | n |
| 96 | DUAL GATE | c+p | BOTTOM GATE | c |
| 97 | DUAL GATE | c+n+p | BOTTOM GATE | p |
| 98 | DUAL GATE | c+n+p | BOTTOM GATE | n |
| 99 | DUAL GATE | c+n+p | BOTTOM GATE | c |
| 100 | DUAL GATE | c+n | DUAL GATE | p |
| 101 | DUAL GATE | c+n | DUAL GATE | n |
| 102 | DUAL GATE | c+n | DUAL GATE | c |
| 103 | DUAL GATE | c+p | DUAL GATE | p |
| 104 | DUAL GATE | c+p | DUAL GATE | n |
| 105 | DUAL GATE | c+p | DUAL GATE | c |
| 106 | DUAL GATE | c+n+p | DUAL GATE | p |
| 107 | DUAL GATE | c+n+p | DUAL GATE | n |
| 108 | DUAL GATE | c+n+p | DUAL GATE | c |

FIG. 70

⟨WITH LDD STRUCTURE IN PART OF PERIPHERAL DRIVE CIRCUIT UNIT MOSTFT⟩

| NO. | PERIPHERAL DRIVE CIRCUIT UNIT TFE'S | | DISPLAY UNIT TFT | |
|---|---|---|---|---|
| | GATE STRUCTURE | CHANNEL CONDUCTION TYPE | GATE STRUCTURE | CHANNEL CONDUCTION TYPE |
| 109 | DUAL GATE | p | TOP GATE | p |
| 110 | DUAL GATE | p | TOP GATE | n |
| 111 | DUAL GATE | n | TOP GATE | n |
| 112 | DUAL GATE | n | TOP GATE | p |
| 113 | DUAL GATE | c | TOP GATE | p |
| 114 | DUAL GATE | c | TOP GATE | n |
| 115 | DUAL GATE | c | TOP GATE | c |
| 116 | DUAL GATE | p | TOP GATE | c |
| 117 | DUAL GATE | n | TOP GATE | c |
| 118 | DUAL GATE | p | BOTTOM GATE | p |
| 119 | DUAL GATE | p | BOTTOM GATE | n |
| 120 | DUAL GATE | n | BOTTOM GATE | n |
| 121 | DUAL GATE | n | BOTTOM GATE | p |
| 122 | DUAL GATE | c | BOTTOM GATE | p |
| 123 | DUAL GATE | c | BOTTOM GATE | n |
| 124 | DUAL GATE | c | BOTTOM GATE | c |
| 125 | DUAL GATE | p | BOTTOM GATE | c |
| 126 | DUAL GATE | n | BOTTOM GATE | c |
| 127 | DUAL GATE | p | DUAL GATE | p |
| 128 | DUAL GATE | p | DUAL GATE | n |
| 129 | DUAL GATE | n | DUAL GATE | n |
| 130 | DUAL GATE | n | DUAL GATE | p |
| 131 | DUAL GATE | c | DUAL GATE | p |
| 132 | DUAL GATE | c | DUAL GATE | n |
| 133 | DUAL GATE | c | DUAL GATE | c |
| 134 | DUAL GATE | p | DUAL GATE | c |
| 135 | DUAL GATE | n | DUAL GATE | c |

FIG. 71

⟨WITH LDD STRUCTURE IN PART OF PERIPHERAL DRIVE CIRCUIT UNIT MOSTFT⟩

| NO. | PERIPHERAL DRIVE CIRCUIT UNIT TFE'S | | DISPLAY UNIT TFT | |
|---|---|---|---|---|
| | GATE STRUCTURE | CHANNEL CONDUCTION TYPE | GATE STRUCTURE | CHANNEL CONDUCTION TYPE |
| 136 | DUAL GATE | c+n | TOP GATE | p |
| 137 | DUAL GATE | c+n | TOP GATE | n |
| 138 | DUAL GATE | c+n | TOP GATE | c |
| 139 | DUAL GATE | c+p | TOP GATE | p |
| 140 | DUAL GATE | c+p | TOP GATE | n |
| 141 | DUAL GATE | c+p | TOP GATE | c |
| 142 | DUAL GATE | c+n+p | TOP GATE | p |
| 143 | DUAL GATE | c+n+p | TOP GATE | n |
| 144 | DUAL GATE | c+n+p | TOP GATE | c |
| 145 | DUAL GATE | c+n | BOTTOM GATE | p |
| 146 | DUAL GATE | c+n | BOTTOM GATE | n |
| 147 | DUAL GATE | c+n | BOTTOM GATE | c |
| 148 | DUAL GATE | c+p | BOTTOM GATE | p |
| 149 | DUAL GATE | c+p | BOTTOM GATE | n |
| 150 | DUAL GATE | c+p | BOTTOM GATE | c |
| 151 | DUAL GATE | c+n+p | BOTTOM GATE | p |
| 152 | DUAL GATE | c+n+p | BOTTOM GATE | n |
| 153 | DUAL GATE | c+n+p | BOTTOM GATE | c |
| 154 | DUAL GATE | c+n | DUAL GATE | p |
| 155 | DUAL GATE | c+n | DUAL GATE | n |
| 156 | DUAL GATE | c+n | DUAL GATE | c |
| 157 | DUAL GATE | c+p | DUAL GATE | p |
| 158 | DUAL GATE | c+p | DUAL GATE | n |
| 159 | DUAL GATE | c+p | DUAL GATE | c |
| 160 | DUAL GATE | c+n+p | DUAL GATE | p |
| 161 | DUAL GATE | c+n+p | DUAL GATE | n |
| 162 | DUAL GATE | c+n+p | DUAL GATE | c |

FIG. 72

⟨WITH LDD STRUCTURE IN PART OF PERIPHERAL DRIVE CIRCUIT UNIT MOSTFT⟩

| NO. | PERIPHERAL DRIVE CIRCUIT UNIT TFE'S | | DISPLAY UNIT TFT | |
|---|---|---|---|---|
| | GATE STRUCTURE | CHANNEL CONDUCTION TYPE | GATE STRUCTURE | CHANNEL CONDUCTION TYPE |
| 163 | DUAL GATE | p | TOP GATE | p |
| 164 | DUAL GATE | p | TOP GATE | n |
| 165 | DUAL GATE | n | TOP GATE | n |
| 166 | DUAL GATE | n | TOP GATE | p |
| 167 | DUAL GATE | c | TOP GATE | p |
| 168 | DUAL GATE | c | TOP GATE | n |
| 169 | DUAL GATE | c | TOP GATE | c |
| 170 | DUAL GATE | p | TOP GATE | c |
| 171 | DUAL GATE | n | TOP GATE | c |
| 172 | DUAL GATE | p | BOTTOM GATE | p |
| 173 | DUAL GATE | p | BOTTOM GATE | n |
| 174 | DUAL GATE | n | BOTTOM GATE | n |
| 175 | DUAL GATE | n | BOTTOM GATE | p |
| 176 | DUAL GATE | c | BOTTOM GATE | p |
| 177 | DUAL GATE | c | BOTTOM GATE | n |
| 178 | DUAL GATE | c | BOTTOM GATE | c |
| 179 | DUAL GATE | p | BOTTOM GATE | c |
| 180 | DUAL GATE | n | BOTTOM GATE | c |
| 181 | DUAL GATE | p | DUAL GATE | p |
| 182 | DUAL GATE | p | DUAL GATE | n |
| 183 | DUAL GATE | n | DUAL GATE | n |
| 184 | DUAL GATE | n | DUAL GATE | p |
| 185 | DUAL GATE | c | DUAL GATE | p |
| 186 | DUAL GATE | c | DUAL GATE | n |
| 187 | DUAL GATE | c | DUAL GATE | c |
| 188 | DUAL GATE | p | DUAL GATE | c |
| 189 | DUAL GATE | n | DUAL GATE | c |

FIG. 73

⟨WITH LDD STRUCTURE IN PART OF PERIPHERAL DRIVE CIRCUIT UNIT MOSTFT⟩

| NO. | PERIPHERAL DRIVE CIRCUIT UNIT TFE'S | | DISPLAY UNIT TFT | |
|---|---|---|---|---|
| | GATE STRUCTURE | CHANNEL CONDUCTION TYPE | GATE STRUCTURE | CHANNEL CONDUCTION TYPE |
| 190 | DUAL GATE | c+n | TOP GATE | p |
| 191 | DUAL GATE | c+n | TOP GATE | n |
| 192 | DUAL GATE | c+n | TOP GATE | c |
| 193 | DUAL GATE | c+p | TOP GATE | p |
| 194 | DUAL GATE | c+p | TOP GATE | n |
| 195 | DUAL GATE | c+p | TOP GATE | c |
| 196 | DUAL GATE | c+n+p | TOP GATE | p |
| 197 | DUAL GATE | c+n+p | TOP GATE | n |
| 198 | DUAL GATE | c+n+p | TOP GATE | c |
| 199 | DUAL GATE | c+n | BOTTOM GATE | p |
| 200 | DUAL GATE | c+n | BOTTOM GATE | n |
| 201 | DUAL GATE | c+n | BOTTOM GATE | c |
| 202 | DUAL GATE | c+p | BOTTOM GATE | p |
| 203 | DUAL GATE | c+p | BOTTOM GATE | n |
| 204 | DUAL GATE | c+p | BOTTOM GATE | c |
| 205 | DUAL GATE | c+n+p | BOTTOM GATE | p |
| 206 | DUAL GATE | c+n+p | BOTTOM GATE | n |
| 207 | DUAL GATE | c+n+p | BOTTOM GATE | c |
| 208 | DUAL GATE | c+n | DUAL GATE | p |
| 209 | DUAL GATE | c+n | DUAL GATE | n |
| 210 | DUAL GATE | c+n | DUAL GATE | c |
| 211 | DUAL GATE | c+p | DUAL GATE | p |
| 212 | DUAL GATE | c+p | DUAL GATE | n |
| 213 | DUAL GATE | c+p | DUAL GATE | c |
| 214 | DUAL GATE | c+n+p | DUAL GATE | p |
| 215 | DUAL GATE | c+n+p | DUAL GATE | n |
| 216 | DUAL GATE | c+n+p | DUAL GATE | c |

FIG. 75

ACTIVE MATRIX DRIVE METHOD

| CRYSTALLINE NATURE OF MOSTFT | TYPE OF MOSTFT | |
|---|---|---|
| | PERIPHERAL DRIVE CIRCUIT UNIT | DISPLAY UNIT |
| MONOCRYSTALLINE SILICON | cMOS, n OR pMOS, OR cMOS+pMOS+nMOS | n OR pMOS, OR cMOS |
| POLYCRYSTALLINE SILICON | cMOS, n OR pMOS, OR cMOS+pMOS+nMOS | n OR pMOS, OR cMOS |
| AMORPHOUS SILICON | — | n OR pMOS, OR cMOS |

EL (EXAMPLE OF ACTIVE MATRIX DRIVE)

FED (EXAMPLE OF PASSIVE MATRIX DRIVE)

ELECTRO-OPTIC DEVICE, DRIVE SUBSTRATE FOR ELECTRO-OPTIC DEVICE AND METHOD OF MANUFACTURING THE SAME

This is a division application Ser. No. 09/413,497, filed Oct. 6, 1999 now U.S. Pat. No. 6,346,718.

BACKGROUND OF THE INVENTION

1. Field of the Invention

This invention relates to an electro-optic device, a drive substrate for an electro-optic device and a method of manufacturing these devices, and in particular, relates to a structure and method suitable for an LCD display device comprising a dual gate thin film insulating gate field effect transistor (hereafter referred to as dual gate MOSTFT) using a monocrystalline silicon layer grown heteroepitaxially on an insulating substrate as the active region, and a passive region.

2. Description of Related Art

Examples of active matrix LCD displays are a device comprising a display unit using amorphous silicon as TFT and external drive circuit IC, a one piece construction comprising a display unit and drive circuit using polycrystalline silicon obtained by solid phase growth as a TFT (Japanese Patent Application Laid-Open No. Hei 6-242433), and a one piece construction of a display unit and drive circuit using polycrystalline silicon subjected to excimer laser annealing as a TFT (Japanese Patent Application Laid-Open No. Hei 7-131030).

However, although productivity of conventional amorphous silicon TFT is good, their electron mobility is as low as about 0.5–1.0 $cm^2$/v·sec, so a p channel MOSTFT (hereafter referred to as pMOSTFT) could not be manufactured. Therefore, as a peripheral drive circuit unit using a pMOSTFT cannot be formed on the same glass substrate as a display unit, the driver IC had to be external and was installed by a TAB method or the like, so it was difficult to reduce costs. For this reason, there was a limit to the degree of high precision that could be achieved. Further, as the electron mobility is only about 0.5–1.0 $cm^2$/v·sec, sufficient ON current cannot be obtained, and if the transistor is used for a display unit, the transistor size necessarily becomes large which is a disadvantage for obtaining a high pixel aperture.

As the electron mobility of a related art polycrystalline TFT is 70–100 $cm^2$/v·sec and can also support high precision, LCD (liquid crystal display devices) using polycrystalline silicon TFT formed in one piece with a drive circuit have recently been attracting attention.

However, in the case of a large LCD of 15 inches or more, as the electron mobility of polycrystalline silicon is 70–100 $cm^2$/v·sec, driving performance is insufficient so an external drive circuit IC was still needed.

In the case of a TFT using polycrystalline silicon formed as a film by solid phase growth, annealing for more than 10 hours at 600° C. or higher, and the formation of a gate SiO2 by high temperature oxidation at about 1000° C., are necessary, so a semiconductor manufacturing device has to be used. Consequently, a wafer size of 8–12 inches diameter is the limit, highly heat resistant, costly quartz glass has to be used, and it is difficult to reduce costs. Therefore, usage in this case is limited to EVF or data/AV projectors.

Further, in related art polycrystalline silicon TFT obtained by annealing with an excimer laser, there are many problems such as stability of the excimer laser output, productivity, increase of device cost due to larger size, and decrease of yield/quality.

These problems are more severe in the case of large glass substrates of a 1 m square, and it is even more difficult to improve performance/quality and reduce costs.

SUMMARY OF THE INVENTION

It is therefore an object of this invention to enable manufacture of an active matrix substrate, in particular with regard to a peripheral drive circuit unit, comprising a built-in high-performance driver by uniformly forming a film of a monocrystalline silicon layer having a high electron/hole mobility at relatively low temperature and an electro-optic device such as a thin film semiconductor for a display using this substrate, to enable manufacture of a one-piece construction comprising a display unit comprising an channel MOSTFT (hereafter referred to as nMOSTFT), pMOSTFT or complementary type thin film insulating gate field effect transistor (hereafter, cMOSTFT) having an LDD (Lightly Doped Drain) structure having high switching performance and low leak current, and a peripheral drive circuit comprising this cMOSTFT, nMOSTFT, pMOSTFT or a combination thereof, thus realizing a high image quality, high resolution, narrow frame, high efficiency large screen display panel which can be used even with a large glass substrate having a relatively low strain point, permitting high productivity, avoiding costly manufacturing equipment and allowing cost reductions, and further permitting easy adjustment of threshold values, fast operation and larger screen size due to lower resistance.

This invention relates to an electro-optic device and a drive substrate for this electro-optic device comprising a display unit comprising pixel electrodes (e.g., plural pixel electrodes arranged in a matrix, hereafter idem), and a peripheral drive circuit unit surrounding this display unit, these units being disposed on a first substrate (i.e., a drive substrate, hereafter idem), and a predetermined optical material such as a liquid crystal disposed between this first substrate and a second substrate (i.e., a facing substrate, hereafter idem), wherein a gate comprising a gate electrode and a gate insulation film is formed on one of the surfaces of the first substrate, a layer of a material with good lattice compatibility with monocrystalline silicon is formed on this surface of the first substrate, a layer of monocrystalline silicon is formed on the first substrate comprising this material and the gate, and a dual gate first thin film transistor (in particular, MOSTFT, hereafter idem) comprising this monocrystalline silicon layer as channel region, source region and drain region, and having a gate in the upper part and lower part of the channel region, forms at least part of the peripheral drive circuit unit.

According to this invention, the thin film transistor may be a field effect transistor (FET) (MOS type or junction type, either being satisfactory) or a bipolar transistor, and this invention may be applied to both types of transistor (hereafter, idem).

This invention also provides a method of manufacturing this electro-optic device and drive substrate, comprising:

a process for forming a gate comprising a gate electrode and a gate insulation film on one of the surfaces of the first substrate, a process for forming a substance layer having good lattice compatibility with monocrystalline silicon on the surface of the first substrate, a process for heteroepitaxially growing a monocrystalline silicon layer on the first substrate comprising this substance layer and the gate by catalytic CVD or high density plasma CVD using the substance layer as a seed, a process for performing a predetermined treatment on this monocrystalline. silicon layer to form a channel region, source region and drain region, and a process for forming a first dual gate TFT comprising the gate in the upper part and lower part respectively of the channel region, this thin film transistor forming at least part of the peripheral drive circuit unit.

According to this invention, the monocrystalline silicon layer is formed by heteroepitaxial growth by catalytic CVD or high-density plasma CVD, using the aforesaid substance layer (e.g., a crystalline sapphire film) having good lattice compatibility with monocrystalline silicon as a seed, and this epitaxially grown layer is used for a dual gate MOSTFT of a peripheral drive circuit of the drive substrate such as an active matrix substrate, or a dual gate MOSTFT of a peripheral drive circuit of an electro-optic device such as an LCD comprising a display unit and peripheral drive circuit in a one-piece construction.

(A) By forming the substance layer having good lattice compatibility with monocrystalline silicon (e.g., a crystalline sapphire film), and performing heteroepitaxial growth using this substance layer as a seed, a monocrystalline silicon layer having a high electron mobility of 540 $cm^2$/v·sec is obtained. An electro-optic device such as a thin film semiconductor used for a display with a built-in high-performance driver can therefore be manufactured.

(B) In particular, this monocrystalline silicon layer demonstrates a high electron and hole mobility characteristic of monocrystalline silicon substrates in comparison to the amorphous silicon layer and polycrystalline silicon layer of the related art.

This monocrystalline silicon dual gate MOSTFT makes it possible to manufacture a display unit comprising a nMOSTFT, pMOSTFT or cMOSTFT having a high switching performance (and preferably, an LDD (Lightly Doped Drain) structure with mitigated electric field intensity to permit low leak current), and a peripheral drive circuit comprising this cMOSTFT, nMOSTFT or pMOSTFT or a combination thereof having high drive performance, a one-piece construction.

This permits high image quality, high precision, narrow frame, high efficiency, and a large screen display panel. In particular, although it is difficult with polycrystalline silicon to form a pMOSTFT having high hole mobility as a TFT for an LCD, the monocrystalline silicon layer of this invention shows amply high mobility even for holes. Consequently, it is possible to manufacture a peripheral drive circuit driven independently by electrons and holes or by a combination of both, and to realize a panel comprising this drive circuit and a display unit TFT having a nMOS, pMOS or cMOS LDD structure in a one-piece construction.

(C) Further, a dual gate MOSTFT is used for the peripheral drive circuit, so a cMOS, nMOS or pMOSTFT having 1.5–2 times higher drive performance than a single gate type TFT can be formed, and a high drive performance TFT with better functionality is obtained. This is particularly suitable where a high drive performance TFT is required for part of a peripheral drive circuit. For example, this invention is useful not only in that one of a pair of peripheral vertical drive circuits can be omitted, but also because it can be applied to electro-optic devices other than LCD such as organic EL or FED. Further, the dual gate structure can easily be modified to a top gate or bottom gate structure depending on the choice of upper and lower gates. Another advantage is that, even if the upper or lower gate no longer functions, the other gate can be used.

(D) Moreover, as the monocrystalline silicon layer is formed by a low temperature growth technique wherein the aforesaid substance layer is used as a seed for heteroepitaxial growth, and catalytic CVD (chemical vapor deposition using a catalyst, substrate temperature 200–800° C. and particularly 300–400° C.) is performed on this substance layer, the monocrystalline silicon layer can be formed uniformly at low temperature on the substrate. Hence, it is possible to use a substrate which is easily procured, economical and has good physical properties such as a glass substrate which has a relatively low strain point or a heat resistant organic substrate, and larger substrates may also be employed.

(E) Annealing for long periods at intermediate temperatures (approximately 600° C. for 10 hours or more) as in the case of solid phase growth, or excimer laser annealing, are unnecessary. Therefore, productivity is high, costly manufacturing equipment is not required, and cost reduction can be achieved.

(F) In this heteroepitaxial growth, a monocrystalline silicon layer having a wide range of P type or N type electrical conduction and high mobility can easily be obtained by adjusting the crystallinity of the substance layer such as the crystalline sapphire film, the gas composition ratio during catalytic CVD, the substrate heating temperature and the cooling rate. Hence, adjustment of Vth (a threshold value) is easy, and fast operation is possible due to lowering of resistance.

(G) If a suitable amount of a Group III or Group V impurity element (boron, phosphorus, antimony, arsenic, bismuth or aluminum) is doped from a doping gas during film-forming of the monocrystalline silicon by catalytic CVD or a similar process, the type and/or concentration of the impurity in the monocrystalline silicon layer formed by heteroepitaxial growth, i.e., the electrical conductance (P type/N type) and/or carrier concentration, may be controlled as desired.

(H) The aforesaid substance layer such as the crystalline sapphire film forms various atomic diffusion barriers, so diffusion of impurities from the glass substrate can be suppressed.

BRIEF DESCRIPTION OF THE DRAWINGS

FIGS. 1(1) to 1(3) are cross-sectional views showing a sequence of processes for manufacturing an LCD (liquid crystal display) according to a first embodiment of this invention.

FIGS. 2(4) to 2(7) show a sequence of.processes in the manufacture of the LCD.

FIGS. 3(8) to 3(10) show a sequence of processes in the manufacture of the LCD.

FIGS. 4(11) to 4(13) show a sequence of processes in the manufacture of the LCD.

FIGS. 5(14) to 5(16) show a sequence of processes in the manufacture of the LCD.

FIGS. 10A to 10F are schematic cross-sectional views showing various step configurations and silicon growth crystal orientations in a graphoepitaxial growth technique.

FIG. 13 is a schematic structural diagram of the LCD.

FIGS. 14(17) to 14(19) are cross-sectional views showing a sequence of processes for manufacturing an LCD according to a second embodiment of this invention.

FIGS. 16(17) to 16(20) are cross-sectional views showing a sequence of processes for manufacturing the LCD.

FIGS. 17A to 17C are cross-sectional views of essential parts of an LCD according to a third embodiment of this invention.

FIGS. 18(1) to 18(3) are cross-sectional views showing a sequence of processes for manufacturing the LCD.

FIGS. 19(4) to 19(7) show a sequence of processes in the manufacture of the LCD.

FIGS. 23(7) to 23(10) show a sequence of processes in the manufacture of the LCD.

FIGS. 25(15) to 25(17) show a sequence of processes in the manufacture of the LCD.

FIGS. 26(7) and 26(8) are cross-sectional views showing a sequence of processes for manufacturing an LCD according to a fourth embodiment of this invention.

FIGS. 27(9) to 27(11) show a sequence of processes in the manufacture of the LCD.

FIGS. 30(8) to 30(10) shows a sequence of processes in the manufacture of the LCD.

FIGS. 36A and 36B are cross-sectional views of essential parts of the LCD.

FIG. 37 is a cross-sectional view and plan view of essential parts of an LCD according to a sixth embodiment of this invention.

FIGS. 38A and 38B are cross-sectional views of essential parts of various TFT of the LCD.

FIG. 39 is an equivalent circuit diagram of the LCD.

FIGS. 40A and 40B are cross-sectional views of essential parts of a TFT of an LCD according to a seventh embodiment of this invention.

FIGS. 41(1) to 41(3) are cross-sectional views showing a sequence of processes for manufacturing an LCD according to an eighth embodiment of this invention.

FIGS. 42(4) to 42(6) show a sequence of processes in the manufacture of the LCD.

FIGS. 43(7) to 43(9) show a sequence of processes in the manufacture of the LCD.

FIGS. 45(13) to 45(15) show a sequence of processes in the manufacture of the LCD.

FIGS. 46(16) to 46(18) show a sequence of processes in the manufacture of the LCD.

FIGS. 50(15) to 50(18) are cross-sectional views showing a sequence of processes in the manufacture of the LCD.

FIGS. 53(4) to 53(6) show a sequence of processes in the manufacture of the LCD.

FIGS. 56(3) to 56(5) show a sequence of processes in the manufacture of the LCD.

FIGS. 57(6) to 57(9) show a sequence of processes in the manufacture of the LCD.

FIGS. 58(10) to 58(13) show a sequence of processes in the manufacture of the LCD.

FIGS. 61(8) to 61(10) are cross-sectional view showing a sequence of processes for manufacturing the LCD.

FIG. 63 is a cross-sectional view and plan view of essential parts of an LCD according to a twelfth embodiment of this invention.

FIG. 65 is a diagram showing combinations of various TFT in an LCD according to a thirteenth embodiment of this invention.

FIG. 66 is a diagram showing combinations of various TFT of the LCD.

FIG. 67 is a diagram showing combinations of various TFT of the LCD.

FIG. 68 is a diagram showing combinations of various TFT of the LCD.

FIG. 69 is a diagram showing combinations of various TFT of the LCD.

FIG. 70 is a diagram showing combinations of various TFT of the LCD.

FIG. 71 is a diagram showing combinations of various TFT of the LCD.

FIG. 72 is a diagram showing combinations of various TFT of the LCD.

FIG. 73 is a diagram showing combinations of various TFT of the LCD.

FIG. 75 is a diagram showing combinations of various TFT of the LCD.

DETAILED DESCRIPTION OF THE PREFERRED EMBODIMENTS

Figure 6:
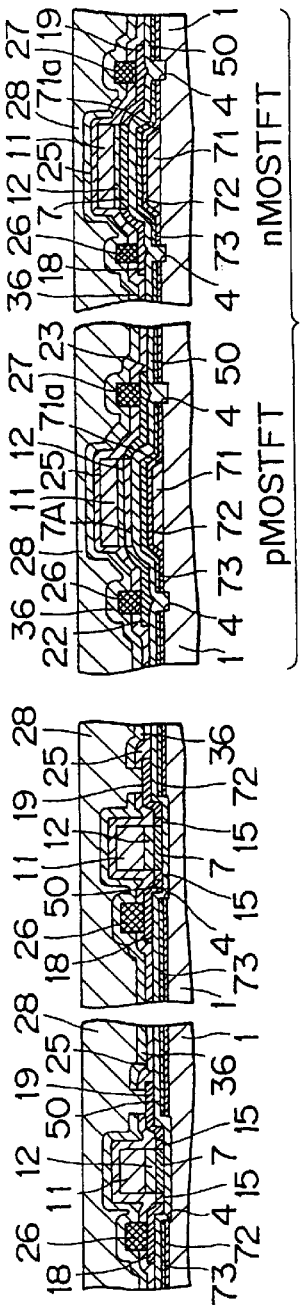
FIGS. 6(17) to 6(19) show a sequence of processes in the manufacture of the LCD.
Figure 6:
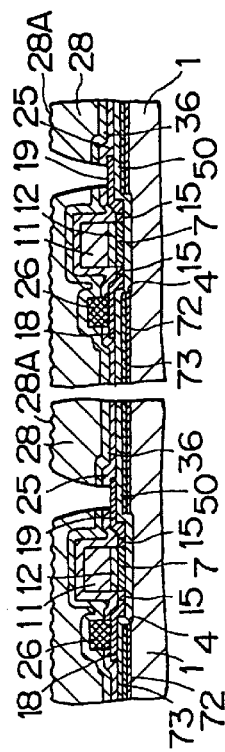
Figure 6:
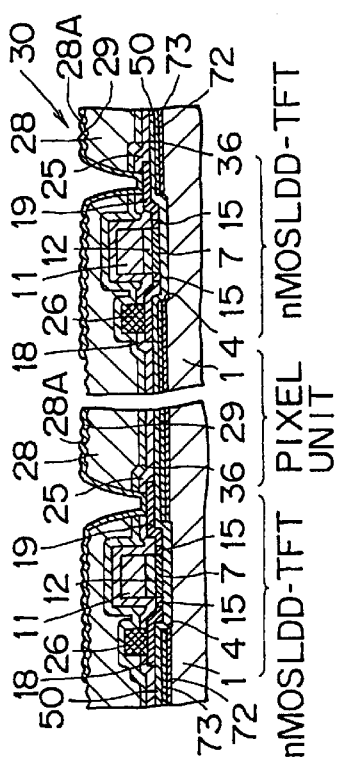

In this invention, a dual gate first thin film transistor comprising a channel region, source region and drain region formed by performing a predetermined treatment on the monocrystalline silicon layer, and comprising a gate in the upper part of the channel region, forms at least part of the peripheral drive circuit.

The first substrate is an insulating substrate, and the substance layer may be formed of a substance chosen from a group comprising sapphire ($Al_2O_3$), materials having a spinel structure (e.g. $MgO.Al_2O_3$), calcium fluoride ($CaF_2$), strontium fluoride (SrF2), barium fluoride ($BaF_2$), boron phosphide (BP), yttrium oxide ($(Y_2O_3)_m$) and zirconium oxide ($(ZrO_2)_{1-m}$).

The monocrystalline silicon layer may be formed by catalytic CVD (substrate temperature approximately 200–800° C.) using this substance layer as a seed. The heating of the substrate may be accomplished by uniform heating of the whole of the substrate in an electric furnace or by means of a lamp, or a predetermined part thereof may be heated locally by laser light or an electron beam.

When the monocrystalline silicon layer is formed by catalytic CVD, the monocrystalline silicon layer may be deposited on the substrate by bringing a gas having silicon hydride as its principal component in contact with a catalyst heated to, e.g., 800–2000° C. (less than its melting point) so as to decompose the gas.

In this case, the silicon hydride may be a silane gas such as a monosilane, disilane, trisilane or tetrasilane, and the catalyst may be at least one material chosen from a group comprising tungsten, tungsten containing thorium, molybdenum, platinum, palladium, silicon, alumina, ceramics with adhering metal and silicon carbide.

According to this invention, the substrate is an insulating substrate, in particular a glass substrate having a low strain point or heat-resisting organic substrate, and a monocrystalline silicon layer can be formed on a large glass substrate (e.g. 1 m² or larger). As the substrate temperature during catalytic CVD is low as described above, glass having a strain point as low as 470–670° C. may be used as the glass substrate. This type of substrate is economical, can easily be made into thin plate, and can be used to produce glass plate formed into a long roll. Hence, using this technique, a monocrystalline silicon thin film can be produced continuously or discontinuously by heteroepitaxial growth on a long rolled glass plate or a heat resisting organic substrate.

As component elements easily diffuse into the upper layer of low strain point glass from the interior of the glass, a diffusion barrier layer e.g., a film of silicon nitride (hereafter referred to as SiN) of thickness of the order of 50–200 nm, for example, may be formed to suppress this.

In the above catalytic CVD, the doping gas such as $PH_3$ or $B_2H_6$ may be mixed with the supply gas, so the monocrystalline silicon layer may be made n type or p type and an nMOSTFT or pMOSTFT can be manufactured, therefore a cMOSTFT can also be manufactured.

Hence, the monocrystalline silicon layer grown heteroepitaxially on the substrate may be applied to the channel region, source region and drain region of a dual gate MOSTFT forming at least part of a peripheral drive circuit, and the type and/or concentration of the impurities in these regions may be controlled.

The thin film transistor of the peripheral drive circuit unit and display unit is a n channel type, p channel type or complementary type of insulating gate field effect transistor, and may be a combination of complementary type and n channel type, a combination of complementary type and p channel type, or a combination of complementary type, n channel type and p channel type. Also, at least part of the thin film transistor of the peripheral drive circuit unit and/or display unit may comprise an LDD (Lightly Doped Drain) structure. The LDD structure may be provided not only between the gate and drain, but also between the gate and source, or between both the gate and source, and the gate and drain (this is referred to as a double LDD).

In particular, in the display unit, this MOSTFT may be a nMOS, pMOS or cMOS LDD type TFT, and in the peripheral drive circuit unit, it may be cMOS, nMOS or pMOSTFT, or a combination thereof.

According to this invention, a step is provided on the substrate and/or on the film on the substrate. This step may be formed in the insulating substrate or in the SiN or other film on the substrate (or in both) as a depression having a side face which is perpendicular or slanting towards the lower end relative to the base plane in a section, and it may be a seed for epitaxial growth of the monocrystalline silicon layer. This step may be formed along at least one side of an element region formed by the channel region, source region and drain region. Also, if a passive device, for example a resistance, is formed by the monocrystalline silicon layer, this step may be formed along at least one side of the element region formed by the resistance.

In this case, a step of predetermined shape as described above, which is a seed for epitaxial growth, is formed at a predetermined position in the insulating substrate which is the aforesaid substrate, and the aforesaid substance layer may be formed on this insulating substrate comprising this step.

Alternatively, a step of identical predetermined shape may be formed in the substance layer, and the monocrystalline silicon layer formed on the substance layer comprising this step.

In these cases, as the step acts as a seed in addition to the substance layer, a monocrystalline silicon layer of higher crystallinity can be formed.

The first thin film transistor may be provided inside the substrate depression due to this step as described hereabove, but it may also be provided in the substrate near the depression but outside it, or both inside and outside it. The step may be formed by dry etching such as reactive ion etching.

In this case, the step may be formed on one of the surfaces of the first substrate, a monocrystalline, polycrystalline or amorphous silicon layer may be formed on the substrate comprising this step, and a second thin film transistor may be a top gate, bottom gate or dual gate type comprising the monocrystalline, polycrystalline or amorphous silicon layer as channel region, source region and drain region, having a gate in the upper part and/or lower part of the channel region.

In this case also, an identical step to that described above is formed as a depression having a side face which is perpendicular or slanting towards the lower end relative to the base plane in a section, and this step acts as a seed for epitaxial growth of the monocrystalline silicon layer.

The second thin film transistor may be provided inside and/or outside a substrate depression due to this step formed in the first substrate and/or the film thereon, and its source, drain and channel region may be formed using a monocrystalline silicon layer obtained by graphoepitaxial growth in the same way as in the first thin film transistor.

In this second thin film transistor also, the type and/or concentration of Group III or Group V impurities in the monocrystalline, polycrystalline or amorphous silicon layer may be controlled, and a step may be formed along at least one side of an element region formed in the channel region, source region and drain region of the second thin film transistor, as described here above. Further, a gate electrode may be formed under the monocrystalline, polycrystalline or amorphous silicon layer whereof the side end i s gently sloping to form a trapezoidal cross section shape. A diffusion barrier layer may be provided between the first substrate and the monocrystalline, polycrystalline or amorphous silicon layer.

The source or drain electrode of the first and/or second thin film transistor may be formed in a region comprising this step.

The first thin film transistor may be at least a dual gate type chosen from a top gate, bottom gate or dual gate type having a gate in the upper part and/or lower part of the channel region, and the switching element which switches the pixel electrode in the display unit may be a second thin film transistor of the aforesaid top gate, bottom gate or dual gate type.

In this case, the gate electrode provided in the lower part of the channel region may be formed of a heat resisting material, and the upper gate electrode of the second thin film transistor and the gate electrode of the first thin film transistor may be formed of a common material.

In the peripheral drive circuit unit, apart from the first thin film-transistor, a top gate, bottom gate or dual gate thin film transistor comprising a polycrystalline or amorphous silicon layer as channel region, and having a gate in the upper part and/or lower part of this channel region, or a diode, resistance, capacitance or inductance element using a monocrystalline silicon layer, polycrystalline silicon layer or amorphous silicon layer, may be provided.

The thin film transistor of the peripheral drive circuit unit and/or the display unit may be a single gate or multi-gate type.

When the n or p channel type thin film transistor of the peripheral drive circuit unit and/or the display unit is a dual gate type, the upper or lower gate electrode may be left electrically open, or an arbitrary negative voltage (in the case of n channel type) or positive voltage (in the case of p channel type) may be applied, and the thin film transistor may be operated as a bottom gate or top gate thin film transistor.

The thin film transistor of the peripheral drive circuit unit may be a n channel type, p channel type or complementary type of first thin film transistor, and the thin film transistor of the display unit may be n channel type, p channel type or complementary type when a monocrystalline silicon layer is the channel region, n channel type, p channel type or complementary type when a polycrystalline silicon layer is the channel region, and n channel type, p channel type or complementary type when an amorphous silicon layer is the channel region.

According to this invention, after growing the monocrystalline silicon layer, an upper gate comprising a gate electrode film and a gate electrode may be formed on this monocrystalline silicon layer, and a Group III or Group V impurity element introduced to form the channel region, source region and drain region using this upper gate as a mask.

When the second thin film transistor is a bottom gate or dual gate type, a lower gate electrode comprising a heat resisting material is provided in the lower part of the channel region, and after forming a gate insulation film on this gate electrode to form a lower gate, the second thin film transistor may be formed by a common process with the first thin film transistor comprising a process for forming the step. In this case, the upper gate electrode of the second thin film transistor and the gate electrode of the first thin film transistor may be formed of a common material.

After forming the monocrystalline silicon layer on the lower gate, a Group III or Group V impurity element is introduced in this monocrystalline silicon layer, and after forming a source and drain region, activation treatment may be performed.

After forming the monocrystalline silicon layer, the source and drain regions of the second thin film transistor may be formed by ion implantation of an impurity element using a resist as a mask, activation treatment performed after this ion implantation to form a gate insulation film, an upper gate electrode of the first thin film transistor formed, and an upper gate electrode of the second thin film transistor formed if necessary.

When the second thin film transistor is a top gate type, after forming the monocrystalline silicon layer, the source and drain regions of the second thin film transistor may be formed by ion implantation of an impurity element using a resist as a mask, activation treatment performed after this ion implantation, and gates comprising a gate insulation film and gate electrode of the first and second thin film transistor formed after an appropriate time.

Alternatively, when the second thin film transistor is a top gate type, after forming the monocrystalline silicon layer, gates may be formed by forming gate electrodes comprising gate insulation films and heat resisting materials of the first and second thin film transistor, source and drain regions of the first and second thin film transistor formed by ion implantation of an impurity element using these gates and a resist as a mask, and activation treatment performed after this ion implantation.

Further, the resist mask used when forming the LDD structure may be left, and ion implantation performed to form a source region and a drain region using a resist mask covering this.

The aforesaid substrate may be optically opaque or transparent, and a reflecting type or transmitting type pixel electrode provided to the display unit.

By giving the display unit a laminated structure comprising the pixel electrode and a color filter layer, and by incorporating the color filter on a display array unit, the aperture of the display panel and brightness are improved, the color filter substrate maybe omitted, and cost reduction achieved by improving productivity.

In this case, when the pixel electrode is a reflecting electrode, an unevenness may be formed on a resin film to obtain optimum reflecting characteristics and visual field angle characteristics, and the pixel electrode formed thereupon, and when the pixel electrode is a transmitting electrode, the surface may be flattened by a transparent flattening film, and the pixel electrode formed on this flattened surface.

The display unit may perform light emission or light adjustment by being driven by the aforesaid MOSTFT, and may comprise for example a liquid crystal display (LCD), electroluminescence display (EL) or field emission display (FED), light-emitting polymer display (LEPD) or light-emitting diode D display (LED). In this case, plural pixel electrodes may be arranged in a matrix in the display unit, and a switching element connected respectively to each of these pixel electrodes.

Next, this invention will be described in more detail with reference to specific embodiments.

First Embodiment

FIGS. 1–13 show a first embodiment of this invention.

This embodiment relates to an active matrix reflection type liquid crystal display device (LCD) wherein a substance layer (for example, a crystalline sapphire film) is formed on a surface containing a step (depression) provided in a heat resisting substrate, heteroepitaxial growth of a monocrystalline silicon layer is performed by catalytic CVD using this substance layer as a seed, and a dual gate MOSTFT is formed as a peripheral drive circuit unit using this monocrystalline silicon layer.

First, the layout of the whole reflection type LCD will be described referring to FIGS. 11–13.

Figure 11:
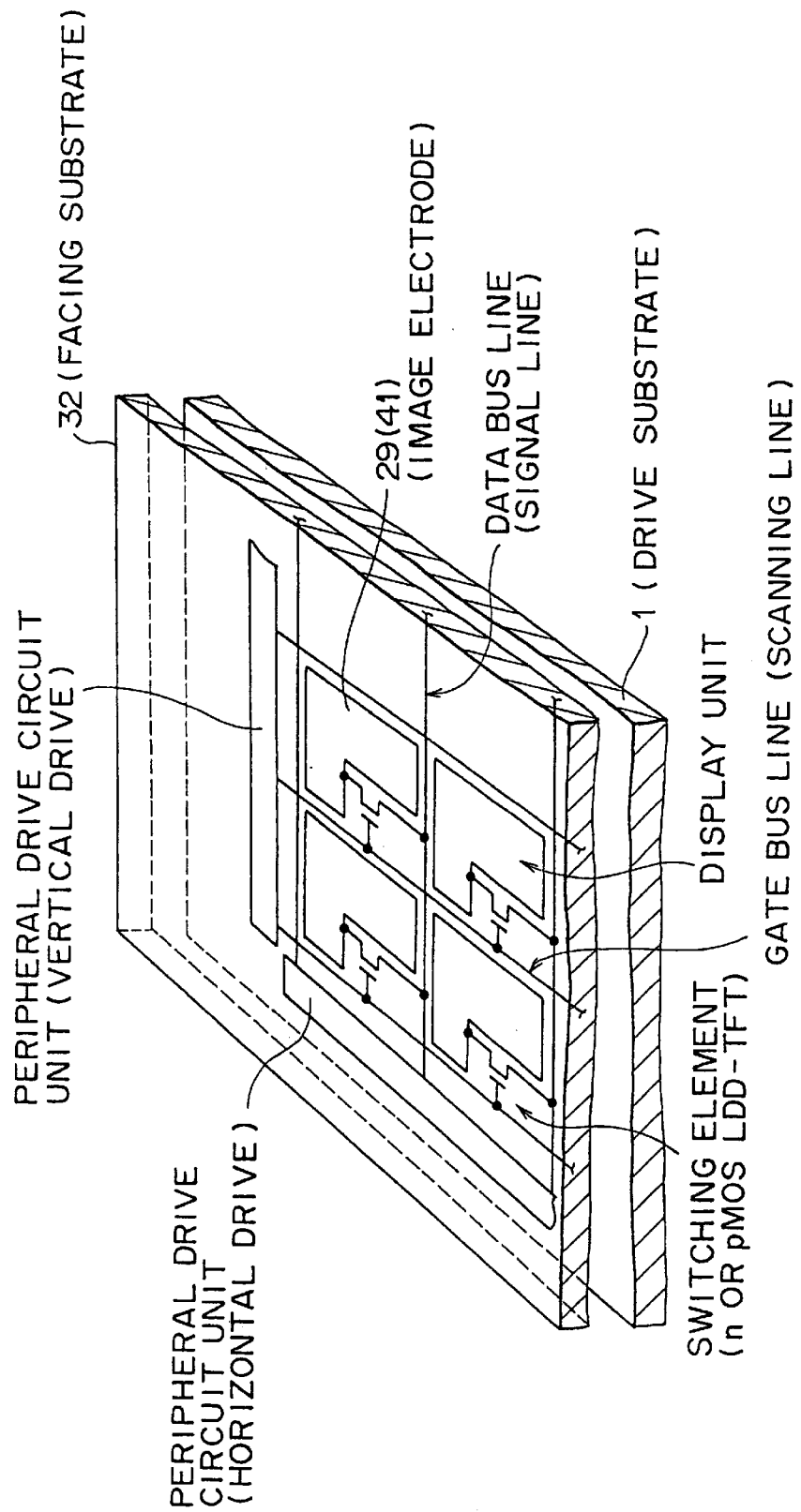
FIG. 11 is a perspective view showing a schematic layout of the whole of the LCD according to the first embodiment of this invention.

As shown in FIG. 11, this active matrix reflection type LCD has a flat panel structure wherein a main substrate 1 (this is the active matrix substrate) and a facing substrate 32 are stuck together via a spacer, not shown. A liquid crystal, not shown, is sealed between the substrates 1–32. A display unit comprising pixel electrodes 29 (or 41) disposed in a matrix and a switching element which drives this pixel electrode, and a peripheral drive circuit unit connected to this display unit, are provided on the upper surface of the main substrate 1.

The switching element of the display unit is a top gate MOSTFT having an LDD structure using a nMOS, pMOS or cMOS based on this invention. Moreover, cMOS, nMOS or pMOSTFT of a dual gate MOSTFT based on this invention, or combinations thereof, are also formed in the peripheral drive circuit unit as circuit components.

One peripheral drive circuit unit is a horizontal drive circuit which supplies a data signal and drives the TFT of the pixels in every horizontal line, and the other peripheral drive circuit unit is a vertical drive circuit which drives the gates of the TFT of the pixels in every scanning line. Normally, these circuits are provided on both sides of the display unit. These drive circuits may be point sequential analog type or line sequential digital type.

Figure 12:
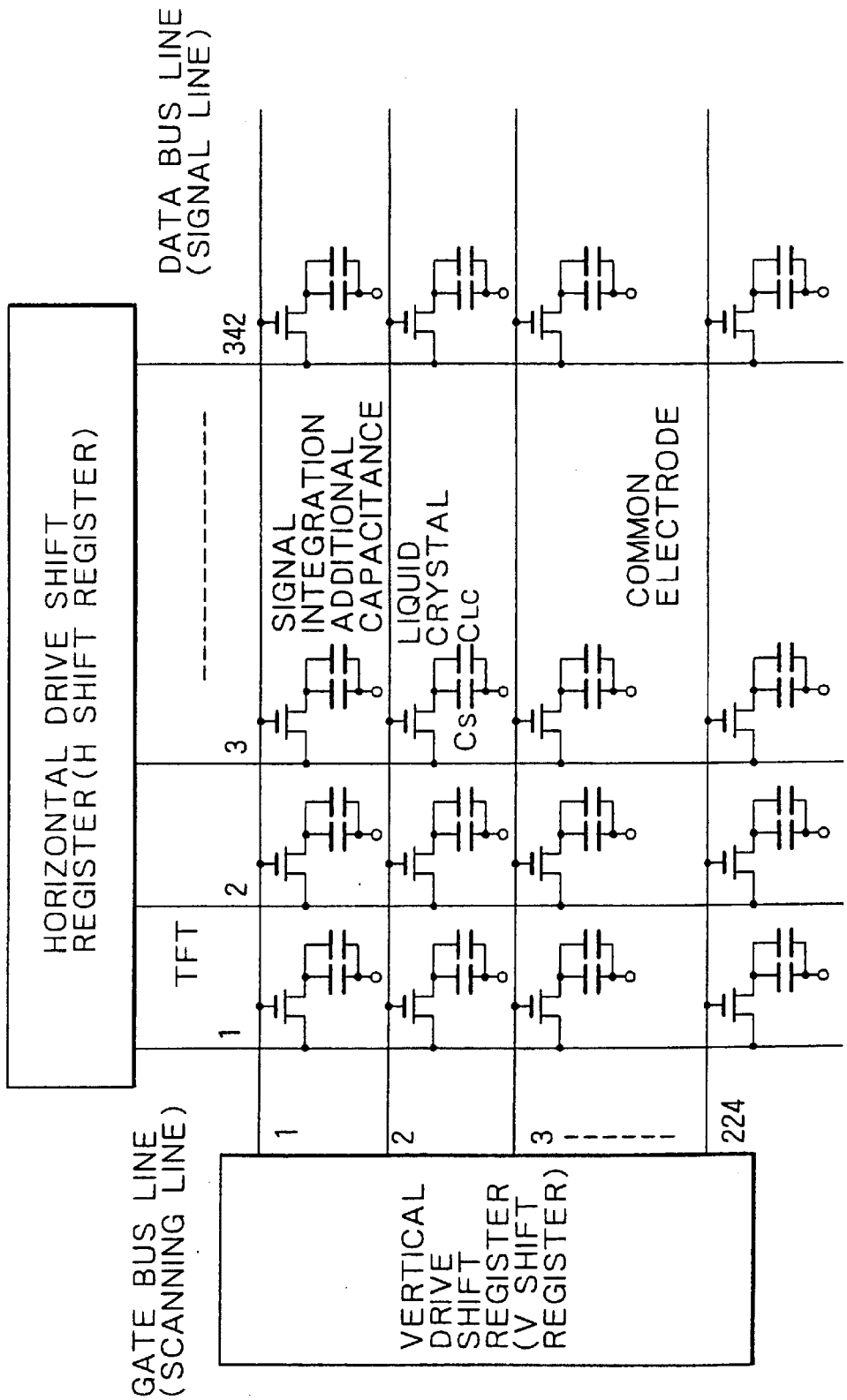
FIG. 12 is an equivalent circuit diagram of the LCD.

As shown in FIG. 12, a TFT is disposed at the intersection of a gate bus line and a data bus line which are perpendicular to one another. Image information is written to a liquid crystal capacity ($C_{LC}$) via this TFT and is held until the following information-arrives. In this case, the channel resistance of the is not sufficient to hold the information, so it may be supplemented by a storage capacitance (auxiliary capacitance) ($C_s$) added to the liquid crystal capacity in parallel to compensate the decrease of liquid crystal voltage due to leak current.

In such TFT for LCD, there are different requirements for the characteristics of the TFT used for the pixel unit (display unit) and the TFT used for the peripheral drive circuit unit. In particular, in the TFT of the pixel unit, controlling OFF current and maintaining ON current are serious problems. For this reason, in the display unit, by providing a TFT with an LDD structure as described later, the actual field applied to the channel region is reduced. In this structure, the region between the gate and the drain is not easily affected by the field, so the OFF current can be reduced and variation of characteristics minimized. However this complicates the process, increases element size and causes the ON current to decrease, so an optimal design is necessary according to intended usage.

As the liquid crystal, liquid crystals for various modes, such as a TN liquid crystal (nematic liquid crystal used for driving a TN mode active matrix), STN (super twisted nematic), GH (guest host), PC (phase change), FLC (ferroelectric liquid crystal), AFLC (antiferroelectric liquid crystal), and PDLC (polymer dispersion liquid crystal), may be used.

Regarding FIG. 13, the circuit layout of the peripheral drive circuit unit and an outline of the drive method will now be described. The drive circuit is divided into a gate side drive circuit and a data side drive circuit, and a shift register must be formed on both the gate and data sides. In general, shift registers may use both a pMOSTFT and nMOSTFT (a so-called CMOS circuit) and there are some registers which use only one of these MOSTFT, but from the viewpoint of operating speed, reliability and low power consumption, cMOSTFT or CMOS are usual.

The scanning side drive circuit comprises a shift register and a buffer, and it sends a pulse synchronized with a horizontal scanning period to each line from the shift register. On the other hand, the data side drive circuit may use either of two drive methods, i.e., a point sequential system or a line sequential system. In the point sequential system shown, the circuit layout is relatively simple, the display signal being directly written to each pixel via an analog switch while performing control by the shift register. In this system, data is written sequentially to each pixel in one horizontal scanning period (in the figure, R, G and B schematically show pixels for each color).

Next, the construction of the active matrix reflection type LCD according to this embodiment and its manufacturing process will be described referring to FIG. 1–FIG. 10. In FIG. 1–FIG. 6, the left-hand side shows the manufacturing process of the display unit, and the right-hand side shows the manufacturing process of the peripheral drive circuit unit.

First, as shown in FIG. 1(1), a sputter film 71 (500–600 nm thickness) of molybdenum/tantalum (Mo/Ta) alloy is formed on one of the principal surfaces of the insulating substrate 1 which may be of borosilicate glass, quartz glass or transparent crystallized glass.

Next, as shown FIG. 1(2), a photoresist 70 is formed in a predetermined pattern, taper etching of the Mo/Ta film 71 is performed using this as a mask, and a gate electrode 71 is formed comprising a trapezoidal cross section shape and a side end 71a which is gently sloping at 20–45 degrees.

Next, as shown in FIG. 1(3), after removal of the photoresist 70, a gate insulation film comprising a SiN film 72 (approximately 100 nm thickness) 72 and $SiO_2$ film (approximately 200 nm thickness) 73 laminated in this order is formed by plasma CVD or the like on the substrate 1 which comprises the molybdenum tantalum alloy film 71.

Next, as shown in FIG. 2(4), a photoresist 2 is formed in a predetermined pattern in at least the TFT-forming region, and plural steps 4 having a suitable shape and size are formed in the gate insulation film (and in the substrate 1) by irradiating with, for example, $F^+$ ions 3 of a $CF_4$ plasma using this as a mask, and performing general-purpose photolithography such as reactive ion etching (RIE) and etching (photoetching).

In this case, highly heat resistant substrates (8–12 inch diameter, 700–800 $\mu$m thickness) such as quartz glass, transparent crystallized glass, ceramics, etc. may be used as the insulating substrate 1, (however, in the transmitting type LCD described hereafter, neither an opaque ceramic substrate nor low transparency crystallized glass can be used). The step 4 serves as a seed together with a crystalline sapphire film 50 during heteroepitaxial growth of monocrystalline silicon, described later. It may have a depth d of 0.3–0.4 $\mu$m, width w of 2–10 $\mu$m, and length (perpendicular direction to the plane of the paper) of 10–20 $\mu$m, and the angle made by the base side and a side face (base angle) is a right-angle. In addition, a SiN film (e.g., 50–200 nm thickness) and if necessary, a silicon oxide film (hereafter referred to as $SiO_2$ film, e.g., approximately 100 nm thickness) may first be formed continuously on the upper surface of the substrate 1 to prevent diffusion of Na ions or the like from the glass substrate.

Next, as shown in FIG. 2(5), after removing the photoresist 2, the crystalline sapphire film 50 (20 to 200 nm thickness) is formed at least in the TFT-forming region comprising the step 4 on a principal surface of the insulating substrate 1. This crystalline sapphire film 50 is formed by oxidation of trimethylaluminum gas or the like with an oxidizing gas (oxygen and water vapor) by high density plasma CVD or catalytic CVD (Japanese Patent Laid-OpenNo. Sho 63-40314), and crystallization. A highly heat resistant glass substrate (8–12 inch diameter, 700–800 $\mu$m thickness) may be used as the insulating substrate 1.

Next, as shown in FIG. 2(6), a monocrystalline silicon film 7 is heteroepitaxially grown to a thickness of several $\mu$m-0.005 $\mu$m (e.g., 0.1 $\mu$m) over the entire surface including the step 4 by catalytic CVD (substrate temperature 200–800° C.) as shown in, for example, Japanese Patent Application Laid-Open No. Sho 63-40314. In this case, as the side end 71a of the gate electrode 71 of the substrate is a gently inclined surface, epitaxial growth on this surface is not obstructed by the step 4, and the monocrystalline silicon layer 7 grows without discontinuities. When the substrate 1 is borosilicate glass, the substrate temperature is 200 to 600° C., and when it is quartz glass, crystallized glass or a ceramic substrate, the substrate temperature is 600 to 800° C.

Figure 8:
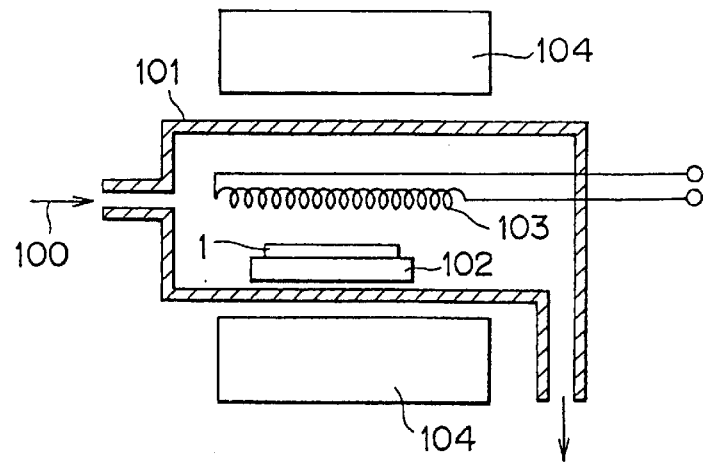
FIG. 8 is a schematic view of a catalytic CVD device used in the manufacture of the LCD.

In this case, catalytic CVD may be performed using the device shown in FIG. 8. According to this catalytic CVD device, a silicon hydride (for example, a monosilane or disilane) gas 100 (and a doping gas, such as $B_2H_6$, $PH_6$ or $A_sH_3$ if necessary) are introduced from a supply conduit to a deposition chamber 101. A susceptor 102 for supporting the substrate 1 and a coil-shaped catalyst 103 facing the susceptor are disposed respectively in the deposition chamber 101. The substrate 1 is heated by an external heating means 104 (for example, an electric heating means), and the catalyst 103, for example a resistance wire, is heated and activated below its melting point (i.e., to 800 to 2000° C., or approximately 1700° C. in the case of tungsten).

The atmosphere in the deposition chamber 101 is changed from nitrogen to hydrogen (approximately 15–20 minutes), the temperature is increased from approximately 200 to 800° C., silane gas is brought in contact with the catalyst 103 and catalytically decomposed, and deposition takes place on the substrate 1 which is maintained at low temperature (for example, 300° C.). The deposition time is calculated from the epitaxial growth layer thickness. After growth is complete, the temperature is lowered, the hydrogen is replaced by nitrogen, and the substrate 1 is removed. As silicon atoms or clusters of silicon atoms of high energy are formed by a catalytic reaction or thermal decomposition reaction due to the catalyst 103, and as deposition takes place on the step 4 which acts as a seed, the monocrystalline silicon layer can be deposited in a low temperature region far below the temperature at which deposition is ordinarily possible in thermal or plasma CVD.

The substrate 1 may either be heated uniformly by heating the whole substrate in an electric furnace, or it may be heated locally at predetermined positions, for example only in the TFT-forming region, by an optical laser or electron beam, etc.

Figure 9A:
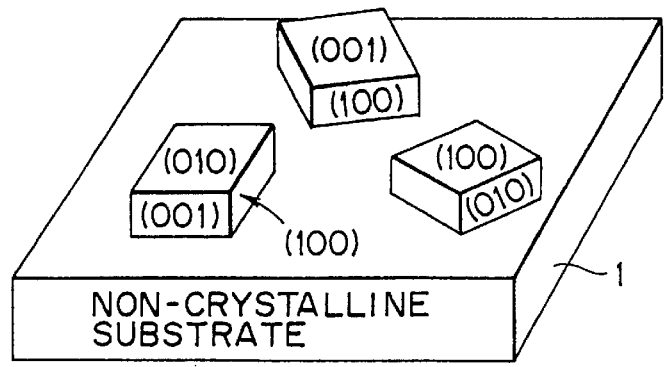
FIGS. 9A and 9B are schematic perspective views for describing silicon crystal growth on an amorphous substrate.
Figure 9B:
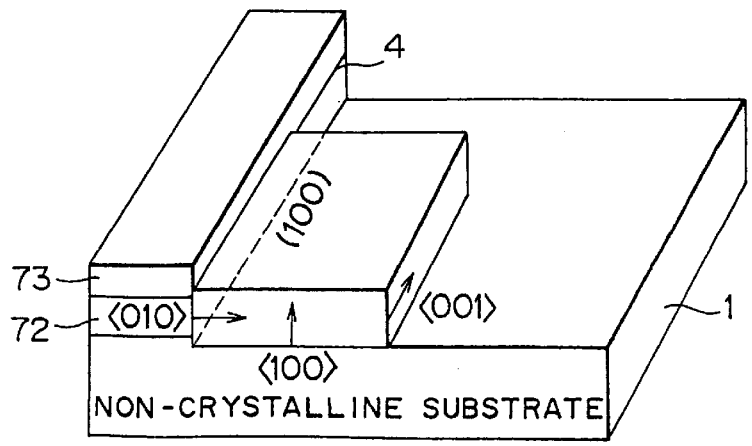

As the crystalline sapphire film 50 has good lattice compatibility with monocrystalline silicon, in the monocrystalline silicon layer 7 deposited as described above, the (100) plane for example grows heteroepitaxially on the substrate. In this case, the step 4 contributes to heteroepitaxial growth having the characteristics of graphoepitaxial growth known in the art, so that the monocrystalline silicon layer 7 obtained has a higher crystallinity. Concerning this, if a vertical wall such as the above-mentioned step 4 is formed on the amorphous (glass) substrate 1 and an epitaxial layer is formed thereupon as shown in FIG. 9, whereas the surfaces originally have random orientations as shown in FIG. 9(a), the (100) plane grows along the surface-of the step 4 as shown in FIG. 9(b) when the step 4 is present.

The size of this monocrystalline particle increases in direct proportion to the product of temperature and time, but if the temperature is low and the time is short, the interval of the above-mentioned step must be made small. Also, the crystal orientation of the growth layer can be controlled by varying the shape of the step as shown in FIGS. 10(a)–(f). In the manufacture of MOS transistors, the (100) plane is most often used. Specifically, insofar as concerns the cross-sectional shape of the step 4, the angle of the base side angle part (base angle) maybe a right angle, or it may incline slightly inwards or outwards from top to bottom, and it may have surfaces in specific directions which tend to produce crystal growth. Normally, the base angle of the step 4 is preferably a right angle or less than 90 degrees, and the angle part of its base plane may have a slight curvature.

In this way, after depositing the monocrystalline silicon layer 7 on the substrate 1 by catalytic CVD and heteroepitaxial growth, a dual gate MOSTFT wherein the monocrystalline silicon layer 7 is the channel region is produced in the peripheral drive circuit unit, and a top gate MOSTFT is produced in the display unit, respectively.

First, as there is scatter in the impurity concentration of the monocrystalline silicon layer 7 due to the above-mentioned epitaxial growth, the whole surface is doped by a suitable amount of a P type carrier impurity, for example, boron ions, so as to adjust the resistivity. Also, the pMOSTFT-forming region is selectively doped with a N type carrier impurity to form a N type well. For example, the p channel TFT part is masked by a photoresist, not shown, and doped with P type impurity ions (for example, $B^+$) at a dosage of $2.7 \times 10^{11}$ atoms/cm$^2$ at 10 kV to adjust the resistivity. Also, as shown in (7) of FIG. 2, to control the impurity concentration of the pMOSTFT-forming region, the nMOSTFT part is masked by a photoresist 60, and doped with N type impurity ions 65 (for example, $P^+$) at a dosage of $1 \times 10^{11}$ atoms/cm$^2$ at 10 kV to form a N type well 7A.

Next, as shown in (8) of FIG. 3, $SiO_2$ (approximately 200 nm thickness) and SiN (approximately 100 nm thickness) are continuously formed in this order on the whole surface of the monocrystalline silicon layer 7 by plasma CVD, high density plasma CVD or catalytic CVD, so as to form a gate insulation film 8, and a sputter film 9 (500–600 nm thickness) of a molybdenum tantalum (Mo/Ta) alloy is then formed.

Next, as shown in (9) of FIG. 3, a photoresist pattern 10 is respectively formed inside the step region (depression) of the TFT part of the display region and outside the step region (depression) of the TFT part of the peripheral drive region by general-purpose photolithography, a gate electrode 11 of (Mo/Ta) alloy and gate insulation film (SiN/SiO$_2$) 12 are formed by continuous etching, and the monocrystalline silicon layer 7 is exposed. The (Mo/Ta) alloy film 9 is treated with an acid etching solution, SiN is treated by plasma etching with CF4 gas, and SiO$_2$ is treated with hydrofluoric acid etching solution.

Next, as shown in (10) of FIG. 3, all the nMOS and pMOSTFT of the peripheral drive region and the gates of the nMOSTFT of the display region are covered by a photoresist 13, and the exposed source/drain regions of the nMOSTFT are doped with phosphorus ions 14, for example, at a dosage of $5 \times 10^{13}$ atoms/cm$^2$ at 20 kV (ion implantation), to form a LDD 15 comprising a N-layer by self-alignment.

Next, as shown in (11) of FIG. 4, all the pMOSTFT of the peripheral drive region, the gates of the nMOSTFT of the peripheral drive region and the gates and LDD of the nMOSTFT of the display region are covered by a photoresist 16, and the exposed regions are doped with phosphorus or arsenic ions 17, for example at a dosage of $5 \times 10^{15}$ atoms/cm$^2$ at 20 kV (ion implantation), to form a source 18, drain 19 and LDD 15 comprising the $N^+$ layer of the nMOSTFT.

Next, as shown in (12) of FIG. 4, all the nMOSTFT of the peripheral drive region and nMOSTFT of the display region, and the gates of the pMOSTFT, are covered by a photoresist 20, and the exposed regions are doped with boron ions 21, for example at a dosage of $5 \times 10^{15}$ atoms/cm$^2$ at 10 kV (ion implantation), to form a source 22 and drain 23 of the $P^+$ layer of the pMOSTFT.

It may be noted that in the case of a nMOS drive circuit, as there is no pMOSTFT, this operation is unnecessary.

Next, as shown in (13) of FIG. 4, in order to form islands of active elements such as TFT and diodes, and passive elements such as resistances and inductances, a photoresist 24 is formed and the monocrystalline silicon thin film layer excepting all the active elements and passive elements of the peripheral drive region and display region is removed by general-purpose photolithography and etching. The etching solution is a hydrofluoric acid system.

Next, as shown in (14) of FIG. 5, a $SiO_2$ film (approximately 200 nm thickness) and phosphosilicate (PSG) film (approximately 300 nm thickness) are continuously formed in this order on the whole surface by plasma CVD, high density plasma CVD or catalytic CVD to form a protective film 25.

Activation treatment of the monocrystalline silicon layer is carried out in this state. In this activation treatment, halogen lamp or other lamp annealing conditions are approximately 1000° C. for approximately 10 seconds. A gate electrode material which can withstand these conditions is required, and Mo/Ta alloy of high melting point is suitable. This gate electrode material may therefore not only be used for the gate but may also be used as an interconnection over a wide area. Herein, costly excimer laser annealing is not used, but if it were used, preferable conditions are full surface or selective (90% or higher) overlap scanning of only the active elements or passive elements with XeCl (308 nm wavelength).

Next, as shown in (15) of FIG. 5, contact openings are made in the source/drains of all the TFT in the peripheral drive circuit and the sources of the display TFT by general-purpose photolithography and etching.

A sputter film of aluminum, aluminum alloy such as aluminum with 1% Si, aluminum with 1–2% copper or copper, of thickness 500–600 nm, is formed over the whole surface, source electrodes 26 of all the TFT in the peripheral drive circuit unit and the display unit, and drain electrodes 27 of the peripheral drive circuit unit are formed by general-purpose photolithography and etching, and a data line and gate line are also formed.

Subsequently, sinter processing is performed in a forming gas (N2+H2) at approximately 400° C./1h.

Next, as shown in (16) of FIG. 5, an insulating film 36 which comprises a PSG film (approximately 300 nm thickness) and a SiN film (approximately 300 nm thickness) is formed over the whole surface by plasma CVD, high density plasma CVD or catalytic CVD. Next, a contact opening is made for the drain of the display TFT. It is unnecessary to remove the $SiO_2$, PSG and SiN films of the pixel unit.

The basic requirement of a reflection type liquid crystal display device is that it must have a function to reflect and a function to scatter incident light in the liquid crystal panel. This is because, although the direction of an observer relative to the display is effectively fixed, the direction of an incident light is not uniquely determined. Therefore, a reflector needs to be designed supposing that a point light source exists in an arbitrary direction. For this purpose, a photopolymer film 28 of 2–3 $\mu$m thickness is formed over the whole surface by spin coating etc., as shown in (17) of FIG. 6, then an unevenly shaped pattern is formed by general-purpose photolithography and etching to obtain optimum reflection characteristics and visual field angle characteristics in at least the pixel unit, and reflow is performed to form the lower part of a reflecting surface comprising an uneven rough surface 28A, as shown in (18) of FIG. 6. A resin opening for contact of the drain of the display TFT is made simultaneously.

Next, as shown in (19) of FIG. 6, a sputter film, such as aluminum or aluminum with 1% Si of 400–500 nm thickness, is formed over the whole surface, the aluminum or film of similar material in parts other than the pixel unit is removed by general-purpose photolithography and etching, and a reflection part 29 of aluminum or similar material having an uneven shape is thereby formed connected to the drain 19 of the display TFT. This is used as a pixel electrode for the display. Subsequently, sinter processing is performed at approximately 300° C./1 h in a forming gas to ensure soundness of contacts. Also, silver or a silver alloy may be used instead of an aluminum material to increase the reflectance.

In this way, the monocrystalline silicon layer 7 is formed by catalytic CVD using the crystalline sapphire film 50 comprising the step 4 as a seed for heteroepitaxial growth, and a one-piece active matrix substrate 30 comprising the display unit and peripheral drive circuit unit, wherein a CMOS circuit formed by a top gate nMOSLDD-TFT, and dual gate pMOSTFT and nMOSTFT, is integrated respectively in the display unit and drive circuit unit using this monocrystalline silicon layer 7, is thereby manufactured.

Next, the method of manufacturing a reflecting type liquid crystal display device (LCD) using this active matrix substrate (drive substrate) 30 will be described referring to FIG. 7. Henceforth, this active matrix substrate will be referred to as a TFT substrate.

When this LCD liquid crystal cell is manufactured by assembling the screen (it is suitable for medium/large liquid crystal panels of 2 inch size or larger), polyimide oriented films 33, 34 are first formed on element-forming surfaces of the TFT substrate 30 and the facing substrate 32 provided with an ITO (indium tin oxide) electrode 31 over the whole surface. This polyimide oriented film is formed to 50–100 nm thickness by roll coating, spin coating, etc., and is cured at 180° C./2h.

Next, the TFT substrate 30 and the facing substrate 32 are rubbed, or optical orientation treatment is performed. Cotton or rayon, etc., may be used as rubbing buff materials, but from the viewpoint of buff residues (dirt) or retardation, cotton is more stable. Optical orientation is a technique for orienting liquid crystal molecules by linearly polarized ultraviolet light irradiation without contact. By means of this orientation, apart from rubbing, a polymer oriented film is formed by arranging polarized or unpolarized light to be incident at an oblique angle (an example of such a polymer compound is a polymethylmethacrylate polymer or the like comprising azobenzene).

Next, after cleaning, a common agent is applied to the TFT substrate 30, and a sealing agent is applied to the facing substrate 32. To remove rubbing buff residues, water or IPA (isopropyl alcohol) cleaning is performed. The common agent may be an acryl or epoxyacrylate comprising a conducting filler or an epoxy adhesive, and the sealing agent may be an acryl or epoxyacrylate, or an epoxy adhesive. Heat curing, ultraviolet light curing or ultraviolet light curing with heat curing can be used, but from the viewpoint of accuracy of superimposition and ease of operation, ultraviolet light curing with heat curing is preferable. Next, spacers for obtaining a predetermined gap are dispersed on the side of the facing substrate 32, and superimposed on the TFT substrate 30 at a predetermined position. After precisely aligning an alignment mark on the facing substrate 32 and an alignment mark on the TFT substrate 30, ultraviolet light irradiation is performed to temporarily cure the sealing agent, and heat curing is then performed in one operation.

Next, a scribe break is made, and a single liquid crystal panel comprising the facing substrate 32 superimposed on the TFT substrate 30 is thereby manufactured.

Next, a liquid crystal 35 is poured into the gap between the substrates 30–32, and after sealing the inlet with an ultraviolet light adhesive, IPA cleaning is performed. Any liquid crystal may be used, but a TN (twist nematic) mode which has a fast response using a nematic liquid crystal is common.

Next, heating and quenching are performed so as to orient the liquid crystal 35.

Next, flexible wiring is connected to the panel electrode takeoff connection of the TFT substrate 30 by thermocompression bonding of an anisotropic electrically conducting film, and a polarizing plate is stuck onto the facing substrate 32.

When this liquid crystal panel is assembled in screen units (it is suitable for medium/large liquid crystal panels of 2 inch size or more), the polyimide oriented films 33, 34 are first formed on element-forming surfaces of the TFT substrate 30 and the facing substrate 32, and both substrates are rubbed or oriented by non-contact linearly polarized ultraviolet light.

Next, the TFT substrate 30 and the facing substrate 32 are divided into individual pieces by dicing or scribe break, and washed with water or IPA. A common agent is applied to the TFT substrate 30, and a sealing agent comprising a spacer is applied to the facing substrate 32. The subsequent processes are based on the above.

The facing substrate 32 in the above-mentioned reflecting type LCD is a CF (color filter) substrate, and comprises a color filter layer 46 underneath an ITO electrode 31. Light incident from the facing substrate 32 side is efficiently reflected by the reflecting film 29, and emerges from the facing substrate 32 side.

Figure 7:
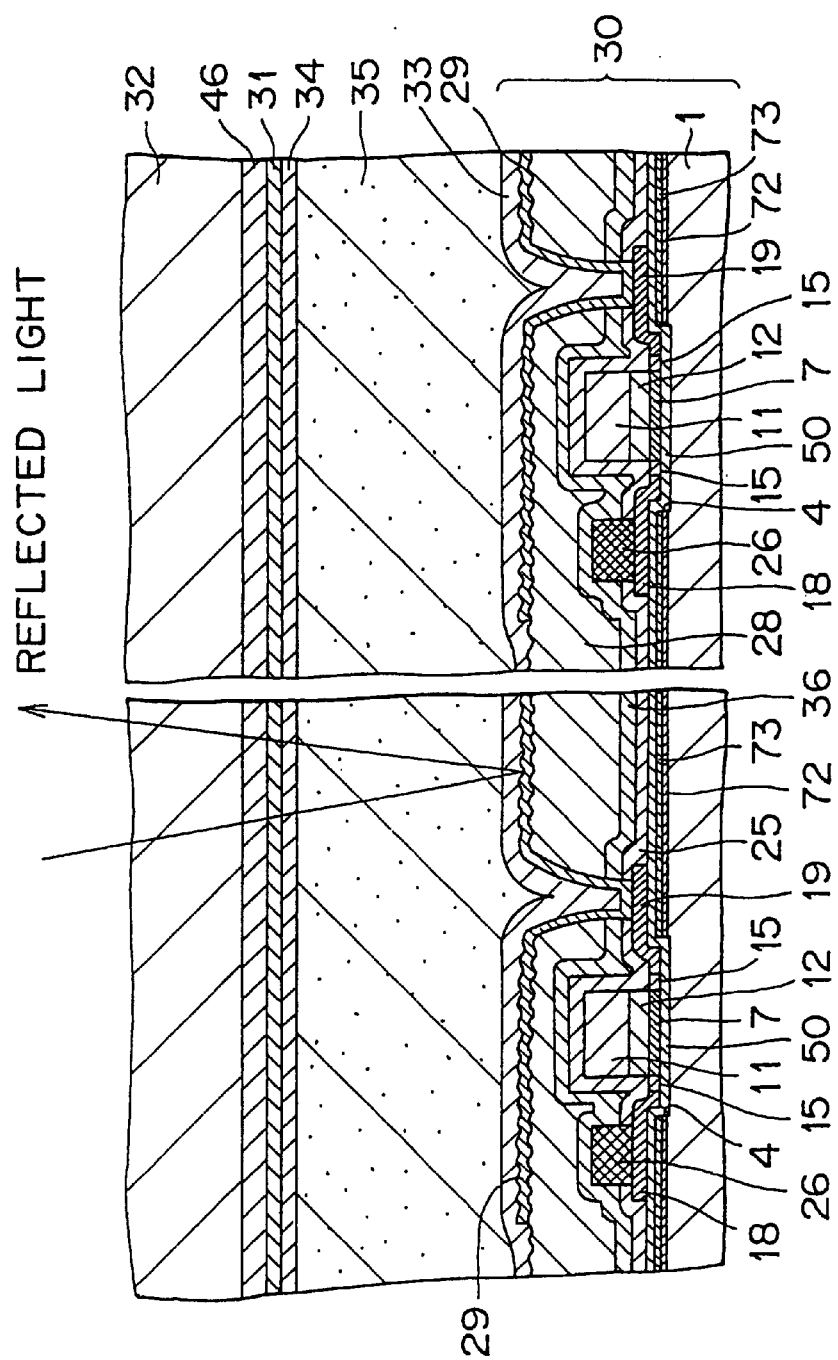
FIG. 7 shows a cross-sectional view of the essential parts of the LCD.

On the other hand, when using an on-chip color filter (OCCF) construction wherein a color filter is provided to the TFT substrate 30 in addition to the above-mentioned substrate construction shown in FIG. 7, an ITO electrode (or ITO electrode with black mask) is attached to the whole of the facing substrate 32.

When the auxiliary capacity CS shown in FIG. 12 is built into the pixel unit, a dielectric layer, not shown, which is provided to the above-mentioned substrate 1 may be connected to the drain region 19 of the monocrystalline silicon.

As described above, the following remarkable features are attendant to this embodiment of the invention.

(a) The crystalline sapphire film 50 is formed in the substrate 1 provided with the step 4 of predetermined shape/dimensions, the monocrystalline silicon thin film 7 having a high electron mobility of not less than 540 $cm^2/v \cdot sec$ is obtained by using this as a seed and carrying out low-temperature heteroepitaxial growth (growth temperature is 200–800° C., and preferably 300–400° C.), and an LCD comprising a high performance driver is thereby obtained. The step 4 contributes to this epitaxial growth so that the monocrystalline silicon layer 7 obtained has a higher crystallinity.

(b) Since this monocrystalline silicon layer shows a higher electron and high hole mobility (of the order of that of the monocrystalline silicon substrate) than a related art amorphous silicon layer and a related art polycrystalline silicon layer, a monocrystalline silicon dual gate MOSTFT can be manufactured in one piece comprising a nMOS, pMOS or cMOSTFT display unit having an LDD structure with high switching characteristic and low leak current, and a peripheral drive circuit unit comprising cMOS, nMOS or pMOSTFT or a combination thereof with high drive performance, so realizing a display panel with high image quality, fine detail, narrow frame edge, wide screen and high efficiency. Since this monocrystalline silicon layer 7 shows a sufficiently high hole mobility, a peripheral drive circuit can be manufactured which drives electrons and holes either as a standalone unit or as a pair of units in combination, and a panel comprising this in a one-piece construction with a display TFT having a nMOS, pMOS or CMOS LDD structure can be manufactured. Moreover, in the case of a small-medium size panel, one of a pair of peripheral vertical drive circuits may be omitted.

(c) In particular, as a dual gate MOSTFT is used for the peripheral drive circuit, a cMOS, nMOS or pMOSTFT having a drive performance 1.5 to 2 times higher than that of a single gate TFT can be formed, giving a TFT of higher performance and driving performance. This is particularly suitable when a TFT of high drive performance is required for a part of the peripheral drive circuit. Moreover, a dual gate structure can easily be modified to a top gate or bottom gate structure by selecting the upper or lower electrode, and there is also an advantage in that either the upper or lower gate may be used alone if one of the gates does not function.

(d) As the heating temperature during the above-mentioned silicon epitaxial growth can be 800° C. or less, the monocrystalline silicon film 7 may be uniformly formed on an insulating substrate at relatively low temperature (for example, 200–600° C. or lower). As substrate, quartz glass, crystallized glass or a ceramic substrate, or borosilicate glass (or a heat-resistant organic substrate) may be used. These substrate materials have a low strain point, are low cost and have good physical properties, moreover they can also be used to manufacture large substrates.

(e) Annealing and excimer laser annealing which require long periods at moderate temperature as in the case of solid phase growth are unnecessary, so productivity is high, and costly production equipment is not required thus permitting cost reductions.

(f) In this heteroepitaxial growth, a wide range of N-type or P-type electrically conducting, high mobility monocrystalline silicon layers can easily be obtained by adjusting conditions such as the crystallinity of the crystalline sapphire film and the gas composition ratio of catalytic CVD, the shape of the step, substrate heating temperature and added N type or P type carrier impurity concentration, so Vth (threshold) adjustment is easy and fast operation is possible due to lower resistance.

(g) If a color filter is incorporated in the upper part of the display array, the aperture of the display panel and brightness are improved, the color filter substrate can be omitted, and cost reductions are possible due to higher productivity.

(h) The aforesaid substance layer such as the crystalline sapphire film forms a barrier to diffusion of atoms, so diffusion of impurities from the glass substrate is suppressed.

Second Embodiment

Figure 15:
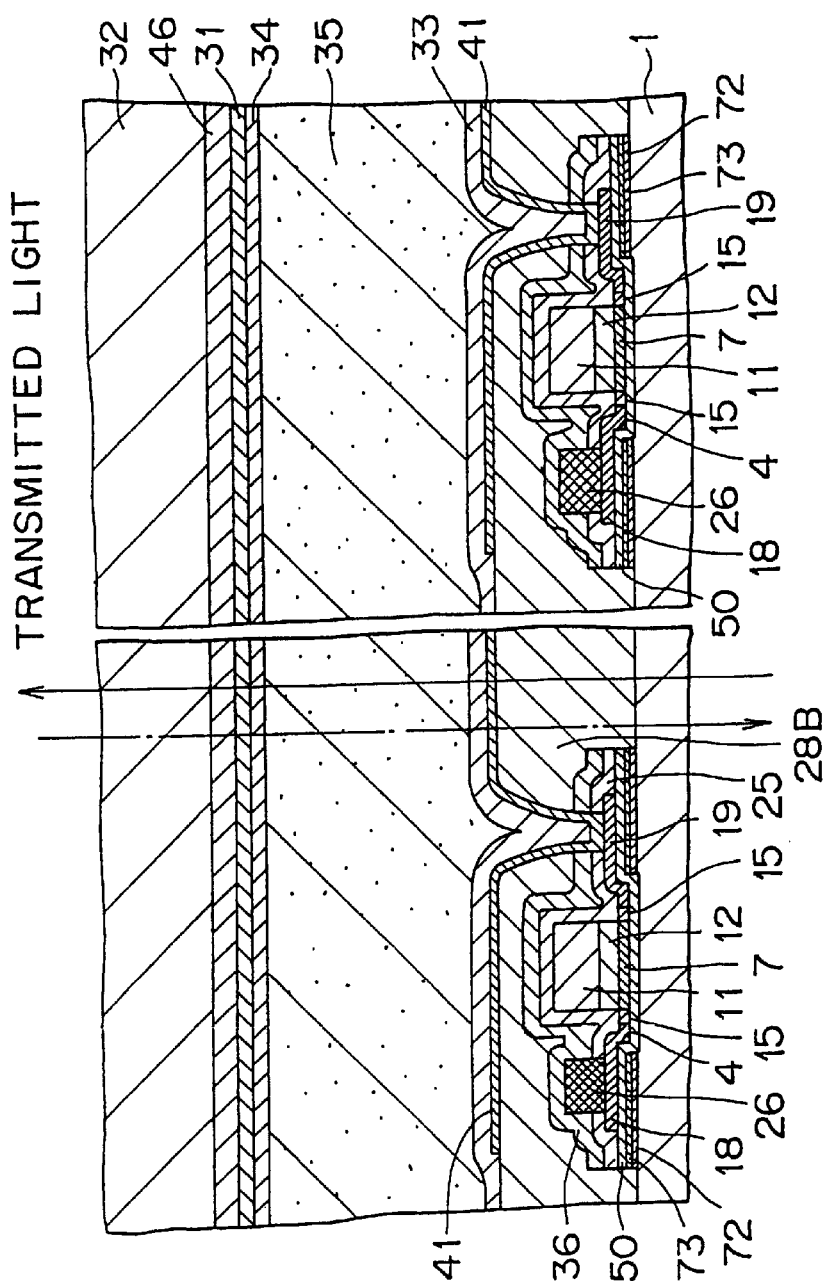
FIG. 15 is a cross-sectional view of essential parts of the LCD.

FIGS. 14–16 show a second embodiment of this invention.

According to this embodiment, the same top gate MOSTFT is provided to the display unit and the same dual gate MOSTFT is provided to the peripheral drive circuit unit as in the aforesaid first embodiment, but unlike the first embodiment, this embodiment concerns a transmitting type LCD. That is, the process is the same from (1) of FIG. 1 to (16) of FIG. 5, but after this process, a display part contact opening for the display TFT is made in the insulating films 25, 36, and unnecessary SiO$_2$, PSG and SIN films are removed from the pixel opening unit to improve transmittance, as shown in (17) of FIG. 14.

Next, as shown in (18) of FIG. 14, a transparent flattening film 28 of 2–3 μm thickness is formed over the whole surface by spin coating etc., then an opening is made in a transparent resin film 28B on the drain side of the display TFT by general-purpose photolithography, and the resulting product is cured under predetermined conditions.

Next, as shown in (19) of FIG. 14, an ITO sputtering film of 130–150 nm thickness is formed on the entire surface, and the ITO transparent electrode 41 in contact with the drain 19 of the display TFT is formed by general-purpose photolithography and etching. The contact resistances of the drain and ITO of the display are lowered and ITO transmittance is improved by heat treatment (forming gas, 200–250° C./1 h).

This is then combined with the facing substrate 32 so as to assemble a transmitting type LCD in the same way as in the aforesaid first embodiment, as shown in FIG. 15. However, a polarizing plate is also stuck onto the TFT substrate side. In this transmitting type LCD, transmitted light is obtained as shown by the solid line, but transmitted light may also be obtained from the facing substrate 32 side as shown by the dot and dash line.

In the case of this transmitting type LCD, an on-chip color filter (OCCF) structure and on-chip black (OCB) structure can be manufactured as follows.

Specifically, the process from (1) of FIG. 1 to (16) of FIG. 5 is based on the above process, following which an opening is made in the drain of the PSG/SiO$_2$ insulation film 25 to form an aluminum embedded layer 41A for a drain electrode, and the SiN/PSG insulation film 36 is formed.

Next, as shown in (18) of FIG. 16, after forming a photoresist 61 wherein pigments of each color R, G and B are dispersed, this photoresist 61 being formed to a predetermined thickness (1–1.5 micrometer), color filter layers 61(R), 61(G) and 61(B) are formed by patterning leaving only predetermined positions (pixel units) by general-purpose photolithography (on-chip color filter construction), as shown in (19) of FIG. 16. At this time, an opening is also made in the drain. It should be noted that an opaque ceramic substrate, or a low transmittance glass or heat resisting resin substrate, cannot be used.

Next, as shown in (19) of FIG. 16, a light exclusion layer 43 which is a black mask layer applied to the color filter layer, is formed in a contact hole connected to the drain of the display TFT by metal patterning. For example, a molybdenum film of 200–250 nm thickness is formed by sputtering, and patterned to a predetermined shape so as to cover the display TFT and exclude light (on-chip black construction).

Next, as shown in (20) of FIG. 16, the flattening film 28B of transparent resin is formed, and the ITO transparent electrode 41 is connected to the light exclusion layer 43 by a throughhole provided in this flattening film.

By incorporating the color filter 61 and black mask 43 on the display array in this manner, the aperture of the LCD panel is improved, and lower power consumption of display modules comprising a back light is achieved.

Third Embodiment

FIG. 17–FIG. 25 shows a third embodiment of this invention.

In this embodiment, a CMOS peripheral drive circuit unit comprising a dual gate pMOSTFT and nMOSTFT is formed as in the first embodiment mentioned above. The display unit is a reflecting type, but various combinations are realized by using TFT of various gate constructions.

Figures 17A, 17B, 17C:
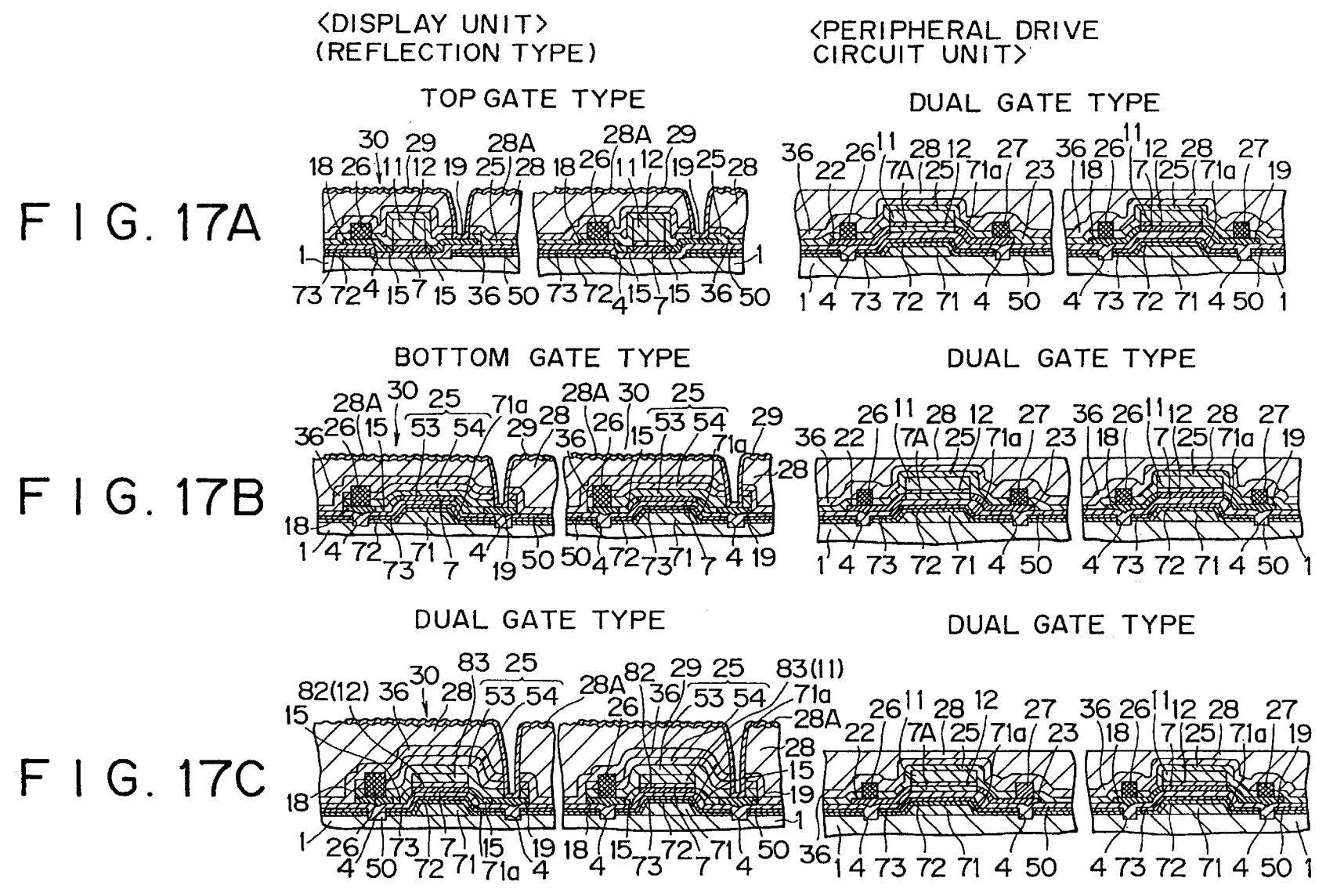

That is, in FIG. 17(A), the same top gate nMOSLDD-TFT is provided to the display unit as in the first embodiment mentioned above, but in the display unit shown in FIG. 17(B), a bottom gate nMOSLDD-TFT is provided, and in the display unit shown in FIG. 17(C), a dual gate nMOSLDD-TFT is provided, respectively.

These bottom gate and dual gate MOSTFT are manufactured by the same process as the dual gate MOSTFT of the peripheral drive circuit unit, as described hereafter.

In particular, in the case of the dual gate type, drive performance is improved by the upper and lower gates which is suitable for fast switching, and it may be operated as a top gate or bottom gate type by using either the upper or lower gates.

In addition, in the bottom gate MOSTFT of FIG. 17(B), 71 is a gate electrode of Mo/Ta or the like, 72 is a SiN film and 73 is a SiO$_2$ film forming a gate insulation film. A channel region using an identical silicon layer two that of the dual gate MOSTFT of the peripheral drive circuit unit, for example, is formed on this gate insulation film. In the dual gate MOSTFT of FIG. 17(C), the lower gate is the same as that of the bottom gate MOSTFT, but in the upper gate, a gate insulation film 82 is formed by a SiO$_2$ film and a SiN film, and an upper gate electrode 83 is formed thereupon. In all of these cases, however, these gates are formed outside the step 4 which acts as a seed for heteroepitaxial growth, promotes formation of the monocrystalline silicon layer, and increases crystallinity.

Next, the method of manufacturing the aforesaid bottom gate MOSTFT will be described referring to FIG. 18–FIG. 22, and the method of manufacturing the aforesaid dual gate MOSTFT will be described referring to FIG. 23–FIG. 25, respectively. As the method of manufacturing the dual gate MOSTFT of the peripheral drive circuit unit is the same as that described in FIG. 1–FIG. 6, it is not shown in the drawing here.

In order to manufacture the bottom gate MOSTFT in the display unit, as shown in (1) of FIG. 18, the sputter film 71 (500–600 nm thickness) of molybdenum/tantalum (Mo/Ta) alloy is first formed on the substrate 1 by the same process as that of (1) of FIG. 1.

Next, as shown in (2) of FIG. 18, the photoresist 70 is formed in a predetermined pattern in the same process as that of (2) of FIG. 1, and taper etching of the Mo/Ta film 71 is performed using this as a mask to form the gate electrode 71 wherein the side end 71a is gently inclined at 20–45 degrees and forms a trapezoidal cross section shape.

Next, as shown in (3) of FIG. 18, in the same process as that of (3) of FIG. 1 and after removal of the photoresist 70, a gate insulation film comprising the SiN film 72 (approximately 100 nm thickness) 72 and SiO$_2$ film (approximately 200 nm thickness) 73 laminated in this order is formed by plasma CVD or the like on the substrate 1 which comprises the molybdenum tantalum alloy film 71.

Next, as shown in (4) of FIG. 19, in the same process as that of (4) of FIG. 2, the photoresist 2 is formed in a predetermined pattern in at least the TFT-forming region, and a plurality of the steps 4 are formed with a suitable shape and suitable dimensions as described hereabove on the gate insulation film on the substrate 1 (and in the substrate 1) using this as a mask. The step 4 serves as a seed together with the crystalline sapphire film 50 during heteroepitaxial growth of monocrystalline silicon, described later, promotes growth of the monocrystalline silicon layer, and has the function of increasing crystallinity. It may have a depth d of 0.3–0.4 $\mu$m, width w of 2–10 $\mu$m, and length (perpendicular direction to the plane of the paper) of 10–20 $\mu$m, and the angle made by the base side and side face (base angle) is a right-angle.

Next, as shown in (5) of FIG. 19 and in the same process as that of (5) of FIG. 2, after removing the photoresist 2, the crystalline sapphire film 50 (20–200 nm thickness) is formed in at least the TFT-forming region comprising the step 4 on a principal surface of the insulating substrate 1 as described hereabove.

Next, as shown in (6) of FIG. 19, in the same process as that of (6) of FIG. 2, heteroepitaxial growth of the monocrystalline silicon is performed by catalytic CVD so as to deposit the monocrystalline silicon layer 7 at a thickness of, for example, 0.1 um. In this case, as the side end 71a of the gate electrode 71 of the-substrate is a gently inclined plane, epitaxial growth is not obstructed by the step 4 on this surface, and the monocrystalline silicon layer 7 grows without discontinuities.

Next, as shown in (7) of FIG. 19, after the processes (7)–(9) of FIG. 2 and in the same process as that of (10) of FIG. 3, the gate of the nMOSTFT of the display unit is covered by the photoresist 13, and the phosphorus ions 14 are doped to the source/drain regions of the exposed nMOSTFT (ion implantation) so as to form the LDD 15 comprising a N- layer in a self-aligning manner. At this time, it is easy to recognize surface height differences (or patterns) due to the bottom gate electrode 71, so positioning (mask alignment) of the photoresist 13 is easy and misalignment does not easily occur.

Figure 20:
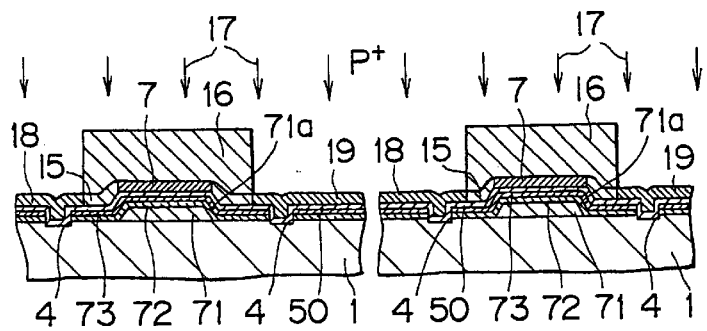
FIGS. 20(8) to 20(11) show a sequence of processes in the manufacture of the LCD.
Figure 20:
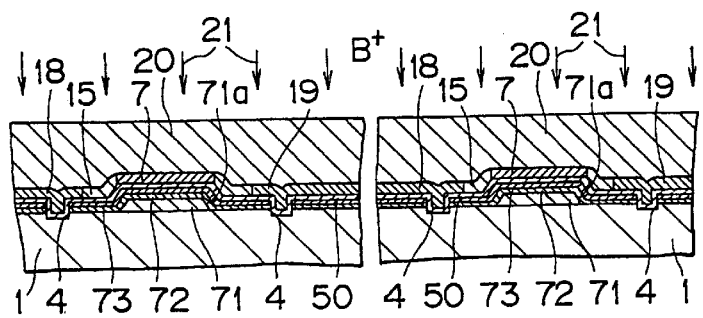
Figure 20:
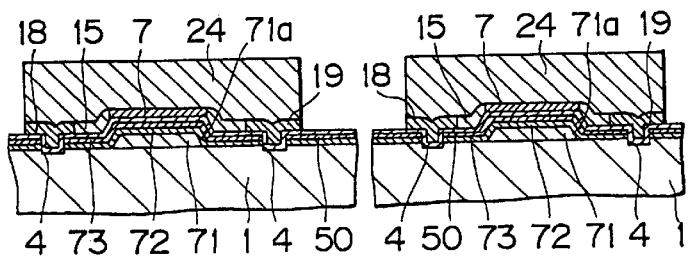
Figure 20:
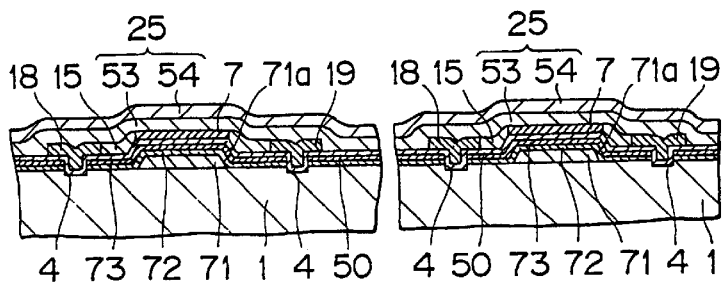

Next, as shown in (8) of FIG. 20, in the same process as that of (11) of FIG. 4, the gate of the nMOSTFT is covered by the photoresist 16, and the exposed regions are doped with the phosphorus or arsenic ions 17 (ion implantation) to form the source 18 and drain 19 comprising the N$^+$ type layer of the nMOSTFT.

Next, as shown in (9) of FIG. 20, in the same process as that of (12) of FIG. 4, all of the nNOSTFT are covered by the photoresist 20, and the boron ions 21 are doped (ion implantation) to form a source and drain of the P$^+$ layer of the pMOSTFT of the peripheral drive circuit unit.

Next, as shown in (10) of FIG. 20, in the same process as that of (13) of FIG. 4, in order to form islands of the active elements and the passive elements, the photoresist 24 is provided and the monocrystalline silicon thin film layer is selectively removed by general-purpose photolithography and etching.

Next, as shown in (11) of FIG. 20, in the same process as that of (14) of FIG. 5, a SiO$_2$ film 53 (approximately 300 nm thickness) and phosphosilicate (PSG) film 54 (approximately 300 nm thickness) are formed in this order on the whole surface by plasma CVD, high density plasma CVD or catalytic CVD. The SiO$_2$ film 53 and PSG film 54 are equivalent to the protective layer 25 mentioned above. Activation treatment of the monocrystalline silicon film is then performed in this state as described above.

Figure 21:
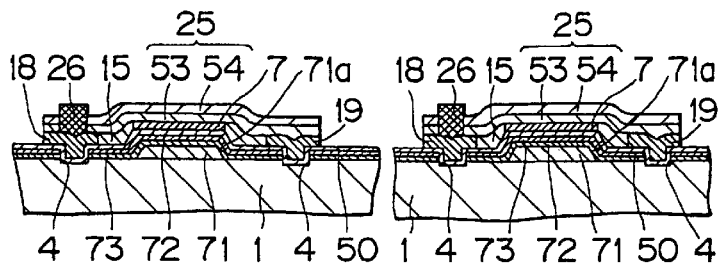
FIGS. 21(12) to 21(15) show a sequence of processes in the manufacture of the LCD.
Figure 21:
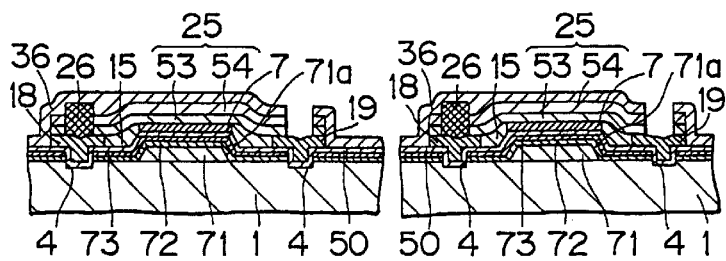
Figure 21:
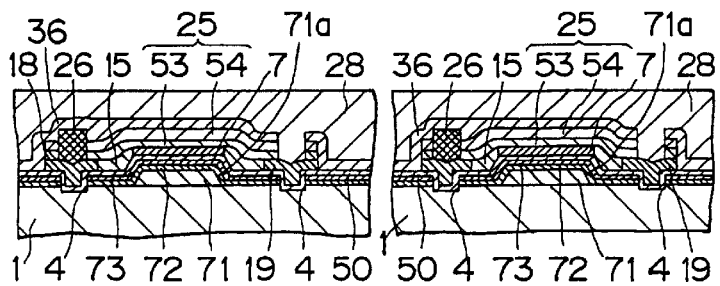
Figure 21:
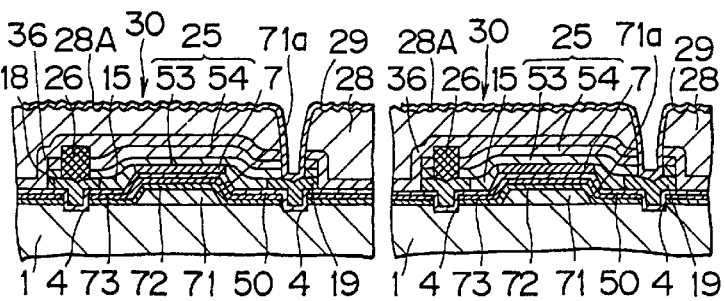

Next, as shown in (12) of FIG. 21, in the same process as that of (15) of FIG. 5, a contact opening is made by general-purpose photolithography and etching. A sputter film of aluminum of 400–500 nm thickness is then formed on the whole surface, and a data line and gate line are formed at the same time as the source electrodes 26 of the TFT by general-purpose photolithography and etching. Subsequently, sinter processing is performed at approximately 400° C./1 h in a forming gas.

Next, as shown in (13) of FIG. 21, in the same process as that of (16) of FIG. 5, the insulating film 36 comprising a PSG film (approximately 300 nm thickness) and a SiN film (approximately 300 nm thickness) is formed on the whole surface by high density plasma CVD, catalytic CVD, etc., and a contact opening is made in the drain of the display TFT.

Next, as shown in (14) of FIG. 21, in the same process as that of (17) of FIG. 6, the photopolymer film 28 of 2–3 um thickness is formed by spin coating or the like, and as shown in (15) of FIG. 21, an unevenly shaped pattern giving optimum reflection characteristics and visual field characteristics is formed at least in the pixel unit by general-purpose photolithography and etching, and reflow is performed to form the lower part of the reflecting surface comprising the uneven rough surface 28A. A contact resin opening is made in the drain of the display TFT at the same time.

Next, as shown in (15) of FIG. 21, in the same process as that of (19) of FIG. 6, a sputter film of aluminum of 400–500 nm thickness is formed on the whole surface, and the reflecting part 29 comprising unevenly shaped aluminum or the like which is connected to the drain 19 of the display TFT is formed by general-purpose photolithography and etching.

In this way, the one-piece active matrix substrate 30 comprising the display unit and peripheral drive circuit unit, comprising a bottom gate nMOSTFT-TFT in the display unit using the monocrystalline silicon layer 7 formed by catalytic CVD with the crystalline sapphire film 50 and the step 4 as a seed for low temperature heteroepitaxial growth (and a CMOS circuit comprising a dual gate pMOSTFT and nMOSTFT in the peripheral drive part), can thereby be manufactured.

Figure 22:
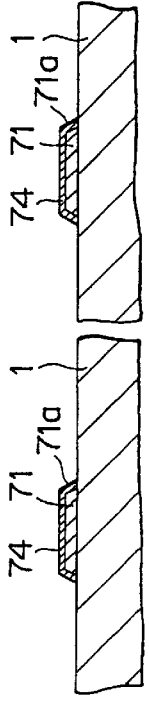
FIGS. 22(3) to 22(5) show a sequence of processes in the manufacture of the LCD.
Figure 22:
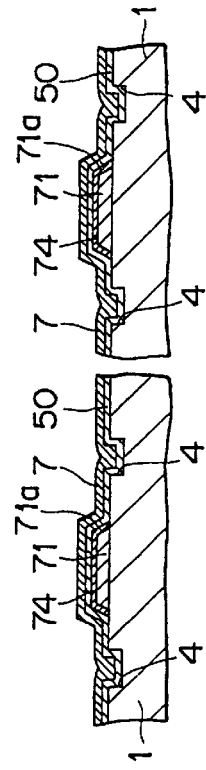
Figure 22:
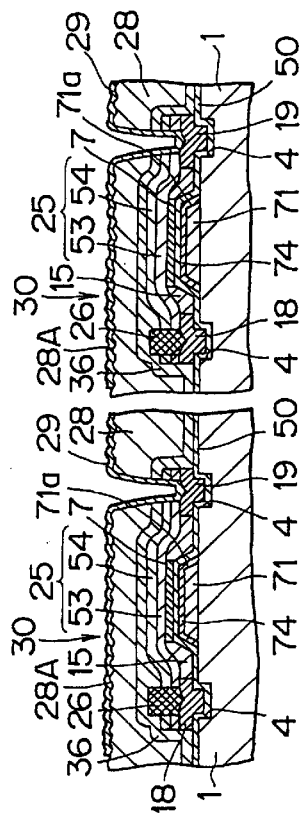

FIG. 22 shows an example wherein the gate insulation film of the aforesaid bottom gate MOSTFT provided to the display unit, is formed by the anodic oxidation of Mo/Ta.

Specifically, after the process of (2) in FIG. 18, as shown in (3) of FIG. 22, a gate insulation film 74 comprising Ta2O5 on its surface is formed to a thickness of 100–200 nm by anodic oxidation of the molybdenum/tantalum alloy film 71 according to the art.

In the following process, as shown in (4) of FIG. 22 and in the same way as (4)–(6) of FIG. 19, after forming the step 4 and the crystalline sapphire film 50, and performing heteroepitaxial growth of the monocrystalline silicon layer 7 by catalytic CVD, the active matrix substrate 30 is manufactured as shown in (5) of FIG. 22 in the same way as in the processes of FIG. 19(7)–FIG. 21(15).

Next, to manufacture the dual gate MOSTFT in the display unit, the processes of FIG. 18(1)–FIG. 19(6) are performed in the same way as described hereabove.

Next, as shown in (7) of FIG. 23, the step 4 is formed in the insulation films 72, 73 and substrate 1, and the monocrystalline silicon layer 7 is grown heteroepitaxially using the crystalline sapphire layer 50 and step 4 as a seed. Next, in the same process as that of (8) of FIG. 3, a $SiO_2$ film (approximately 200 nm thickness) and SiN film (approximately 100 nm thickness) are continuously formed in this order on the whole surface of the monocrystalline silicon layer 7 by plasma CVD, high density plasma CVD or catalytic CVD, so as to form a gate insulation film 80 (this corresponds to the aforesaid insulation film 8), and a sputter film 81 (500–600 nm thickness) of a molybdenum tantalum (Mo/Ta) alloy (this corresponds to the aforesaid sputter film 9) is then formed.

Next, as shown on (8) of FIG. 23, in the same process as that of (9) of FIG. 3, the photoresist 10 is formed, a top gate electrode 82 (this corresponds to the aforementioned gate electrode 12) of Mo/Ta alloy and a gate insulation film 83 (this corresponds to the aforementioned gate insulator 11) are formed by continuous etching, and the monocrystalline silicon thin film 7 is exposed.

Next, as shown in (9) of FIG. 23, in the same process as that of (10) of FIG. 3, the top gate of the nMOSTFT is covered by the photoresist 13, and the exposed source/drain regions of the display nMOSTFT are doped with the phosphorus ions 14 (ion implantation) to form the N-type LDD 15.

Next, as shown in (10) of FIG. 23, in the same process as that of (11) of FIG. 4, the gate and LDD of the nMOSTFT is covered by the photoresist 16, and the exposed regions are doped with the phosphorus or arsenic ions 17 (ion implantation) to form the source 18 and drain 19 comprising the $N^+$ type layer of the nMOSTFT.

Figure 24:
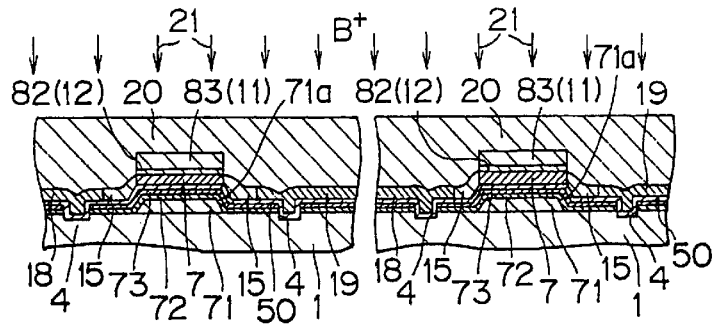
FIGS. 24(11) to 24(14) show a sequence of processes in the manufacture of the LCD.
Figure 24:
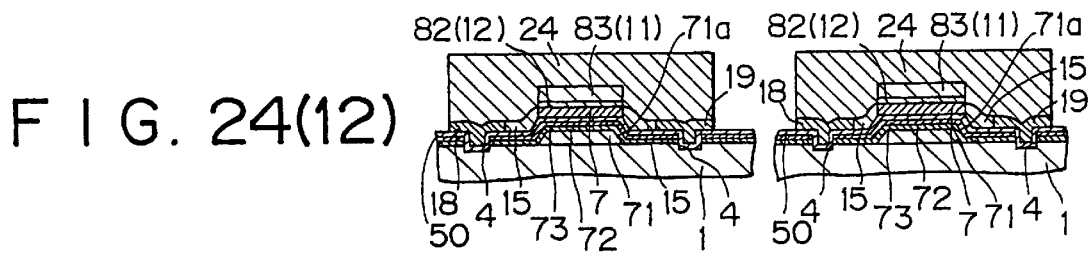
Figure 24:
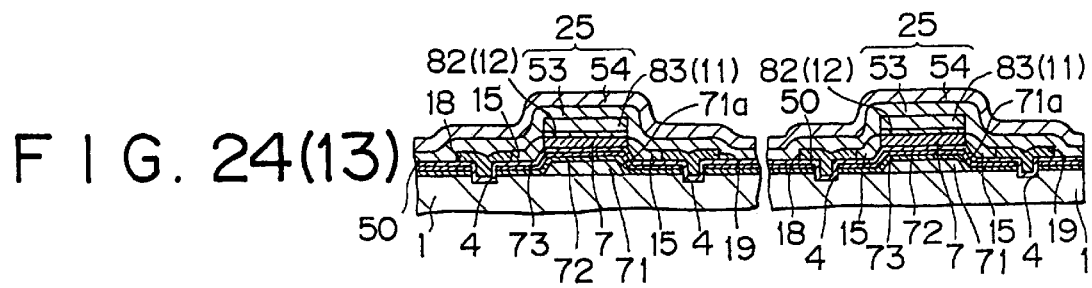
Figure 24:
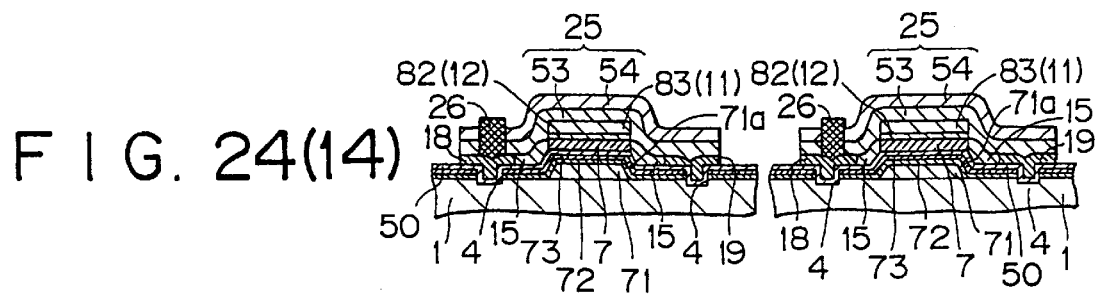

Next, as shown in (11) of FIG. 24, in the same process as that of (12) of FIG. 4, the gate of the pMOSTFT is covered by the photoresist 20, and the exposed regions are doped by the boron ions 21 (ion implantation) to form a source and drain of the $P^+$ layer of the pMOSTFT of the peripheral drive circuit unit.

Next, as shown in (12) of FIG. 24, in the same process as that of (13) of FIG. 4, in order to form islands of the active elements and the passive elements, the photoresist 24 is provided and the monocrystalline silicon thin film layer excepting for the active elements and passive elements is selectively removed by general-purpose photolithography and etching.

Next, as shown in (13) of FIG. 24, in the same process as that of (14) of FIG. 5, the $SiO_2$ film 53 (approximately 200 nm thickness) and phosphosilicate glass (PSG) film 54 (approximately 300 nm thickness) are formed on the whole surface by plasma CVD, high density plasma CVD or catalytic CVD. These films 53, 54 correspond to the aforesaid protection film 25. Activation treatment of the monocrystalline silicon layer 7 is then performed.

Next, as shown in (14) of FIG. 24, in the same process as that of (15) of FIG. 5, a contact opening is made in the source. A sputter film, e.g. of aluminum of 400–500 nm thickness, is then formed on all surfaces, and a data line and gate line are formed at the same time as the source electrode 26 is formed by general-purpose photo lithography and etching.

Next, as shown in (15) of FIG. 25, in the same process as that of (16) of FIG. 5, the insulation film 36 which comprises a PSG film (approximately 300 nm thickness) and a SiN film (approximately 300 nm thickness) is formed over the whole surface, and a contact opening is made in the drain of the display TFT.

Next, as shown in (16) of FIG. 25, the photosensitive resin film 28 of 2–3 μm thickness is formed over the whole surface by spin coating etc., then as shown in (17) of FIG. 25 and in the same process as that of (18), 19) of FIG. 6, the lower part of a reflecting surface comprising the uneven rough surface 28A is formed at least in the pixel unit, a contact resin opening is made in the drain of the display TFT at the same time, and the unevenly shaped reflecting part 29 of aluminum or the like for obtaining optimum reflection characteristics and visual field angle characteristics, and connected to the drain of the display TFT, is formed.

In this way, the one-piece active matrix substrate 30 comprising the display unit-peripheral drive circuit unit incorporating a dual gate nMOSLDD-TFT in the display unit and a CMOS drive circuit comprising a dual gate pMOSTFT and nMOSTFT in the peripheral drive circuit unit, is manufactured using the monocrystalline silicon layer 7 formed with the crystalline sapphire film 50 and step 4 as a seed, by catalytic CVD.

Fourth Embodiment

FIGS. 26–31 show a fourth embodiment of this invention.

In this embodiment, unlike the aforesaid embodiment, the gate electrode of the top gate is formed of a material of relatively low heat resistance such as aluminum or the like.

First, when the top gate MOSTFT is provided to the display unit and the dual gate MOSTFT is provided to the peripheral drive circuit unit, the processes of FIG. 1(1)–FIG. 2(7) are performed as in the aforesaid first embodiment, and a N type well 7A is formed in the pMOSTFT of the peripheral drive circuit unit as shown in (7) of FIG. 26.

Next, as shown in (8) of FIG. 26, all the nMOS and pMOSTFT of the peripheral drive region and the gates of the nMOSTFT of the display region are covered by the photoresist 13, and the exposed source/drain regions of the nMOSTFT are doped with the phosphorus ions 14, for example, at a dosage of 5×1013 atoms/cm$^2$ at 20 kV (ion implantation), to form the LDD 15 comprising a N-type layer by self-alignment.

Next, as shown in (9) of FIG. 27, all the pMOSTFT of the peripheral drive region, the gate of the nNOSTFT of the peripheral drive region and the gate and LDD of the nMOSTFT of the display region are covered by the photoresist 16, and the exposed regions are doped with the phosphorus or arsenic ions 17, for example at a dosage of 5×1015 atoms/cm$^2$ at 20 kV (ion implantation), to form the source 18, drain 19 and LDD 15 comprising the N$^+$ type layer of the nMOSTFT. In this case, if the resist 13 is allowed to remain as shown by the imaginary line, and the resist 16 is provided to cover this, the resist 13 can be used as a guide to position the mask when the resist 16 is formed so that mask alignment is easier, and misalignments are reduced.

Next, as shown in (10) of FIG. 27, all the nMOSTFT of the peripheral drive region and nMOSTFT of the display region, and the gate of the pMOSTFT, are covered by the photoresist 20, and the exposed regions are doped with the boron ions 21, for example at a dosage of 5×1015 atoms/cm$^2$ at 10 kV (ion implantation), to form the source 22 and drain 23 of the P$^+$ layer of the pMOSTFT.

Next, after removing the resist 20, as shown in (11) of FIG. 27, activation treatment of the monocrystalline silicon layer 7, 7A is performed as described hereabove, and the gate insulation film 12 and gate electrode material 11 (aluminum or aluminum with 1% Si) are formed on the surface. The gate electrode material layer 11 can be formed by vacuum deposition or sputtering.

Figure 28:
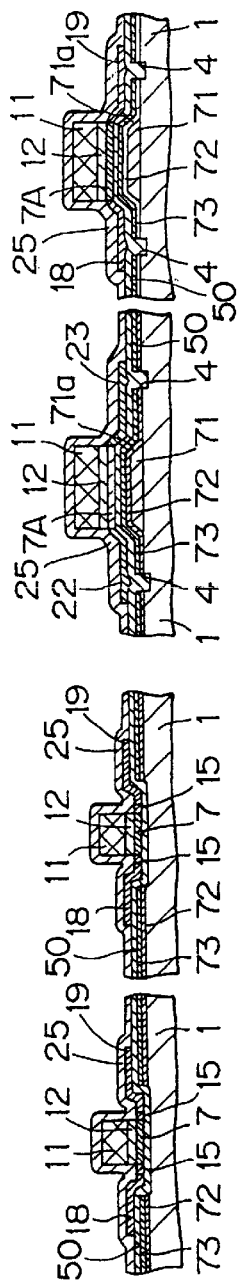
FIGS. 28(12) and 28(13) show a sequence of processes in the manufacture of the LCD.
Figure 28:
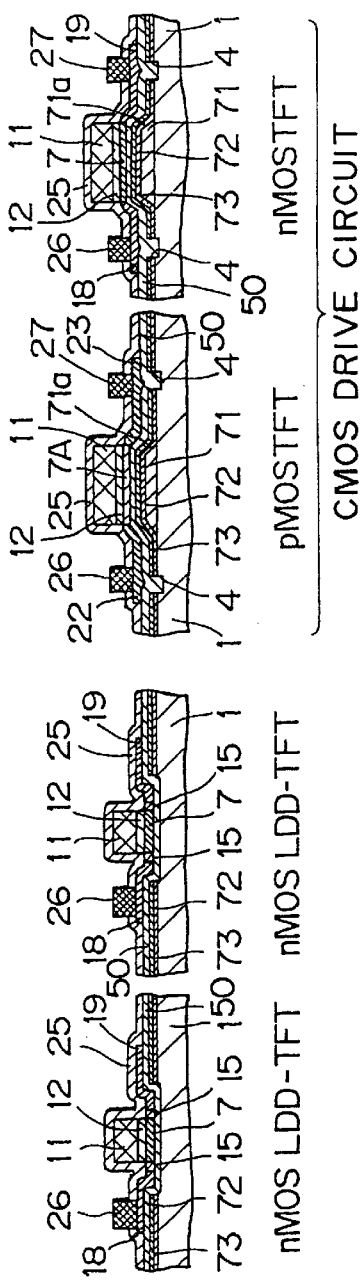

Next, as described above, after patterning the gates, and forming islands of the active elements and passive elements, a SiO$_2$ film (approximately 200 nm thickness) and phosphosilicate (PSG) film (approximately 300 nm thickness) are continuously formed in this order on the whole surface to form the protective film 25 as shown in (12) of FIG. 28.

Next, as shown in (13) of FIG. 28, contact openings are made in the source/drains of all the TFT in the peripheral drive circuit and the sources of the display TFT by general-purpose photolithography and etching.

A sputter film of aluminum or aluminum alloy such as aluminum with 1% Si or aluminum of thickness 500–600 nm is then formed over the whole surface, the source electrodes 26 of all the TFT in the peripheral drive circuit unit and the display unit, and the drain electrodes 27 of the peripheral drive circuit unit, are formed by general-purpose photolithography and etching, and a data line and gate line are formed at the same time. Subsequently, sinter processing is performed in a forming gas (N2+H2) at approximately 400° C./1 h.

In this way, the one-piece active matrix substrate 30 comprising the display unit-peripheral drive circuit unit incorporating a nMOSLDD-TFT having aluminum or aluminum with 1% Si as gate electrode, and a CMOS drive circuit comprising a dual gate pMOSTFT and nMOSTFT, respectively formed in the display unit and peripheral drive circuit unit using the monocrystalline silicon layer 7 in the same manner as in FIG. 5(16)–FIG. 6(19), can be manufactured.

In this embodiment, the gate electrode 11 of aluminum or aluminum with 1% Si is formed after activation treatment of the monocrystalline silicon layer 7, so the effect of the heat of this activation processing is unrelated to the heat resistance of the gate electrode material. Therefore low cost aluminum or aluminum with 1% Si, which have a relatively low heat resistance, may also be used as the top gate electrode material, and the choice of electrode materials is wider. This is the same as the case when the display unit is a bottom gate MOSTFT.

Figure 29:
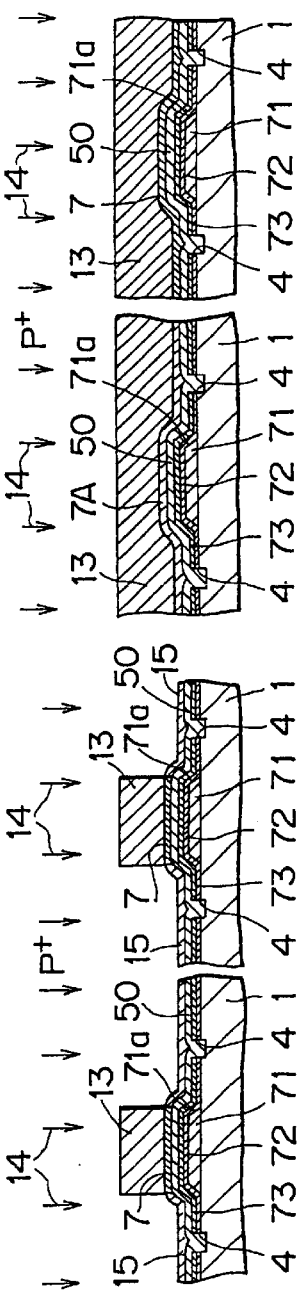
FIGS. 29(6) and 29(7) show a sequence of processes in the manufacture of the LCD.

Next, when a dual gate MOSTFT is provided to the display unit and a dual gate MOSTFT is provided to the peripheral drive circuit unit, the processes of FIG. 18(1)–FIG. 19(6) are performed as in the aforesaid third embodiment, and the N type well 7A is formed in the pMOSTFT part of the peripheral drive circuit unit as shown in (6) of FIG. 29.

Next, as shown in (7) of FIG. 29, in the same way as that of (8) of FIG. 26, the TFT part of the display unit is doped with the phosphorus ions 14 to form the LDD 15.

Next, as shown in (8) of FIG. 30, in the same way as that of (9) of FIG. 27, the nMOSTFT part of the display unit and peripheral drive circuit unit are doped with the phosphorus ions 17 to respectively form the N$^+$ type source region 18 and drain region 19.

Next, as shown in (9) of FIG. 30, in the same way as (10) of FIG. 27, the pMOSTFT part of the peripheral drive circuit unit is doped with the boron ions 21 to respectively form the P$^+$ type source region 22 and drain region 23.

Figure 31:
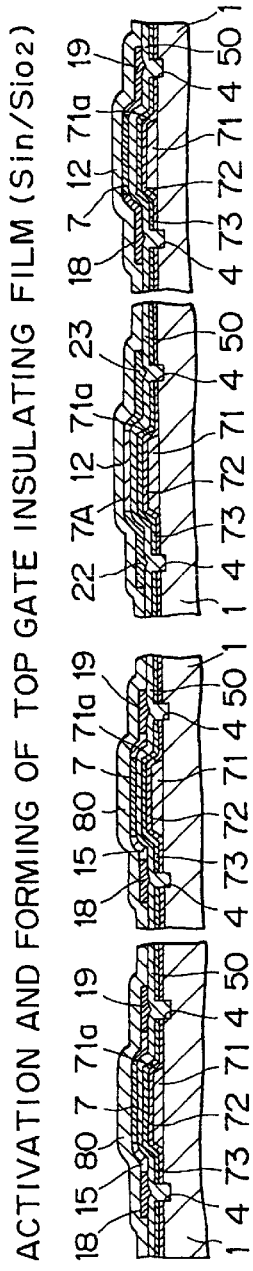
FIGS. 31(11) to 31(13) shows a sequence of processes in the manufacture of the LCD.
Figure 31:
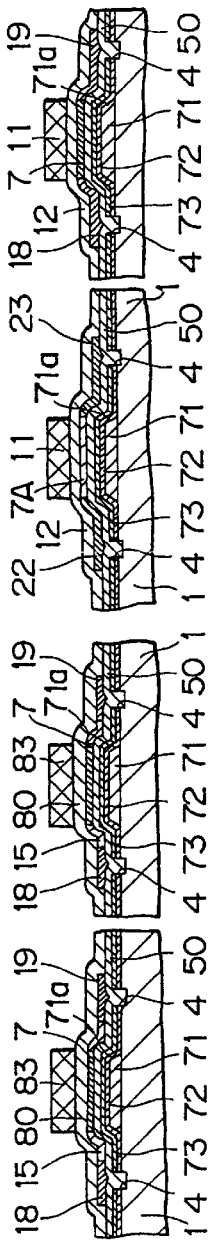
Figure 31:
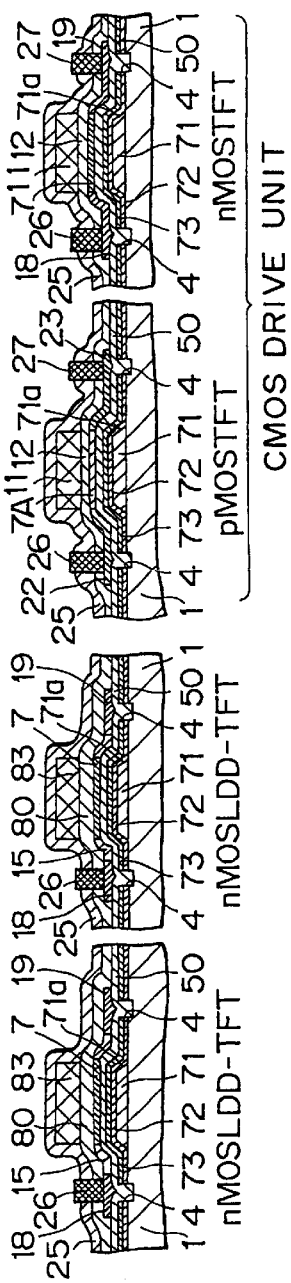

Next, after removing the resist 20, and after patterning the monocrystalline silicon layer 7 to form islands of the active elements and passive elements as shown in (10) of FIG. 30, activation treatment of the monocrystalline silicon layer 7, 7A is performed as described hereabove, then the gate insulation film 80 is formed on the surface in the display unit and the gate electrode film 12 is formed on the surface in the peripheral drive circuit unit as shown in (11) of FIG. 31.

Next, as shown in (12) of FIG. 31, an aluminum film formed by sputtering over the whole surface is patterned, and upper gate electrodes 83 of the display unit and upper gate electrodes 11 of the peripheral drive circuit unit are formed.

Next, as shown in (13) of FIG. 31, a SiO$_2$ film (approximately 200 nm thickness) and phosphosilicate (PSG) film (approximately 300 nm thickness) are continuously formed in this order on the whole surface to form the protective film 25.

Next, the source electrodes 26 of all the TFT in the peripheral drive circuit unit and display unit and the drain electrodes 27 of the peripheral drive circuit unit are formed, and the one-piece active matrix substrate 30 comprising the display unit and peripheral drive circuit unit, wherein a CMOS circuit formed by a dual gate nMOSLDD-TFT, and dual gate pMOSTFT and nMOSTFT, comprising aluminum or the like as gate electrode, is integrated respectively in the display unit and peripheral drive circuit unit using this monocrystalline silicon layer 7, is thereby manufactured.

In this embodiment also, the gate electrodes 11, 83 of aluminum or the like are formed after activation treatment of the monocrystalline silicon layer 7, so the effect of the heat of this activation treatment is unrelated to the heat resistance of the gate electrode material. Therefore low cost aluminum or the like which has a relatively low heat resistance, may also be used as the top gate electrode material, and the choice of electrode materials is wider. The source electrode 26 (and the drain electrode) can be formed simultaneously in the process of (12) of FIG. 31, which is an advantage in manufacture.

Figure 32A:
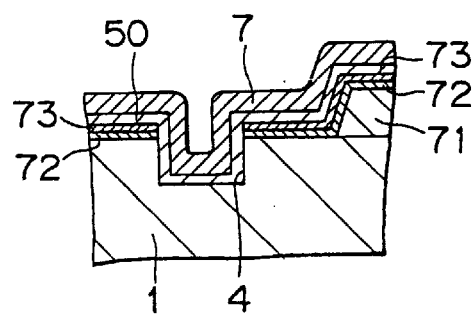
FIGS. 32A to 32C show a sequence of processes in the manufacture of the LCD.
Figure 32B:
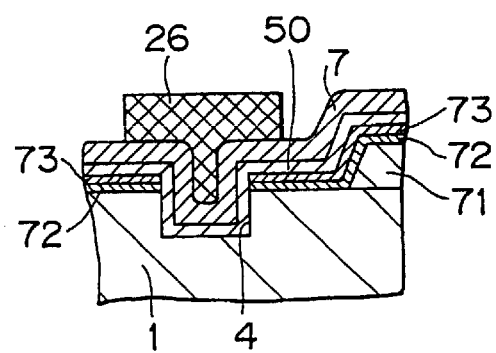
Figure 32C:
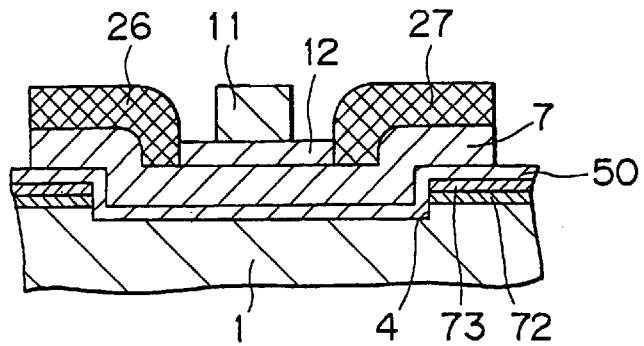

In all the embodiments described above, when for example the bottom gate, top gate or dual-gate type MOSTFT is manufactured, and the step 4 is provided, the monocrystalline silicon layer 7 which grows on it is thin, as shown schematically in FIG. 32(A). This may give rise to discontinuities, so to ensure connection with the source electrode 26 (or drain electrode), it is preferable to make this electrode adhere on the region comprising this step as shown in FIG. 32(B), (C).

In the process of (8) of FIG. 26 or the process of (7) of FIG. 29, after the top gate insulation film is formed on the monocrystalline silicon layer 7, ion implantation and activation treatment are performed, and the top gate electrode, and source and drain electrodes, may then be formed simultaneously.

Figure 33A:
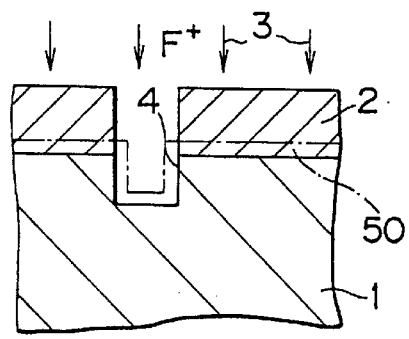
FIGS. 33A to 33E show a sequence of processes in the manufacture of the LCD.
Figure 33B:
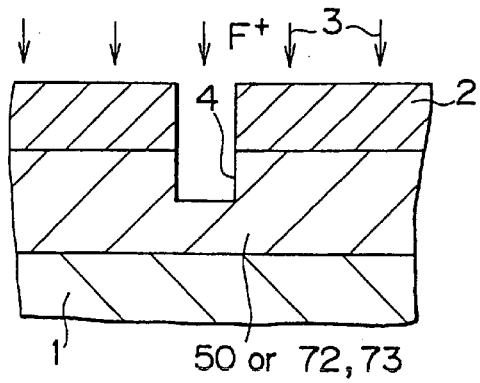
Figure 33C:
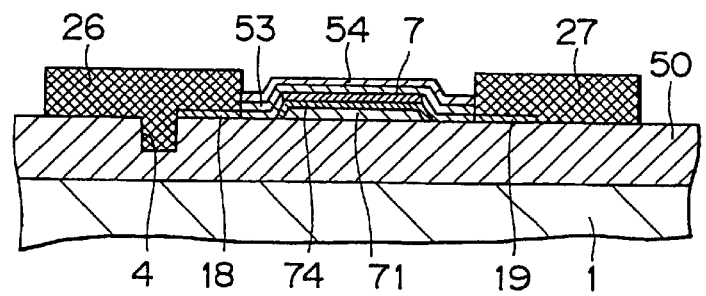
Figure 33D:
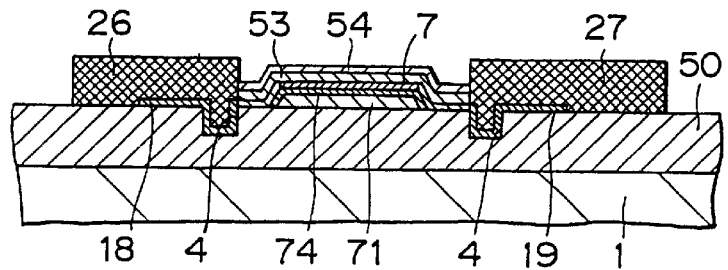
Figure 33E:
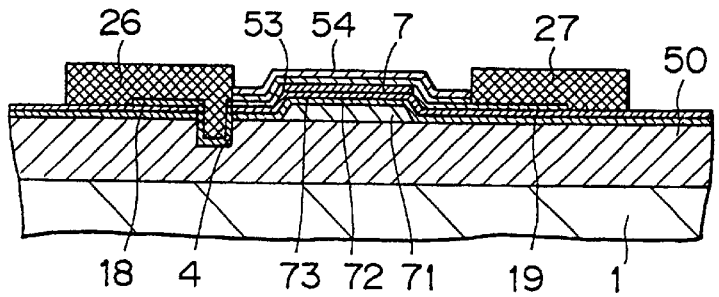
Figure 34A:
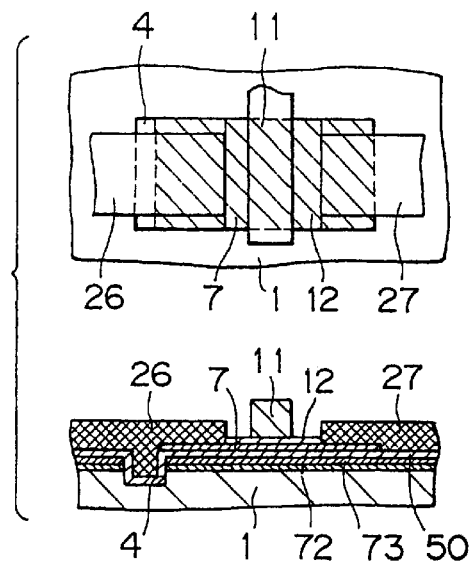
FIGS. 34A to 34E are plan views and cross-sectional views of various TFT of an LCD according to a fifth embodiment of this invention.
Figure 34B:
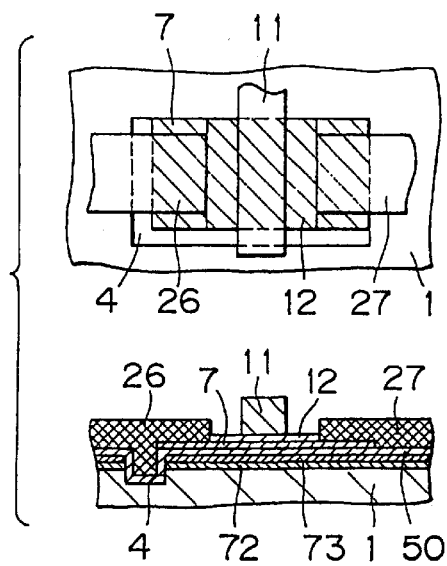
Figure 34C:
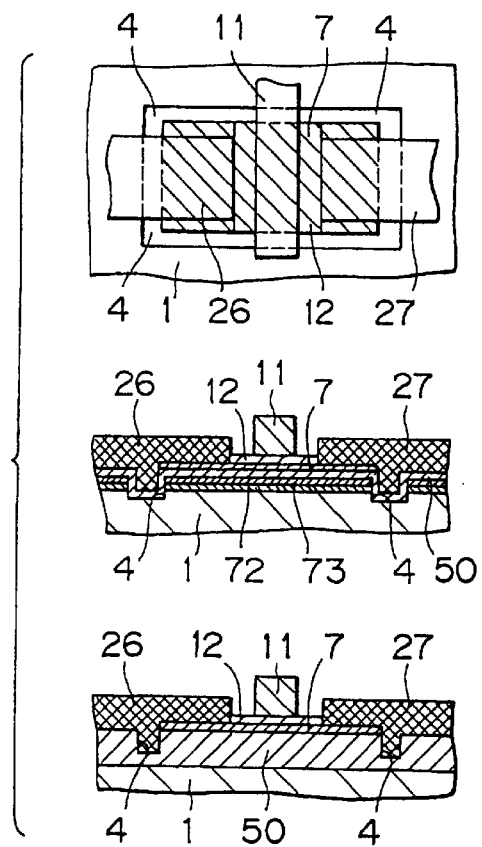
Figure 34D:
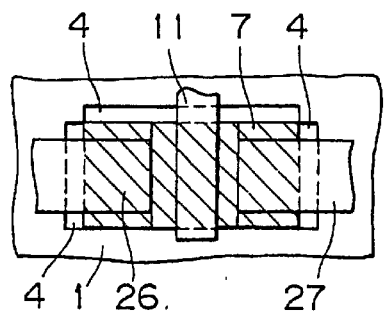
Figure 34E:
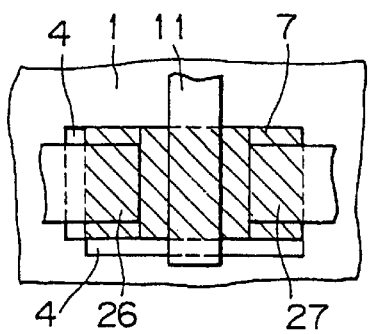

Although in the aforesaid example the step 4 was formed on the substrate 1 (and also in the SiN film thereon) as shown in FIG. 33(A), it can also be formed in the crystalline sapphire film 50 (this has the function of stopping diffusion of ions from the glass substrate 1) as shown for example in FIG. 33 (B). Further, instead of forming the step 4 in this crystalline sapphire film 50, the aforesaid gate insulation films 72, 73 may be provided under this crystalline sapphire film, and the step 4 formed therein. Examples where the step 4 is provided to the crystalline sapphire film 50 are shown respectively in FIG. 33(C), (D), (E).

Fifth Embodiment

FIGS. 34–36 show a fifth embodiment of this invention.

In this embodiment, examples are shown where TFT are formed outside the aforesaid step 4 (i.e., on the substrate 1 outside the step). The monocrystalline silicon layer 7 and gate/source/drain electrodes 26, 27 are shown schematically.

First, FIG. 34 shows a top gate TFT. In (a), the depression 4 due to the step is formed in the source region along one side of the source, and the gate insulation film 12 and gate electrode 11 are formed on the monocrystalline silicon layer 7 on a flat substrate surface other than this depression. Likewise, (b) shows an example where the depression 4 is formed not only in the source region, but also in a L-shaped pattern along two sides to the end of the drain region in the channel longitudinal direction.

(c) shows an example where the same depression 4 is formed in a rectangular shape along four sides so as to enclose the TFT active region.

(d) is an example of forming the same depression 4 along three sides, and (e) is an example of forming the same depression 4 in an L-shaped pattern along two sides. In all cases, adjacent depressions 4—4 are not continuous.

Hence, as the depression 4 of various patterns can be formed, and the TFT is provided on a flat surface other than the depression 4, manufacture of the TFT is easy.

FIG. 35 shows the case of a bottom gate MOSTFT, and the step (depression) 4 of various patterns shown in FIG. 34 may be formed in the same way. FIG. 35(a) is an example corresponding to FIG. 34(a), wherein the bottom gate MOSTFT is formed on a flat surface other than the depression 4 due to the step. Likewise, FIG. 35(b) shows an example corresponding to FIG. 34(b), and FIG. 35(c) shows an example corresponding to FIG. 34(c) or (d).

Figure 35A:
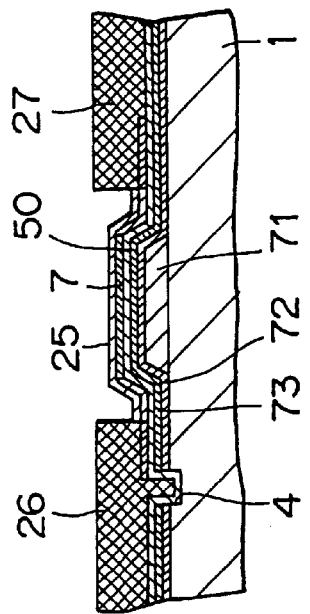
FIGS. 35A to 35D are schematic views showing various TFT in the manufacture of the LCD.
Figure 35B:
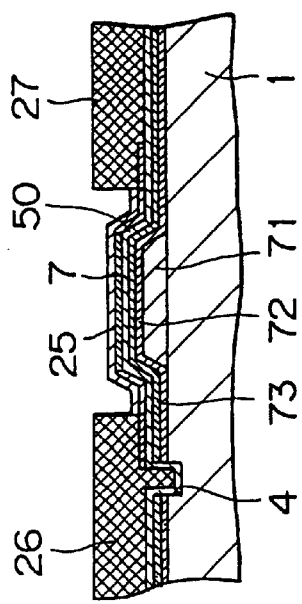
Figure 35C:
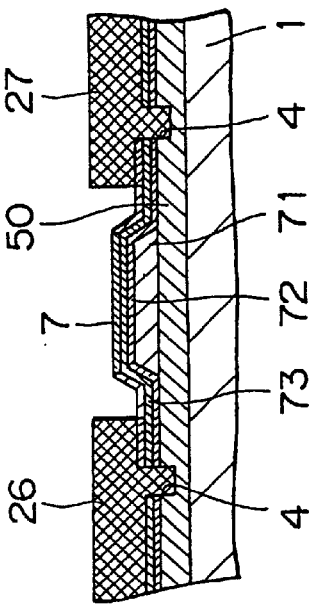
Figure 35D:
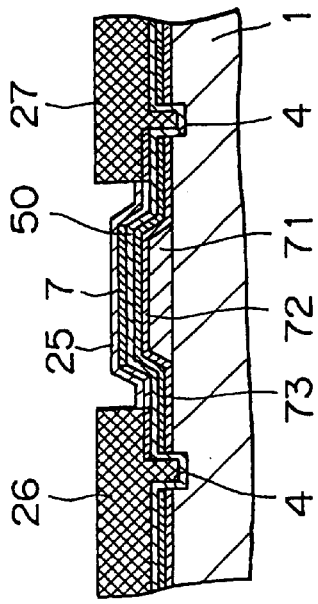

FIG. 35(d) is a case where the step 4 is provided to the crystalline sapphire film 50.

FIG. 36 shows the case of a dual-gate type MOSTFT. In this case, the various types of step (depression) shown in FIG. 34 may be formed in the same way, for example a dual gate MOSTFT may be formed on the flat surface of the inner region of the step 4 shown in FIG. 34(c).

Sixth Embodiment

FIG. 37–FIG. 39 show a sixth embodiment of this invention.

The example of FIG. 37 is a device concerning a double gate MOSTFT wherein plural TFT having a self-aligning LDD structure, for instance, a top gate LDD-TFT, are interconnected.

According to this, the gate electrode 11 is divided into two, one being used for a first LDD-TFT as a first gate and the other being used for a second LDD-TFT as a second gate (however, a $N^+$ type region 100 is provided between the gate electrodes in the middle of the monocrystalline silicon layer to obtain lower resistance). In this case, a different voltage may be applied to each gate, and even if one of the gates no longer functions for some reason, the carrier can be moved between source and drain by using the remaining gate. A device of high reliability can therefore be provided. Moreover, as the thin film transistor which drives each pixel is formed by connecting the first LDD-TFT and second LDD-TFT in series, the voltage applied between the source and drain of each thin film transistor can be largely decreased when the device is OFF.

Therefore, the leak current which flows on when it is OFF can be reduced, and the contrast and picture quality of the liquid crystal display can be improved. Moreover, as the aforesaid two LDD transistors are connected by using only the same semiconductor layer as the low concentration drain region in the aforesaid LDD transistor, the connection distance between transistors can be reduced, and the required surface area is prevented from increasing even if two LDD transistors are connected. It is also possible to completely separate the aforesaid first and second gates, and operate them independently.

FIG. 38 shows an example of a device (A) wherein a bottom gate MOSTFT has a double gate structure, and a device (B) wherein a dual gate MOSTFT has a double gate structure.

Although these double gate MOSTFT have the same advantages as the aforesaid top gate type, the dual gate type has the further advantage that if one of the upper and lower gates no longer functions, the other gate can be used.

FIG. 39 shows equivalent circuits to the aforesaid double gate type MOSTFT. It may be noted that in the above, the gates were branched into two, but they may be branched or divided into three or more. These double gate or multi-gate structures may comprise gate electrodes of identical potential which branch into two or more parts in the channel region, or divided gate electrodes which have different or identical potentials.

Seventh Embodiment

FIG. 40 is a device showing a seventh embodiment of this invention, wherein, in a TFT having a dual gate structure of nMOSTFT, either the upper and lower gate is operated as a transistor, and the other gate is operated as follows.

Specifically, FIG. 40(A) is a device wherein in a nMOSTFT, an arbitrary, negative voltage is constantly applied to the gate electrode on the top gate side to decrease the leak current of the back channel. When the top gate electrode is opened, the device may be used as a bottom gate type. FIG. 40(B) is a device wherein an arbitrary, negative voltage is constantly applied to the gate electrode on the bottom gate side to decrease the leak current of the back channel. In this case too, if the bottom gate electrode is opened, the device may be used as a top gate type. In the case of a pMOSTFT, the leak current of the back channel can be decreased if an arbitrary positive voltage is constantly applied to the gate electrode.

In both cases, the crystallinity of the interface between the monocrystalline silicon layer 7 and the insulation film is poor and leak current tends to flow, but by applying the aforesaid negative electrode voltage, the leak current can be blocked.

This is an advantage in addition to the advantages of the LDD structure. Further, leak current may flow from the glass substrate side due to the incident light, but as light is blocked by the bottom gate electrode, the leak current can be decreased.

Eighth Embodiment

FIGS. 1–13 show an eighth embodiment of this invention.

This embodiment relates to an active matrix reflection type liquid crystal display device (LCD) comprising a top gate MOSTFT in the display unit, and a dual gate MOSTFT in the peripheral drive circuit unit using a monocrystalline silicon layer formed by heteroepitaxial growth, but wherein instead of the step mentioned above, a substance layer (for example, a crystalline sapphire film) as mentioned above is formed on the flat surface of the substrate, and heteroepitaxial growth of the monocrystalline silicon layer is performed by catalytic CVD using this substance layer as a seed.

Next, the active matrix reflection type LCD according to this embodiment will be described insofar as concerns its manufacturing process referring to FIG. 1–FIG. 10.

In FIG. 41–FIG. 46, the left-hand side shows the manufacturing process of the display unit, and the right-hand side shows the manufacturing process of the peripheral drive circuit unit.

First, as shown in (1) of FIG. 41, the sputter film 71 (500–600 nm thickness) of molybdenum/tantalum (Mo/Ta) alloy is formed on one of the principal surfaces of the insulating substrate 1 which may be of borosilicate glass, quartz glass or transparent crystallized glass.

Next, as shown in (2) of FIG. 41, the photoresist 70 is formed in a predetermined pattern, taper etching of the Mo/Ta film 71 is performed using this as a mask, and the gate electrode 71 is thereby formed comprising a trapezoidal cross section shape formed by the side end 71a which is gently sloping at 20–45 degrees.

Next, as shown in (3) of FIG. 41, after removal of the photoresist 70, the gate insulation film comprising the SiN film 72 (approximately 100 nm thickness) 72 and $SiO_2$ film (approximately 200 nm thickness) 73 are laminated in this order by plasma CVD or the like on the substrate 1 which comprises the molybdenum tantalum alloy film 71.

Next, as shown in (4) of FIG. 42, the crystalline sapphire film 50 (20–200 nm thickness) is formed in at least the TFT-forming region on a principal surface of the insulating substrate 1. This crystalline sapphire film 50 is formed by oxidation of trimethylaluminum gas or the like with an oxidizing gas (oxygen and water vapor) by high density plasma CVD or catalytic CVD (e.g., Japanese Patent Application Laid-Open No. Sho 63-40314). A highly heat resistant glass substrate (8–12 inch diameter, 700–800 um thickness) may be used as the insulating substrate 1.

Next, as shown in (5) of FIG. 42, the monocrystalline silicon film 7 is heteroepitaxially grown to a thickness of several $\mu$m–0.005 $\mu$m (e.g., 0.1 um) by catalytic CVD (substrate temperature 200–800° C.). When the substrate 1 is borosilicate glass, the substrate temperature is 200 to 600° C., and when it is quartz glass, crystallized glass or a ceramic substrate, the substrate temperature is 600 to 800° C.

As the crystalline sapphire film 50 has good lattice compatibility with monocrystalline silicon, in the monocrystalline silicon layer 7 deposited as described above, the (100) plane for example grows on the substrate.

In this way, after depositing the monocrystalline silicon layer 7 on the substrate 1 by catalytic CVD and heteroepitaxial growth, a top gate or dual gate MOSTFT wherein the monocrystalline silicon layer 7 is the channel region, is produced in the same way as described above.

First, the whole surface is doped by a suitable amount of a P type carrier impurity, for example, boron ions, so as to adjust the resistivity. Also, the pMOSTFT-forming region is selectively doped with a N type carrier impurity to form a N type well. For example, the p channel TFT part is masked by a photoresist, not shown, and doped with P type impurity ions (for example, B⁺) at a dosage of $2.7 \times 1011$ atoms/cm² at 10 kV to adjust the resistivity. Also, as shown in (6) of FIG. 42, to control the impurity concentration of the pMOSTFT-forming region, the nMOSTFT part is masked by the photoresist 60, and doped with the N type impurity ions 65 (for example, P⁺) at a dosage of $1 \times 1011$ atoms/cm² at 10 kV to form the N type well 7A.

Next, as shown in (7) of FIG. 43, $SiO_2$ (approximately 200 nm thickness) and SiN (approximately 100 nm thickness) are continuously formed in this order on the whole surface of the monocrystalline silicon layer 7 by plasma CVD, high density plasma CVD or catalytic CVD, so as to form the gate insulation film 8, and the sputter film 9 (500–600 nm thickness) of a molybdenum tantalum (Mo/Ta) alloy is then formed.

Next, as shown in (8) of FIG. 43, the photoresist pattern 10 is respectively formed in the step region (in the depression) of the TFT part of the display region and the TFT part of the peripheral drive region by general-purpose photolithography, the gate electrode 11 of (Mo/Ta) alloy and gate insulation film (SiN/$SiO_2$) 12 are formed by continuous etching, and the monocrystalline silicon layer 7 is exposed. The (Mo/Ta) alloy film 9 is treated.with an acid etching solution, SiN is treated by plasma etching with CF4 gas, and $SiO_2$ is treated with a hydrofluoric acid etching solution., Next, as shown in (9) of FIG. 43, all the nMOS and pMOSTFT of the peripheral drive region and the gates of the nMOSTFT of the display region are covered by the photoresist 13, and the exposed source/drain regions of the nMOSTFT are doped with the phosphorus ions 14, for example, at a dosage of $5 \times 1013$ atoms/cm² at 20 kV (ion implantation), to form the LDD 15 comprising a N-type layer by self-alignment.

Figure 44:
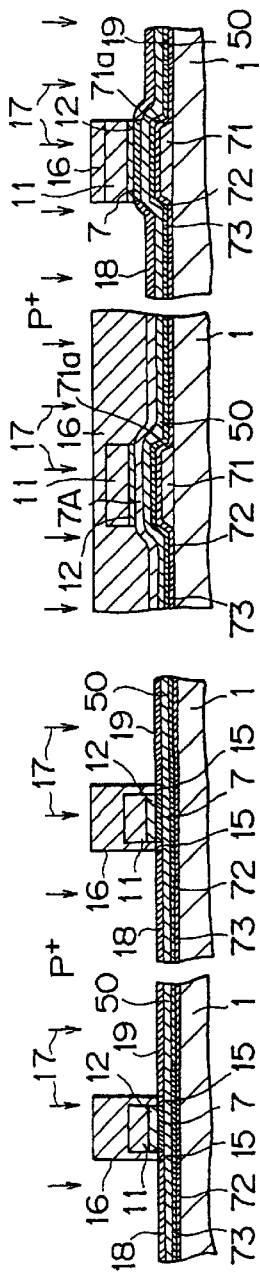
FIGS. 44(10) to 44(12) show a sequence of processes in the manufacture of the LCD.
Figure 44:
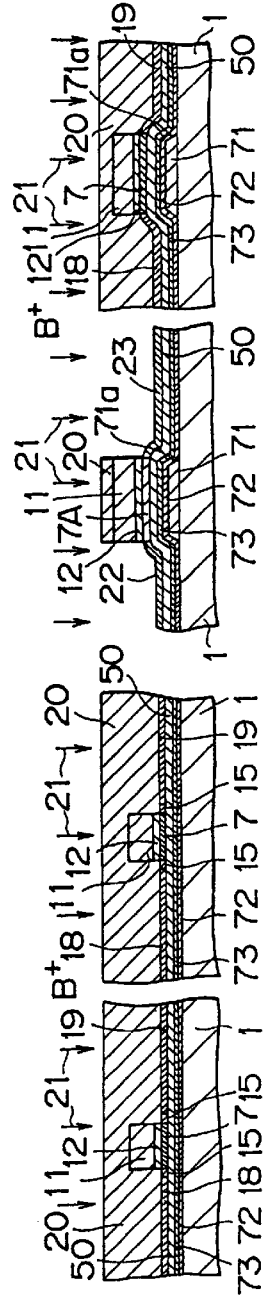
Figure 44:
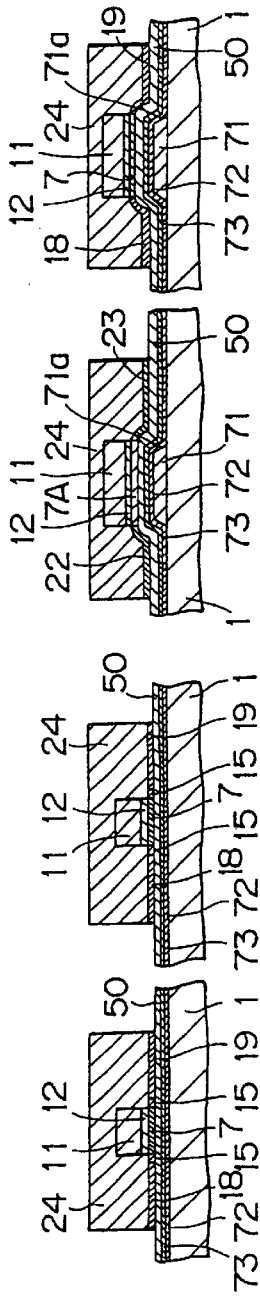

Next, as shown in (10) of FIG. 44, all the pMOSTFT of the peripheral drive region, the gates of the nMOSTFT of the peripheral drive region and the gates and LDD of the nMOSTFT of the display region are covered by the photoresist 16, and the exposed regions are doped with the phosphorus or arsenic ions 17, for example at a dosage of 5×1015 atoms/cm$^2$ at 20 kV (ion implantation), to form the source 18, drain 19 and LDD 15 comprising the N$^+$ type layer of the nMOSTFT.

Next, as shown in (11) of FIG. 44, all the nMOSTFT of the peripheral drive region and nMOSTFT of the display region, and the gates of the pMOSTFT, are covered by the photoresist 20, and the exposed regions are doped with the boron ions 21, for example at a dosage of 5×1015 atoms/cm$^2$ at 10 kV (ion implantation), to form the source 22 and drain 23 of the P$^+$ layer of the pMOSTFT. It may be noted that in the case of a MOS peripheral drive circuit, as there is no pMOSTFT, this operation is unnecessary.

Next, as shown in (12) of FIG. 44, in order to form islands of active elements such as TFT and diodes, and passive elements such as resistances and inductances, the photoresist 24 is formed and the monocrystalline silicon thin film layer excepting all the active elements and passive elements of the peripheral drive region and display region are removed by general-purpose photolithography and etching. The etching solution is a hydrofluoric acid system.

Next, as shown in (13) of FIG. 45, a SiO$_2$ film (approximately 200 nm thickness) and phosphosilicate (PSG) film (approximately 300 nm thickness) are continuously formed in this order on the whole surface by plasma CVD, high density plasma CVD or catalytic CVD to form the protective film 25.

Activation treatment of the monocrystalline silicon layer is carried out in this state. In this treatment, halogen lamp or other lamp annealing conditions are approximately 1000° C. for approximately 10 seconds. A gate electrode material which can withstand these conditions is required, and Mo/Ta alloy of high melting point is suitable. This gate electrode material may therefore not only be used for the gate but may also be used as an interconnection over a wide area. Herein, costly excimer laser annealing is not used, but if it were used, preferable conditions are full surface or selective (90% or higher) overlap scanning of only the active elements or passive elements with XeCl (308 nm wavelength).

Next, as shown in (14) of FIG. 45, contact openings are made in the source/drains of all the TFT in the peripheral drive circuit and the sources of the display TFT by general-purpose photolithography and etching.

A sputter film of aluminum, aluminum alloy such as aluminum with 1% Si of thickness 500–600 nm is formed over the whole surface, the source electrodes 26 of all the TFT in the peripheral drive circuit unit and the display unit, and the drain electrodes 27 of the peripheral drive circuit unit are formed by general-purpose photolithography and etching, and a data line and gate line are also formed. Subsequently, sinter processing is performed in a forming gas (N2+H2) at approximately 400° C./1 h.

Next, as shown in (15) of FIG. 45, the insulating film 36 which comprises a PSG film (approximately 300 nm thickness) and a SiN film (approximately 300 nm thickness) is formed over the whole surface by plasma CVD, high density plasma CVD or catalytic CVD. Next, a contact opening is made for the drain of the display TFT. It is unnecessary to remove the SiO$_2$, PSG and SiN films of the pixel unit.

Next, for the same purpose as that described in (18) of FIG. 6, the photosensitive resin film 28 of 2–3 um thickness is formed over the whole surface by spin coating etc., as shown in (16) of FIG. 46, then an unevenly shaped pattern is formed by general-purpose photolithography and etching to obtain optimum reflection characteristics and visual field angle characteristics in at least the pixel unit, and reflow is performed to form the lower part of a reflecting surface comprising the uneven rough surface 28A, as shown in (17) of FIG. 46. A resin opening for contact of the drain of the display TFT is made simultaneously.

Next, as shown in (18) of FIG. 46, a sputter film of aluminum, or aluminum with 1% Si or the like, of 400–500 nm thickness, is formed on the whole surface, and the reflecting part 29 comprising unevenly shaped aluminum or the like which is connected to the drain 19 of the display TFT is formed by general-purpose photolithography and etching. This is used as a pixel electrode for the display. Subsequently, sinter processing is performed at approximately 300° C./1 h in a forming gas to ensure soundness of contacts. Also, silver or a silver alloy may be used instead of an aluminum material to increase the reflectance.

In this way, the monocrystalline silicon layer 7 is formed by catalytic CVD using the crystalline sapphire film 50 as a seed for heteroepitaxial growth, and a one-piece active matrix substrate 30 comprising the display unit and peripheral drive circuit unit, wherein a CMOS circuit formed by a top gate nMOSLDD-TFT, and dual gate pMOSTFT and nMOSTFT, is integrated respectively in the display unit and drive circuit unit using this monocrystalline silicon layer 7, is thereby manufactured.

Figure 47:
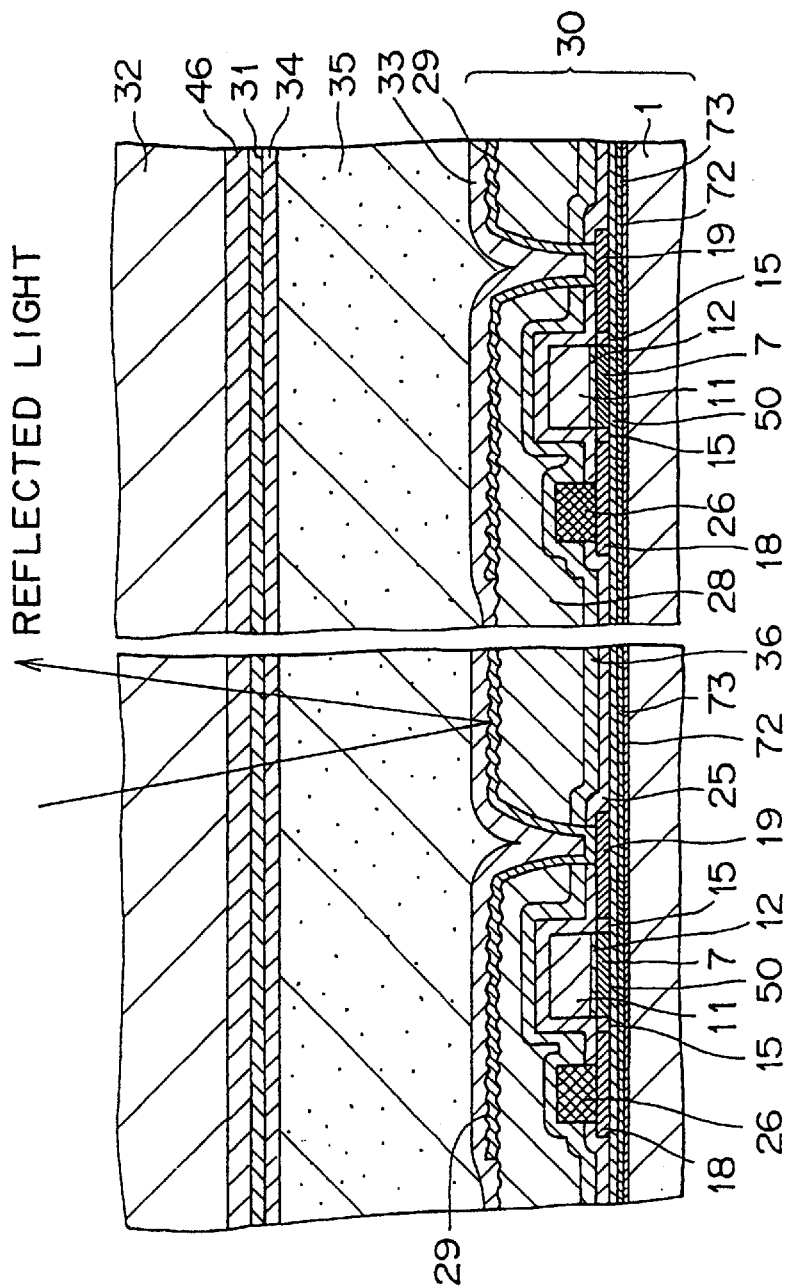
FIG. 47 is a cross-sectional view of essential parts of the LCD.

The reflecting type liquid crystal display device (LCD) of FIG. 47 is manufactured in the same way as described in FIG. 6 using the active matrix substrate (drive substrate) 30 thus obtained.

It will be appreciated that according to this embodiment, the same superior advantages of the aforesaid first embodiment are obtained. Further, as the monocrystalline silicon layer 7 is grown heteroepitaxially using only the crystalline sapphire film 50 without providing the step to the substrate 1, the process of forming the step can be omitted, the manufacturing process can be simplified, and the problem of possible discontinuity of the monocrystalline silicon layer which is grown, is resolved.

Ninth Embodiment

Figure 48:
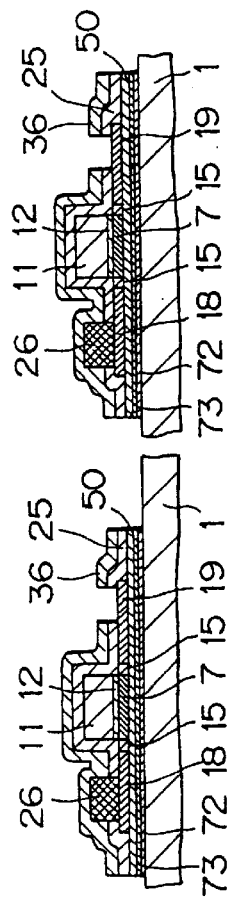
FIGS. 48(16) to 48(18) are cross-sectional views showing a sequence of processes for manufacturing an LCD according to a ninth embodiment of this invention.
Figure 48:
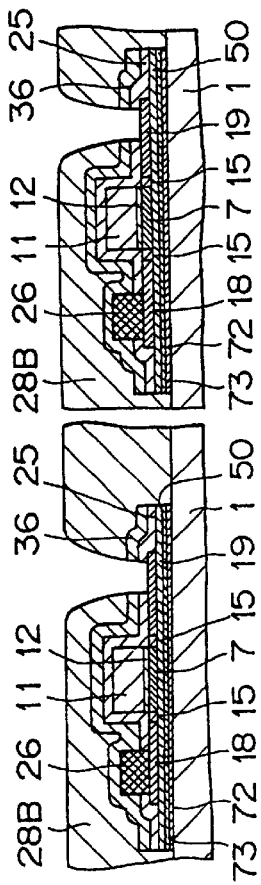
Figure 48:
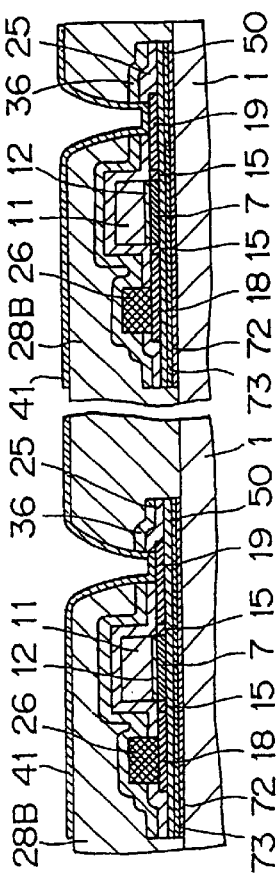
Figure 49:
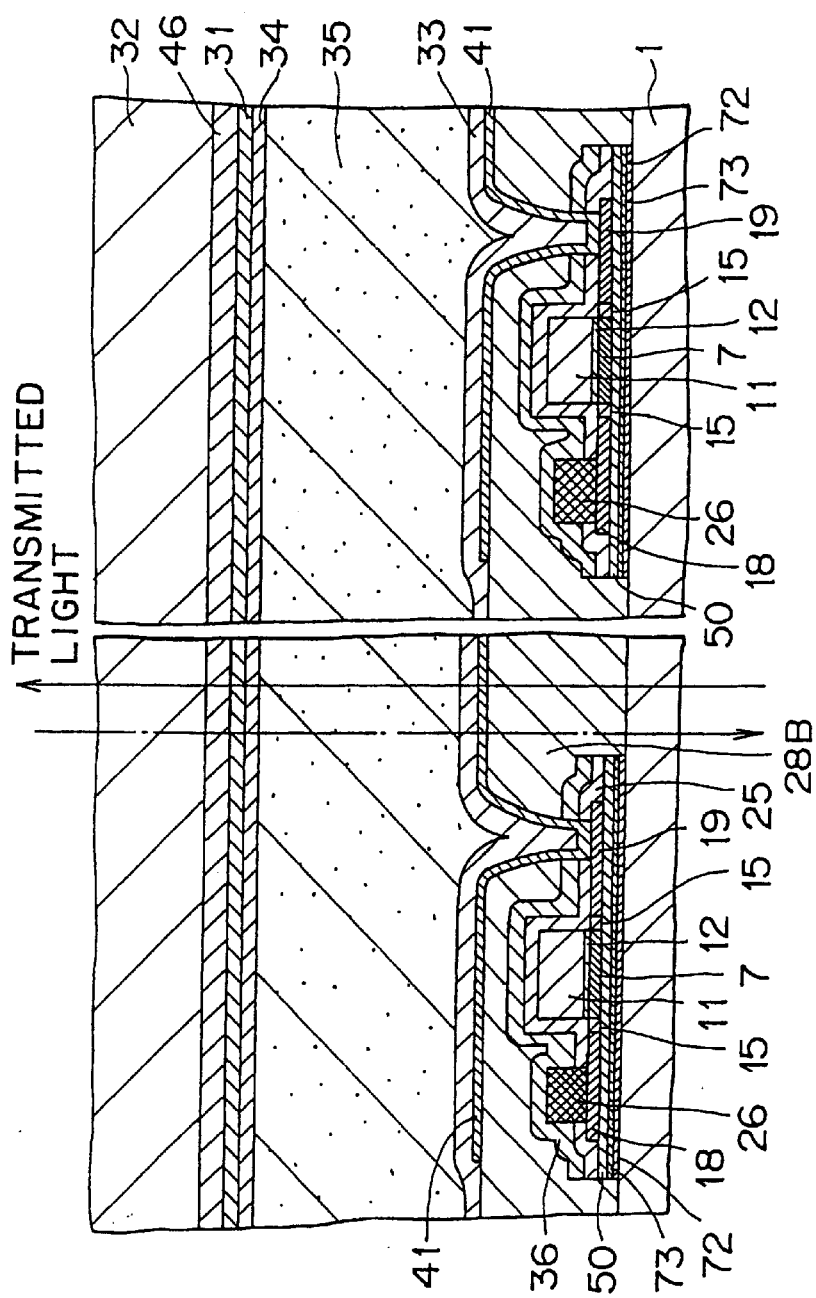
FIG. 49 is a cross-sectional view of essential parts of the LCD.

FIGS. 48–50 show a ninth embodiment of this invention.

According to this embodiment, the same top gate MOSTFT is provided to the display unit and the same dual gate MOSTFT is provided to the peripheral drive circuit unit as in the aforesaid eighth embodiment, but unlike the eighth embodiment, this embodiment concerns a transmitting type LCD. Specifically, the process is the same from (1) of FIG. 41 to (15) of FIG. 45, but after this process, a display part contact opening for the display TFT is made in the insulating films 25, 36, and unnecessary SiO$_2$, PSG and SiN films are removed from the pixel opening unit to improve transmittance, as shown in (16) of FIG. 48.

Next, as shown in (17) of FIG. 48, the flattening film 28B of a photosensitive acrylic transparent resin of 2–3 μm thickness is formed over the whole surface by spin coating, etc., then an opening is made in the transparent resin film 28B on the drain side of the display TFT by general-purpose photolithography, and the resulting product is cured under predetermined conditions.

Next, as shown in (18) of FIG. 48, an ITO sputtering film of 130–150 nm thickness is formed on the entire surface, and the ITO transparent electrode 41 in contact with the drain 19 of the display TFT is formed by general-purpose photolithography and etching. The contact resistances of the drain and ITO of the display TFT are lowered and ITO transmittance is improved by heat treatment (forming gas, 200–250° C./1 h).

The facing substrate 32 is then added so as to assemble a transmitting type LCD in the same way as in the aforesaid eighth embodiment, as shown in FIG. 49. However, a polarizing plate is also stuck onto the TFT substrate side. In this transmitting type LCD, transmitted light is obtained as shown by the solid line, but transmitted light may also be obtained from the facing substrate 32 side as shown by the dot and dash line.

In the case of this transmitting type LCD, an on-chip color filter (OCCF) structure and on-chip black (OCB) structure can be manufactured as follows.

Specifically, the process from (1) of FIG. 41 to (14) of FIG. 45 is based on the above process, following which an opening is also made in the drain of the PSG/SiO$_2$ insulation film 25 to form the aluminum embedded layer 41A for a drain electrode, and the SiN/PSG insulation film 36 is then formed, as shown in (15) of FIG. 50.

Next, after forming the photoresist 61 comprising the colors R, G, B in each segment to a predetermined thickness (1–1.5 μm), as shown in (16) of FIG. 50, the color filter layers 61(R), 61(G) and 61(B) are formed by patterning leaving only predetermined positions (pixel units) by general-purpose photolithography (on-chip color filter construction), as shown in (17) of FIG. 50. At this time, an opening is also made in the drain. It should be noted that an opaque ceramic substrate cannot be used.

Next, as shown in (17) of FIG. 50, the light exclusion layer 43 which is a black mask layer applied to the color filter layer, is formed in a contact hole connected to the drain of the display TFT by metal patterning. For example, a molybdenum film is formed by sputtering to a thickness of 200–250 nm, and this is patterned to a predetermined shape so as to cover the display TFT and exclude light (on-chip black construction).

Next, as shown in (18) of FIG. 50, the flattening film 28B of transparent resin is formed, and the ITO transparent electrode 41 is formed so that it is connected to the light exclusion layer 43 via the throughhole provided in this flattening film.

By incorporating the color filter 61 and black mask 43 on the display array in this way, the aperture of the liquid crystal display panel is improved, and display modules comprising a back light can have lower power consumption.

Tenth Embodiment

FIGS. 51–59 show a tenth embodiment of this invention.

In this embodiment, a CMOS drive circuit comprising a dual gate pMOSTFT and nMOSTFT is formed as in the eighth embodiment mentioned above. The display unit is a reflecting type, but various combinations are realized by using TFT of various gate constructions.

Figures 51A, 51B, 51C:
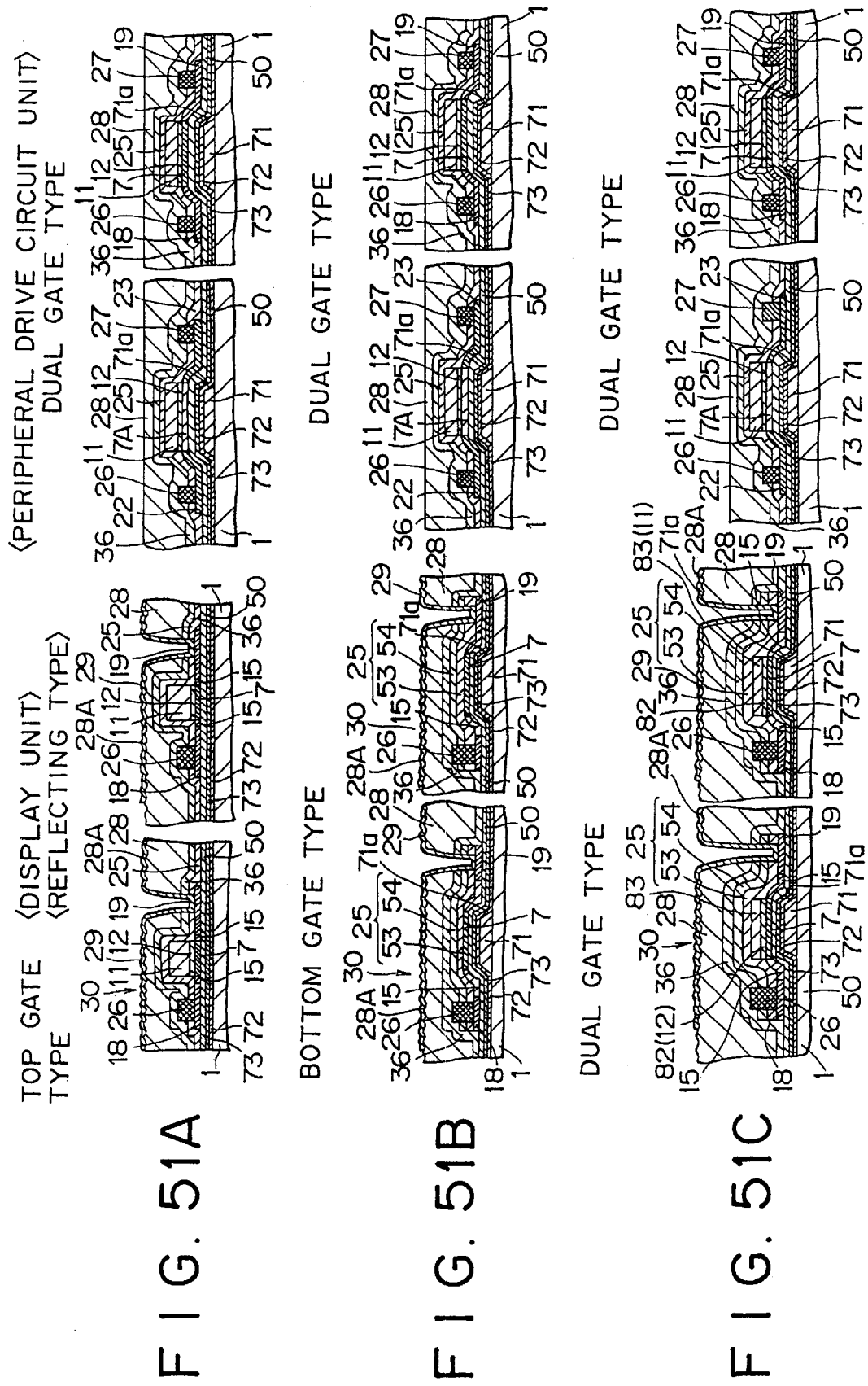
FIGS. 51A to 51C are cross-sectional views of essential parts of an LCD according to a tenth embodiment of this invention.

That is, in FIG. 51(A), the same top gate nMOSLDD-TFT as in the eighth embodiment mentioned above is provided to the display unit, but in the display unit shown in FIG. 51(B), a bottom gate nMOSLDD-TFT is provided, and in the display unit shown in FIG. 51(C), a dual gate nMOSLDD-TFT is provided, respectively.

These bottom gate and dual gate MOSTFT can be manufactured by the same process as the dual gate MOSTFT of the drive circuit unit, but in the case of a dual gate type, drive performance is improved by the upper and lower gates, and it is suitable for fast switching. In addition, it may also be used as a top gate or bottom gate type by selectively using either the upper or lower gate.

In the bottom gate MOSTFT of FIG. 51(B), 71 is a gate electrode of Mo/Ta or the like, 72 is a SiN film and 73 is a SiO$_2$ film forming a gate insulation film. A channel region using an identical monocrystalline silicon layer to that of a top gate MOSTFT, for example, is formed on this gate insulation film. In the dual gate MOSTFT of FIG. 49(C), the lower gate is the same as that of the bottom gate MOSTFT, but in the upper gate, the gate insulation film 73 is formed by a SiO$_2$ film and a SiN film, and an upper gate electrode 74 is formed thereon.

Next, the method of manufacturing the aforesaid bottom gate MOSTFT will be described referring to FIG. 52–FIG. 56, and the -method of manufacturing the aforesaid dual gate MOSTFT will be described referring to FIG. 57–FIG. 59, respectively. As the method of manufacturing the dual gate MOSTFT of the peripheral drive circuit unit is the same as that described in FIG. 41–FIG. 46, it is not shown in the drawing here.

Figure 52:
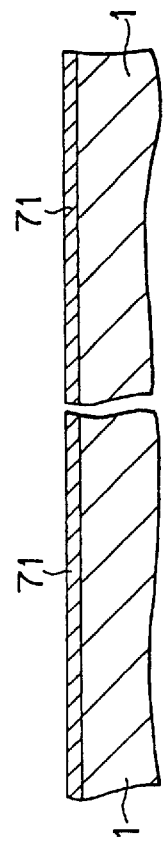
FIGS. 52(1) to 52(3) are cross-sectional views showing a sequence of processes in the manufacture of the LCD.
Figure 52:
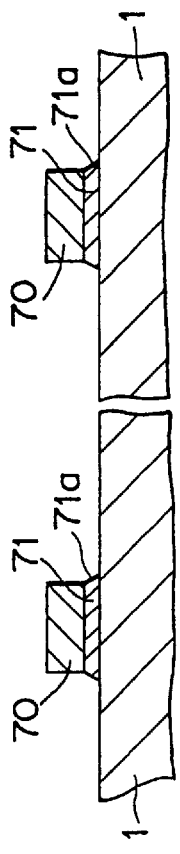
Figure 52:
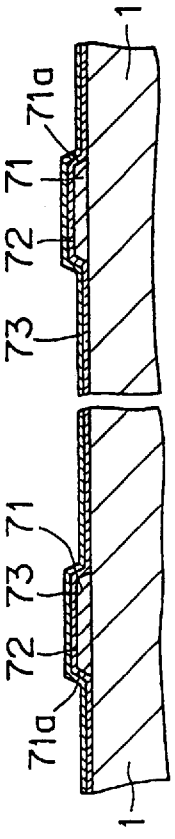

In the display part, to manufacture a bottom gate MOSTFT, first, as shown in (1) of FIG. 52, the sputter film 71 (500–600 nm thickness) of molybdenum/tantalum (Mo/Ta) alloy is formed on the substrate 1.

Next, as shown in (2) of FIG. 52, the photoresist 70 is formed in a predetermined pattern, taper etching of the Mo/Ta film 71 is performed using this as a mask, and the gate electrode 71 is thereby formed comprising the side end 71a which is gently sloping at 20–45 degrees to form a trapezoidal cross section shape.

Next, as shown in (3) of FIG. 52, after removal of the photoresist 70, a gate insulation film, comprising the SiN film 72 (approximately 100 nm thickness) 72 and SiO$_2$ film (approximately 200 nm thickness) 73 laminated in this order, is formed by plasma CVD or the like on the substrate 1 which comprises the molybdenum tantalum alloy film 71.

Next, as shown in (4) of FIG. 53, in the same process as that of (4) of FIG. 42, the crystalline sapphire film 50 (20–200 nm thickness) is formed in at least the TFT-forming region on a principal surface of the insulating substrate 1.

Next, as shown in (5) of FIG. 53, in the same process as that of (5) of FIG. 42, heteroepitaxial growth of the monocrystalline silicon is performed by catalytic CVD so as to deposit the monocrystalline silicon layer 7 at a thickness of, for example, 0.1 um as described above. In this case, as the side end 71a of the gate electrode 71 of the substrate is a gently inclined surface, epitaxial growth is not obstructed by the step 4 on this surface, and the monocrystalline silicon layer 7 grows without discontinuities.

Next, as shown in (6) of FIG. 53, after the processes of FIG. 42(6)–FIG. 43(8) and in the same process as that of (9) of FIG. 43, the gate of the nMOSTFT of the display unit is covered by the photoresist 13, and the phosphorus ions 14 are doped to the source/drain regions of the exposed nMOSTFT (ion implantation) to form the LDD 15 comprising a N- type layer in a self-aligning manner. At this time, it is easy to recognize surface height differences (or patterns) due to the bottom gate electrode 71, so positioning (mask alignment) of the photoresist 13 is easy and misalignment does not easily occur.

Figure 54:
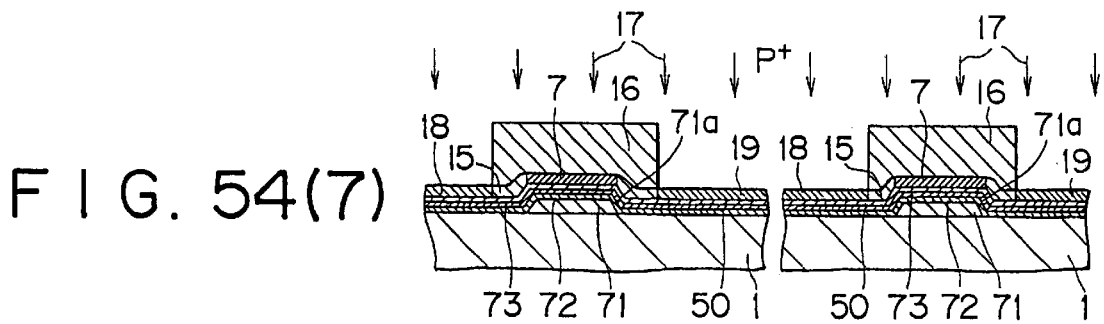
FIGS. 54(7) to 54(10) show a sequence of processes in the manufacture of the LCD.
Figure 54:
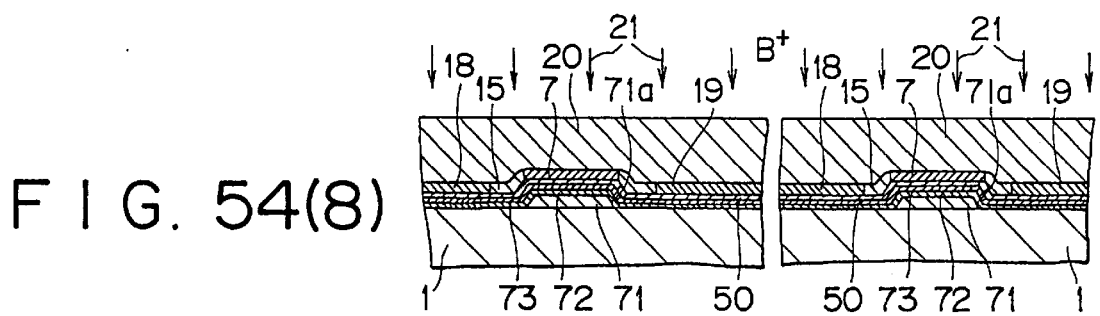
Figure 54:
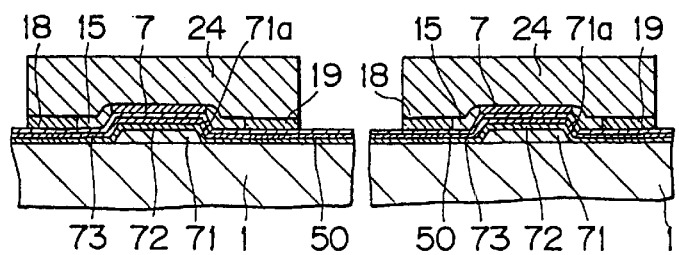
Figure 54:
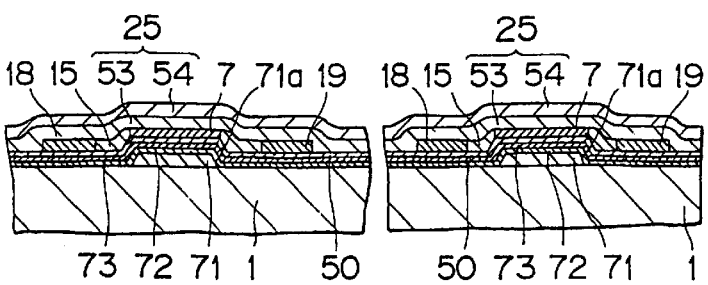

Next, as shown in (7) of FIG. 54, in the same process as that of (10) of FIG. 44, the gate of the nMOSTFT is covered by the photoresist 16, and the exposed regions are doped with the phosphorus or arsenic ions 17 (ion implantation) to form the source 18 and drain 19 comprising the N$^+$ type layer of the nNOSTFT.

Next, as shown in (8) of FIG. 54, in the same process as that of (11) of FIG. 44, all of the nMOSTFT are covered by the photoresist 20, and the boron ions 21 are doped (ion implantation) so as to form a source and drain of the P+ layer of the MOSTFT of the peripheral drive circuit unit.

Next, as shown in (9) of FIG. 54, in the same process as that of (12) of FIG. 44, in order to form islands of the active elements and the passive elements, the photoresist 24 is provided and the monocrystalline silicon thin film layer is selectively removed by general-purpose photolithography and etching.

Next, as shown in (10) of FIG. 54, in the same process as that of (13) of FIG. 45, the $SiO_2$ film 53 (approximately 300 nm thickness) and phosphosilicate (PSG) film 54 (approximately 300 nm thickness) are formed in this order on the whole surface by plasma CVD, high density plasma CVD or catalytic CVD. The $SiO_2$ film 53 and PSG film 54 are equivalent to the protective layer 25 mentioned above. Activation treatment of the monocrystalline silicon film is then performed in this state as described above.

Figure 55:
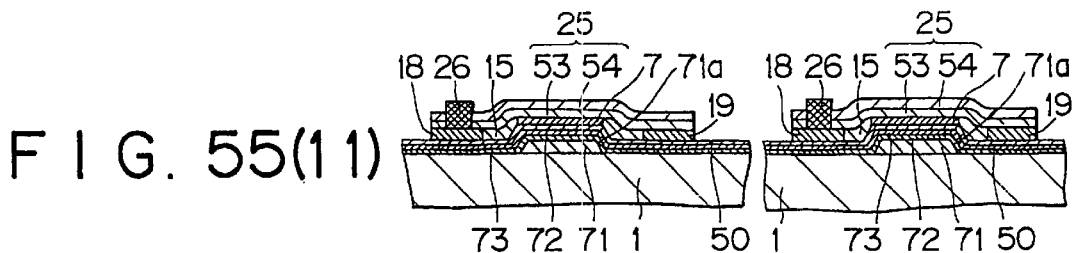
FIGS. 55(11) to 55(14) show a sequence of processes in the manufacture of the LCD.
Figure 55:
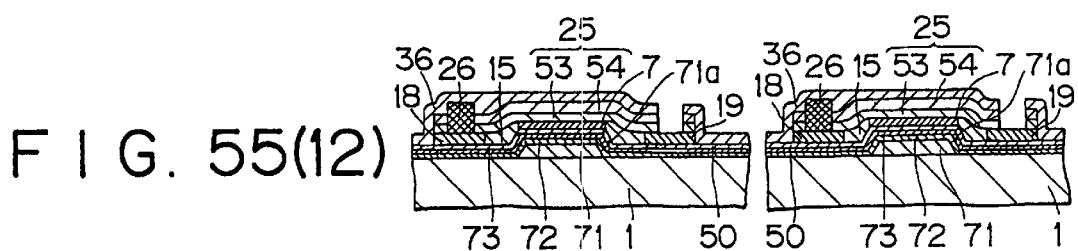
Figure 55:
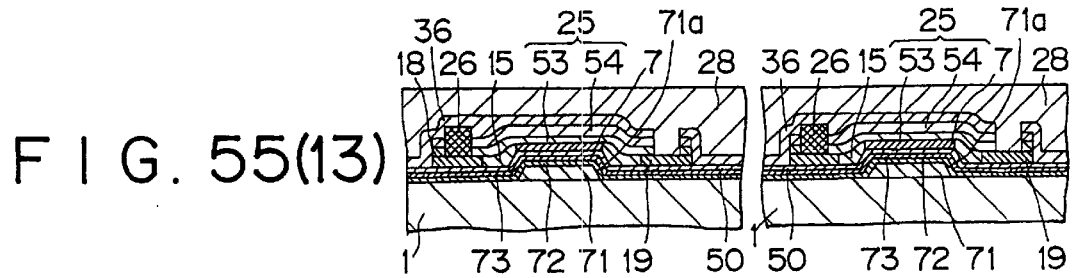
Figure 55:
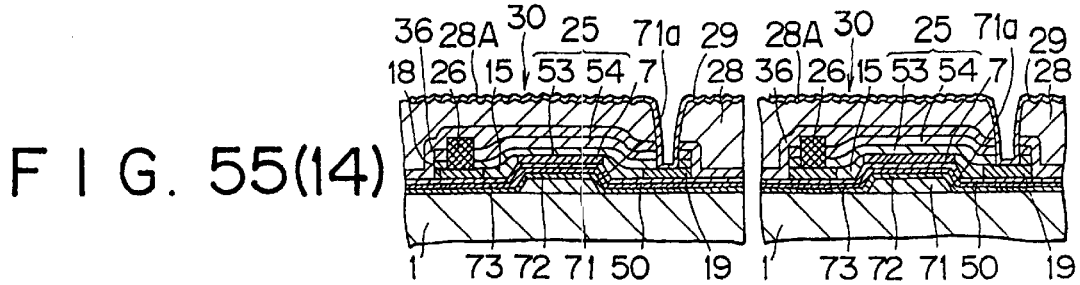

Next, as shown in (11) of FIG. 55, in the same process as that of (14) of FIG. 45, a contact opening is made by general-purpose photolithography and etching. A sputter film of aluminum, aluminum with 1% Si or the like of 400–500 nm thickness is then formed on the whole surface, and a data line and gate line are formed at the same time as the source electrodes 26 of the TFT by general-purpose photolithography and etching. Subsequently, sinter processing is performed in a forming gas at approximately 400° C./1 h.

Next, as shown in (12) of FIG. 55, in the same process as that of (15) of FIG. 45, the insulating film 36 which comprises a PSG film (approximately 300 nm thickness) and a SiN film (approximately 300 nm thickness) is formed over the whole surface by plasma CVD, high density plasma CVD or catalytic CVD, and a contact opening in the drain of the display TFT is formed.

Next, in the same process as that of (16) of FIG. 46, the photosensitive resin film 28 of 2–3 um thickness is formed over the whole surface by spin coating etc., as shown in (13) of FIG. 55, then an unevenly shaped pattern is formed by general-purpose photolithography and etching to obtain optimum reflection characteristics and visual field angle characteristics in at least the pixel unit, and reflow is performed to form the lower part of a reflecting surface comprising the uneven rough surface 28A, as shown in (14) of FIG. 55. A resin opening for contact of the drain of the display TFT is made simultaneously.

Next, as shown in (14) of FIG. 55, in the same process as that of (18) of FIG. 46, a sputter film of aluminum, aluminum with 1% Si or the like of 400–500 nm thickness is formed on the whole surface, and the reflecting part 29 comprising unevenly shaped aluminum or the like which is connected to the drain 19 of the display TFT is formed by general-purpose photolithography and etching.

In this way, the one-piece active matrix substrate 30 comprising the display unit and peripheral drive circuit unit, wherein a bottom gate nMOSLDD-TFT is integrated in the display unit (and a CMOS drive circuit comprising a dual gate pMOSTFT and nNOSTFT is integrated in the peripheral unit,) is thereby manufactured using the monocrystalline silicon layer 7 formed by catalytic CVD with the crystalline sapphire film 50 acting as a seed for low temperature heteroepitaxial growth.

FIG. 56 shows an example wherein the gate insulation film of the aforesaid bottom gate MOSTFT provided to the display unit, is formed by the anodic oxidation of Mo/Ta.

Specifically, after the process of (2) in FIG. 52, as shown in (3) of FIG. 56, the gate insulation film 74 comprising Ta2O5 on its surface is formed to a thickness of 100–200 nm by anodic oxidation of the molybdenum/tantalum alloy film 71 according to the art.

After this process, the crystalline sapphire film 50 is formed as shown in (4) of FIG. 56 in the same manner as that of the processes (4)–(5) of FIG. 53, and after performing heteroepitaxial growth of the monocrystalline silicon layer 7 by catalytic CVD, the active matrix substrate 30 is manufactured as shown in (5) of FIG. 56 in the same way as in the processes of FIG. 53(6)–FIG. 55(14).

Next, to manufacture a dual gate MOSTFT in the display part, the processes of FIG. 52(1)–FIG. 53(5) are first performed as described hereabove.

Specifically, as shown in (6) of FIG. 57, the crystalline sapphire film 50 is grown on the insulating films 72, 73, and the monocrystalline silicon layer 7 is grown heteroepitaxially using this crystalline sapphire film 50 as a seed. Next, as shown in (7) of FIG. 43, a $SiO_2$ film (approximately 200 nm thickness) and SiN film (approximately 100 nm thickness) are continuously formed in this order on the whole surface of the monocrystalline silicon layer 7 by plasma CVD, catalytic CVD or the like so as to form the gate insulation film 80 (corresponding to the aforesaid gate insulation film 8), and the sputter film 81 (500–600 nm thickness, corresponding to the aforesaid sputter film 9) of a molybdenum tantalum (Mo/Ta) alloy is then formed.

Next, as shown in (7) of FIG. 57 and in the same process as that of (8) of FIG. 43, the photoresist pattern 10 is formed, the gate electrode 82 of (Mo/Ta) alloy (corresponding to the gate electrode 12) and gate insulation film 83 (corresponding to the gate insulation film 11) are formed by continuous etching, and the monocrystalline silicon layer 7 is thereby exposed.

Next, as shown in (8) of FIG. 57, in the same process as that of (9) of FIG. 43, the top gate of the nMOSTFT is covered by the photoresist 13, and the exposed source/drain regions of the nMOSTFT are doped with the phosphorus ions 14 (ion implantation) so as to form the LDD 15 comprising a N-type layer.

Next, as shown in (9) of FIG. 57, in the same process as that of (10) of FIG. 44, the gate of the nMOSTFT is covered by the photoresist 16, and the exposed regions are doped with the phosphorus or arsenic ions 17 (ion implantation) to form the source 18 and drain 19 comprising the N+ type layer of the nMOSTFT.

Next, as shown in (10) of FIG. 58, in the same process as that of (11) of FIG. 44, the gate of the nMOSTFT is covered by the photoresist 20, and the boron ions 21 are doped (ion implantation) to form a source and drain of the P+ layer of the pMOSTFT of the peripheral drive circuit unit.

Next, as shown in (11) of FIG. 58, in the same process as that of (12) of FIG. 44, in order to form islands of the active elements and the passive elements, the photoresist 24 is provided and the monocrystalline silicon thin film layer is selectively removed by general-purpose photolithography and etching.

Next, as shown in (12) of FIG. 58, in the same process as that of (13) of FIG. 45, the $SiO_2$ film 53 (approximately 200 nm thickness) and phosphosilicate (PSG) film 54 (approximately 300 nm thickness) are formed on the whole surface by plasma CVD, high density plasma CVD or catalytic CVD. These films 53, 54 are equivalent to the protective film 25 described hereabove. Activation treatment of the monocrystalline silicon layer 7 is then performed.

Next, as shown in (13) of FIG. 58, in the same process as that of (14) of FIG. 46, a contact opening is made in the source. A sputter film of aluminum, aluminum with 1% Si or the like of 400–500 nm thickness is then formed on the whole surface, and a data line and gate line are formed at the same time as the source electrodes 26 by general-purpose photolithography and etching.

Figure 59:
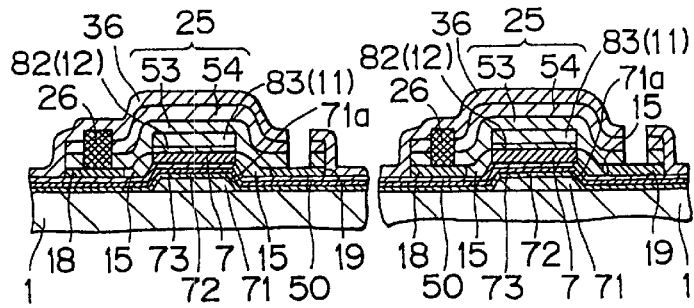
FIGS. 59(14) to 59(16) show a sequence of processes in the manufacture of the LCD FIGS. 60(6) and 60(7) are cross-sectional views showing a sequence of processes for manufacturing an LCD according to an eleventh embodiment of this invention.
Figure 59:
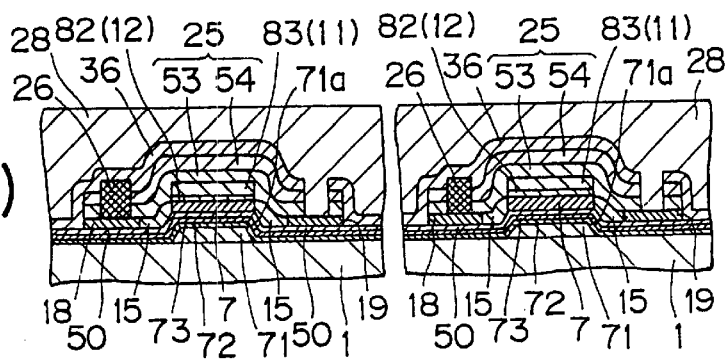
Figure 59:
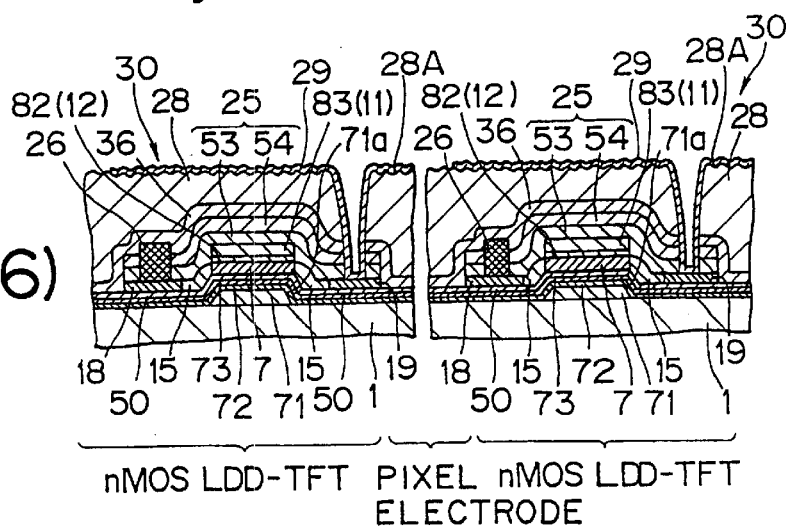

Next, as shown in (14) of FIG. 59, in the same process as that of (15) of FIG. 45, the insulating film 36 which comprises a PSG film (approximately 300 nm thickness) and a SiN film (approximately 300 nm thickness) is formed over the whole surface, and a contact opening is made in the drain of the display TFT.

Next, as shown in (15) of FIG. 59, the photosensitive resin film 28 of 2–3 um thickness is formed over the whole surface by spin coating etc., then as shown in (16) of FIG. 59 and in the same process as that of (17), 18) of FIG. 46, the lower part of a reflecting surface comprising the uneven rough surface 28A is formed at least in the pixel unit, a contact resin opening is made in the drain of the display TFT at the same time, and the unevenly shaped reflecting part 29 of aluminum or the like for obtaining optimum reflection characteristics and visual field angle characteristics, and connected to the drain of the display TFT, is formed.

In this way, the one-piece active matrix substrate 30 comprising the display unit and peripheral drive circuit unit, wherein a dual gate nMOSLDD-TFT is integrated in the display unit and a CMOS drive circuit comprising a dual gate pMOSTFT and nMOSTFT is integrated in the peripheral unit, is thereby manufactured using the monocrystalline silicon layer 7 formed by catalytic CVD with the crystalline sapphire film 50 acting as a seed for heteroepitaxial growth.

Eleventh Embodiment

Figure 62:
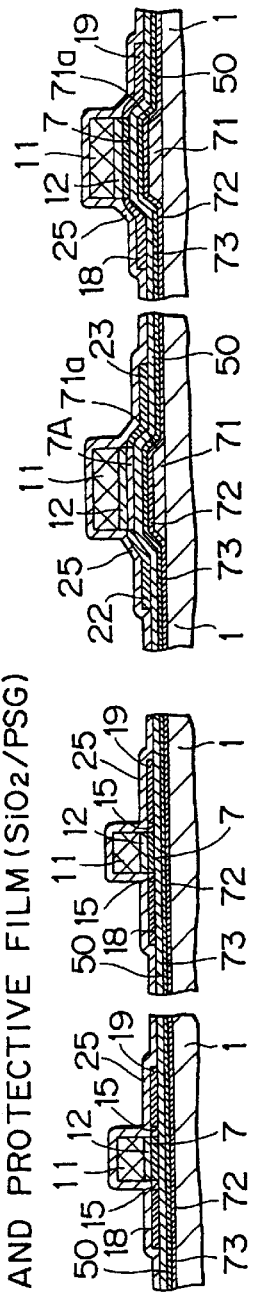
FIGS. 62(11) and 62(12) are cross-sectional views showing a sequence of processes in the manufacture of the LCD.
Figure 62:
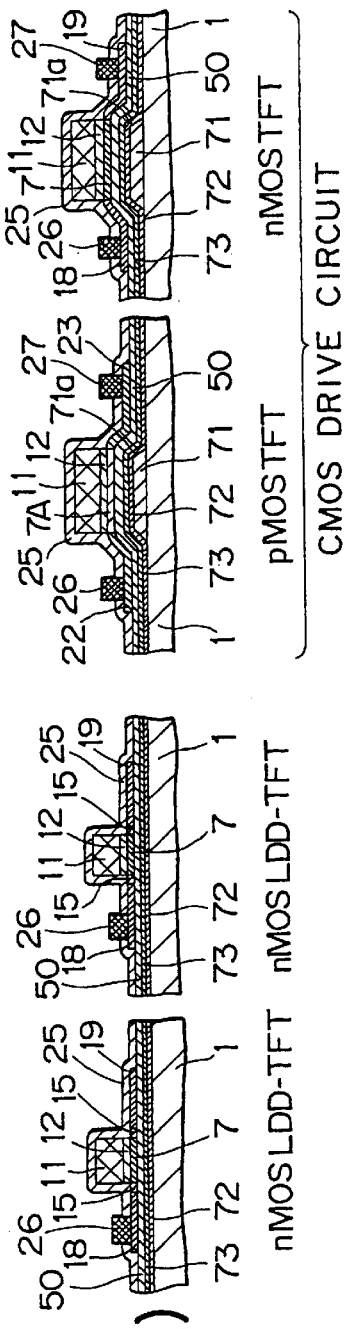

FIGS. 60–62 show an eleventh embodiment of this invention.

In this embodiment, unlike the aforesaid embodiment, the gate electrode of the top gate is formed of a material having relatively low heat resistance such as aluminum or the like.

First, when the top gate and dual gate MOSTFT are provided to the display unit and peripheral drive circuit unit, the processes of FIG. 41(1)–FIG. 42(6) of the aforesaid eighth embodiment are performed in the same way so as to form the N type well 7A in the pMOSTFT part of the peripheral drive circuit unit as shown in (6) of FIG. 60.

Next, as shown in (7) of FIG. 60, all the nMOS and pMOSTFT of the peripheral drive region and the gates of the nMOSTFT of the display region are covered by the photoresist 13, and the exposed source/drain regions of the nMOSTFT are doped with the phosphorus ions 14, for example, at a dosage of $5 \times 10^{13}$ atoms/cm$^2$ at 20 kV (ion implantation), to form the LDD 15 comprising a N-type layer by self-alignment.

Next, as shown in (8) of FIG. 61, all the pMOSTFT of the peripheral drive region, the gates of the nMOSTFT of the peripheral drive region and the gates and LDD of the nMOSTFT of the display region are covered by the photoresist 16, and the exposed regions are doped with the phosphorus or arsenic ions 17, for example at a dosage of $5 \times 10^{15}$ atoms/cm$^2$ at 20 kV (ion implantation), to form the source 18, drain 19 and LDD 15 comprising the N$^+$ type layer of the nMOSTFT. In this case, if the resist 13 is allowed to remain as shown by the imaginary line, and the resist 16 is provided to cover this, the resist 13 can be used as a guide to position the mask when the resist 16 is formed so that mask alignment is easier, and misalignments are reduced.

Next, as shown in (9) of FIG. 61, all the nMOSTFT of the peripheral drive region and nMOSTFT of the display region, and the gates of the pMOSTFT, are covered by the photoresist 20, and the exposed regions are doped with the boron ions 21, for example at a dosage of $5 \times 10^{15}$ atoms/cm$^2$ at 10 kV (ion implantation), to form the source 22 and drain 23 of the P$^+$ layer of the pMOSTFT.

Next, after removing the resist 20, as shown in (10) of FIG. 61, activation treatment of the monocrystalline silicon layer 7, 7A is performed as described hereabove, and the gate insulation film 12, and gate electrode material (aluminum or aluminum with 1% Si or the like) are formed on the surface. The gate electrode material layer 11 can be formed by vacuum deposition or sputtering.

Next, after patterning the gates as described hereabove, islands are formed of the active elements and passive elements, and a SiO$_2$ film (approximately 200 nm thickness) and phosphosilicate (PSG) film (approximately 300 nm thickness) are continuously formed in this order on the whole surface as shown in (11) of FIG. 62.

Next, as shown in (12) of FIG. 62, contact openings are made in the source/drains of all the TFT in the peripheral drive circuit and the sources of the display TFT by general-purpose photolithography and etching.

A sputter film of aluminum or the like of thickness 500–600 nm is formed over the whole surface, the source electrodes 26 of all the TFT in the peripheral drive circuit unit and the display unit and drain electrodes 27 of the peripheral drive circuit unit are formed by general-purpose photolithography and etching, and a data line and gate line are also formed.

Subsequently, sinter processing is performed in a forming gas (N2+H2) at approximately 400° C./1 h.

Next, the one-piece active matrix substrate 30, comprising the top gate nMOSLDD-TFT having aluminum, aluminum with 1% Si or the like as gate electrode in the display unit, and the CMOS drive circuit comprising the dual gate pMOSTFT and nMOSTFT in the peripheral drive circuit unit, is thereby manufactured using the monocrystalline silicon layer 7 in the same manner as that of FIG. 45(15)–FIG. 46(18).

In this embodiment, the gate electrode 11 of aluminum or aluminum with 1% Si is formed after activation treatment of the monocrystalline silicon layer 7, so the effect of the heat of this activation treatment is unrelated to the heat resistance of the gate electrode material. Therefore low cost aluminum or aluminum with 1% Si which have a relatively low heat resistance, or copper or the like, may also be used as the top gate electrode material, and the choice of electrode materials is wider. This is the same as the case when the display is a bottom gate MOSTFT.

Next, when a dual gate MOSTFT is provided to the display unit and a dual gate MOSTFT is provided to the peripheral drive circuit unit, the one-piece active matrix substrate 30, comprising a dual gate nMOSLDD-TFT having aluminum or the like as gate electrode in the display unit, and a CMOS drive circuit comprising a dual gate pMOSTFT and nMOSTFT in the peripheral drive circuit unit, is manufactured by the same process as that described in FIG. 29(6)–FIG. 31(13).

Twelfth Embodiment

Figure 64A:
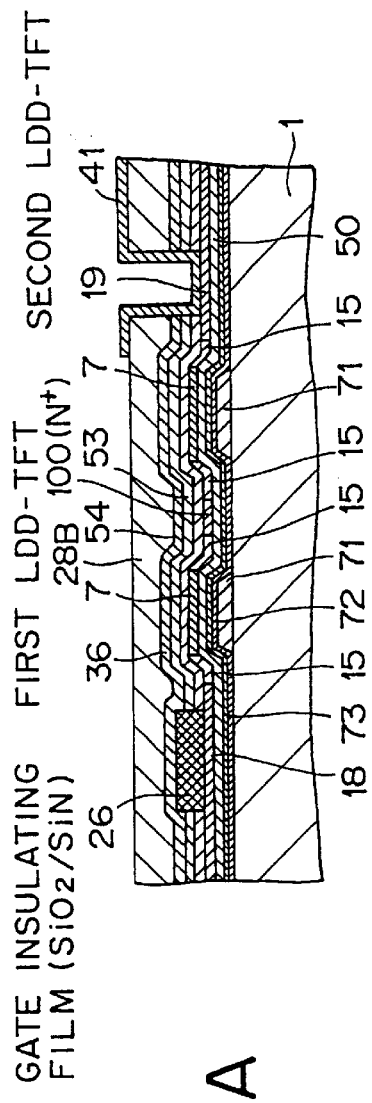
FIGS. 64A and 64B are cross-sectional views of essential parts of various TFT of the LCD.
Figure 64B:
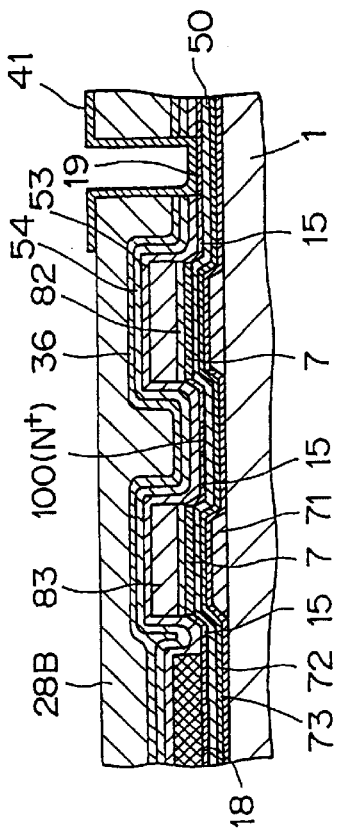

FIGS. 63–64 show a twelfth embodiment of this invention.

The example of FIG. 63 is a device concerning a double gate MOSTFT wherein, in the aforesaid eighth embodiment, plural TFT having a self-aligning LDD structure, for instance, a top gate LDD-TFT, are interconnected.

FIG. 64 shows an example of a device (A) wherein a bottom gate MOSTFT has a double gate structure, and a device (B) wherein a dual gate MOSTFT has a double gate structure.

These double gate MOSTFT offer the same advantages as those described in the aforesaid FIG. 37–FIG. 39.

Thirteenth Embodiment

FIGS. 65–73 show a thirteenth embodiment of this invention.

As mentioned above, the top gate type, bottom gate type and dual gate type have characteristic differences in their construction and features, and it is sometimes advantageous to combine these TFTs in various ways when using them in a peripheral drive circuit unit together with a display unit.

For example, when a top gate, bottom gate or dual gate MOSTFT is used in the display unit, at least a dual gate type chosen from a top gate MOSTFT, bottom gate MOSTFT and dual gate MOSTFT, or a mixture of these types, is used in the peripheral drive circuit, as shown in FIG. 65. Twelve such combinations (No. 1–No. 12) may be mentioned. In particular, if a dual gate construction is used for the MOSTFT of the peripheral drive circuit, such a dual gate construction can easily be modified to a top gate type or bottom gate type by selecting the upper or lower gate, and a dual gate type may be necessary when a TFT of high drive performance is required for part of the peripheral drive circuit. For example, this may be necessary when applying this invention to electro-optics devices other than LCD such as organic EL or FED.

FIG. 66 to FIG. 73 show various examples (No. 1–No. 216) of combinations of MOSTFT in the peripheral drive circuit unit and display unit according to channel conduction type. FIG. 66 and FIG. 67 show cases where the MOSTFT of the display unit does not have an LDD construction. FIG. 68 and 69 show cases where the MOSTFT of the display unit does not have an LDD construction.

FIG. 70 and FIG. 71 show cases where the MOSTFT of the peripheral drive circuit unit comprises a TFT of LDD construction. FIG. 72 and FIG. 73 show cases where both the peripheral drive circuit unit and the display unit comprise MOSTFT of LDD construction.

The combinations according to the different gate structures shown in FIG. 65 are shown in more detail in FIG. 66–FIG. 73. This means the same combinations are possible when the peripheral drive circuit unit comprises mixed MOSTFT comprising a top gate type and another gate type. It should be noted that the TFT combinations shown in FIG. 65–FIG. 73 are not limited to the case where the channel region of the TFT is formed from monocrystalline silicon, and they may be applied in the same way when it is formed from polycrystalline silicon or amorphous silicon (however, only in the display unit).

Fourteenth Embodiment

Figure 74A:
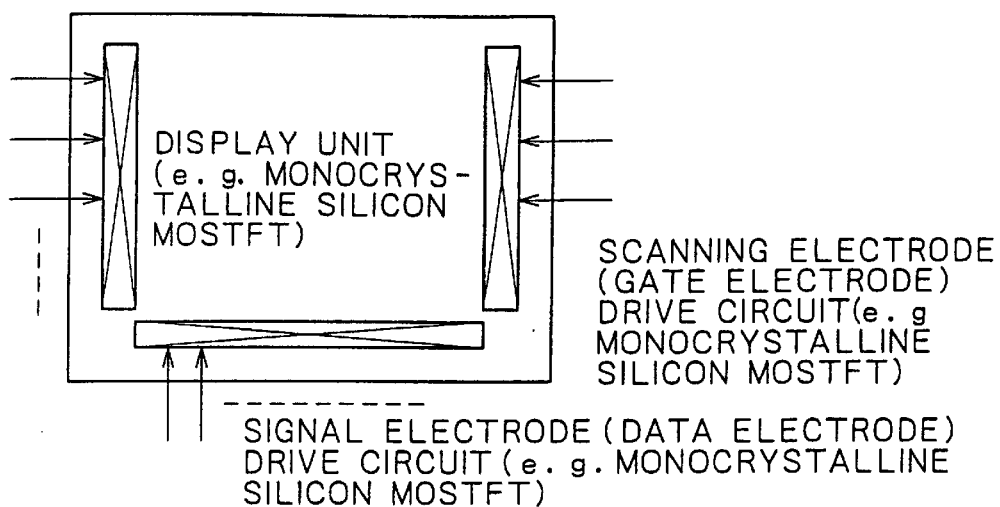
FIGS. 74A to 74C are schematic layout diagrams of an LCD according to a fourteenth embodiment of this invention.
Figure 74B:
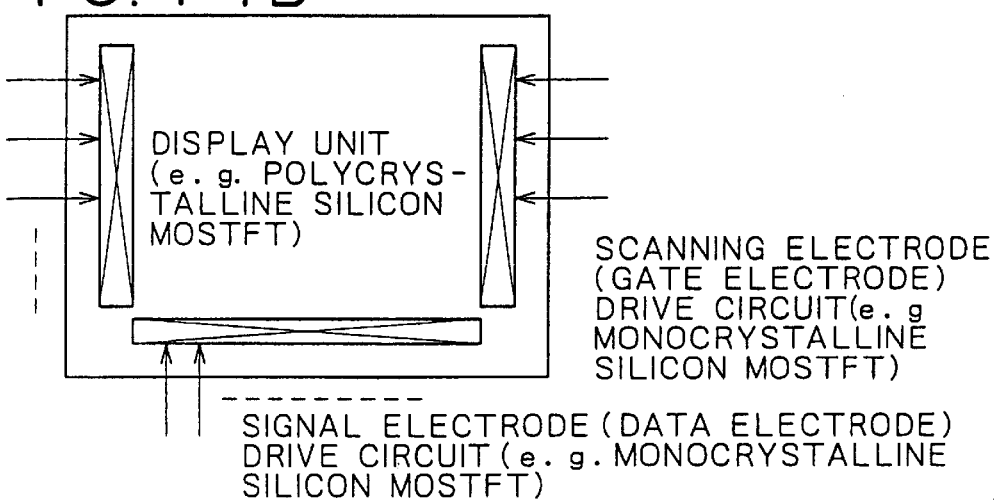
Figure 74C:
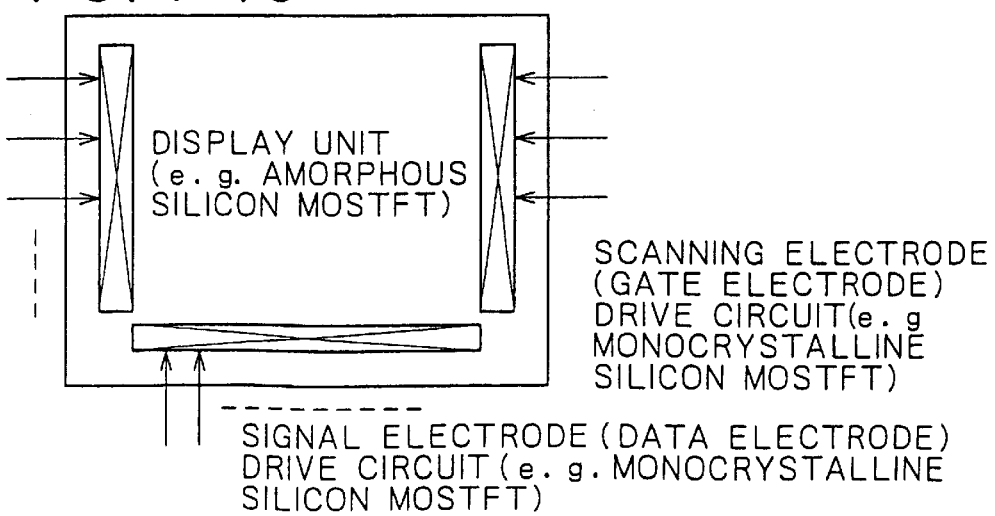

FIG. 74–FIG. 75 show a fourteenth embodiment of this invention.

In this embodiment, the peripheral drive circuit unit in the active matrix drive LCD is provided with a TFT using the aforesaid monocrystalline silicon layer based on this invention from the viewpoint of improving drive performance. However, this is not limited to a dual gate type. Other gate types may also be present, various channel conduction types are possible, and MOSTFT using a polycrystalline silicon layer may be included in addition to a monocrystalline silicon layer. Although it is desirable to use a monocrystalline silicon layer for the MOSTFT of the display unit, the invention is not limited to this arrangement. A polycrystalline silicon or an amorphous silicon layer may be used, or at least two of these three types of silicon layers may be present together. However, when forming a display unit by a nMOSTFT, although a practical switching rate can be obtained by using an amorphous silicon layer, monocrystalline silicon or polycrystalline silicon are more advantageous than amorphous silicon in that they permit reduction of the TFT surface area, and give fewer pixel defects. In the graphoepitaxial growth mentioned above, polycrystalline silicon is produced at the same time as monocrystalline silicon and the structure may comprise CGS (Continuous Grain Silicon). This can also be utilized for the formation of active elements and passive elements.

FIG. 74 shows typical combinations (A), (B), (C) of MOSTFT between different units, and FIG. 75 shows specific examples thereof. If monocrystalline silicon is used, current drive performance improves, components can be made small, large screen sizes are possible, and the aperture increases in the display unit.

It will of course be understood that, in the peripheral drive circuit unit, not only the aforesaid MOSTFT, but also electronic circuits that integrate diodes, capacitances, resistances and inductances with an insulating substrate (glass substrate etc.), may be formed.

Fifteenth Embodiment

Figure 76:
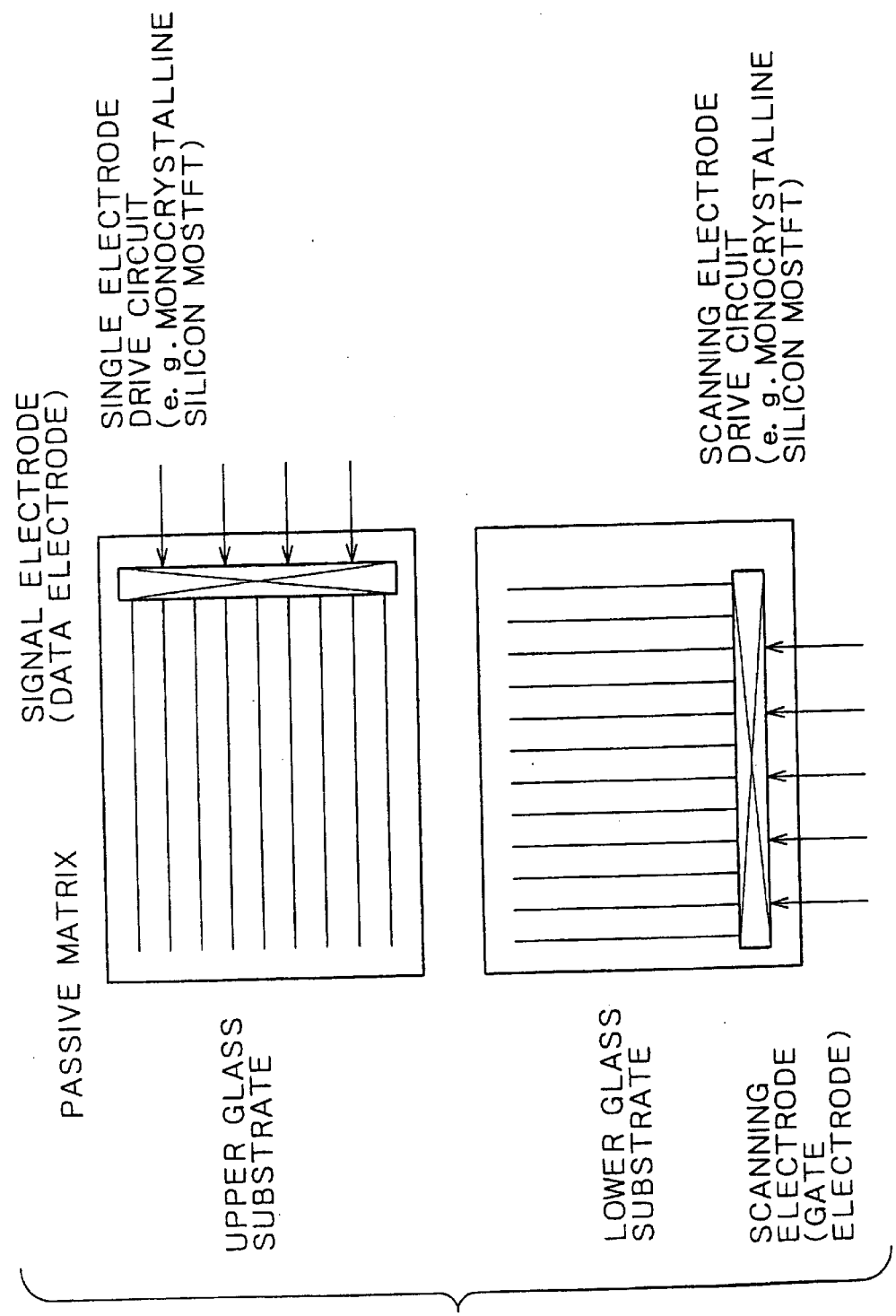
FIG. 76 is a schematic layout diagram of a device according to a fifteenth embodiment of this invention.

FIG. 76 shows a fifteenth embodiment of this invention.

In this embodiment, this invention is applied to a passive matrix drive, unlike the aforesaid embodiments which were applied to an active matrix drive.

Specifically, a switching element is not provided in the display unit as in the aforesaid MOSTFT, and light incident to or reflected from the display unit is adjusted only by a potential difference due to a voltage applied between a pair of electrodes formed on the facing substrate. This light adjustment element may be a reflecting type or transmitting type LCD, organic or inorganic EL (electroluminescent display element), FED (field emission display element), LEPD (light-emitting polymer display element) or LED (light-emitting diode display element).

Sixteenth Embodiment

FIG. 77 shows a sixteenth embodiment of this invention.

In this embodiment, the invention is applied to an organic or inorganic EL (electroluminescent display element), FED (field emission display element), LEPD (light-emitting polymer display element) or LED (light-emitting diode display element).

Figure 77A:
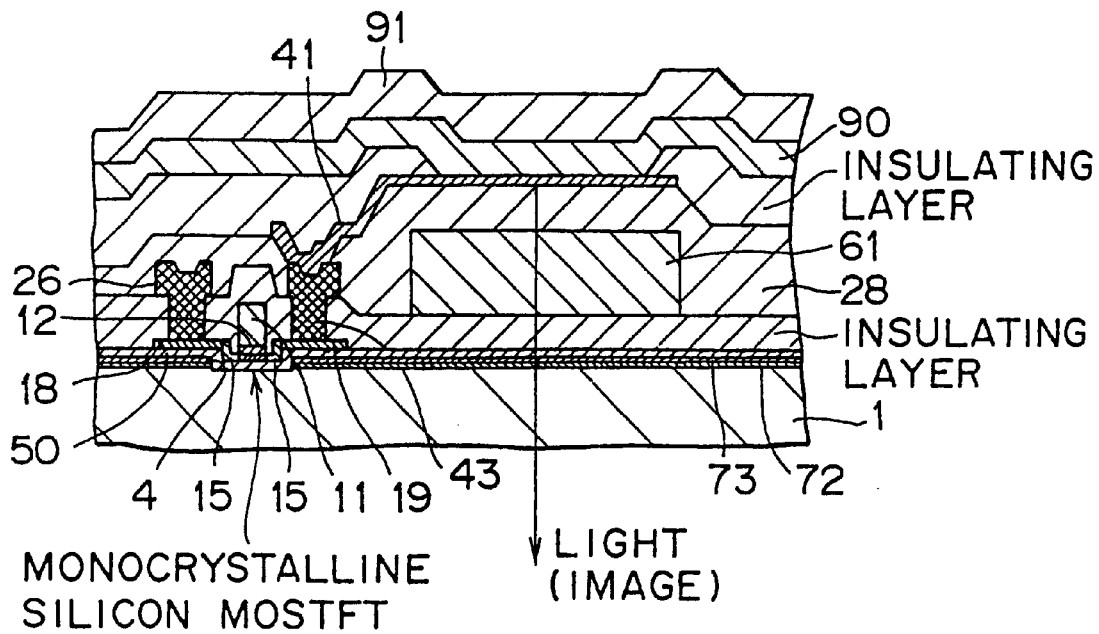
FIGS. 77A and 77B are diagrams showing essential parts of an EL and FED according to a sixteenth embodiment of this invention.

Specifically, FIG. 77(A) shows the electroluminescence element of an active matrix drive. An organic EL layer (or inorganic EL layer using ZnS:Mn) 90 using for example an amorphous organic compound is formed on the substrate 1, the transparent electrode (ITO) 41 already mentioned is formed in the lower part, a cathode 91 is formed in the upper part, and luminescence of a predetermined color is obtained through the filter 61 by applying a voltage between these two poles.

In this process, in order to apply a data voltage to the transparent electrode 41 by the active matrix drive, a monocrystalline silicon MOSTFT (i.e., nMOSLDD-TFT) according to this invention using a monocrystalline silicon layer grown heteroepitaxially by catalytic CVD, using the crystalline sapphire film 50 and the step 4 on the substrate 1 as a seed, is built into the substrate 1. An identical TFT is provided to the peripheral drive circuit. This electroluminescence element is driven by the MOSLDD-TFT using the monocrystalline silicon layer, so switching is fast and leak current is low. The above-mentioned filter 61 maybe omitted if the EL layer 90 emits light of a specific color.

In the case of the electroluminescence element, as the drive voltage is high, it is advantageous to provide high withstand voltage driver components (high withstand voltage cMOSTFT, bipolar components, etc.) in addition to the aforesaid MOSTFT in the peripheral drive circuit unit.

Figure 77B:
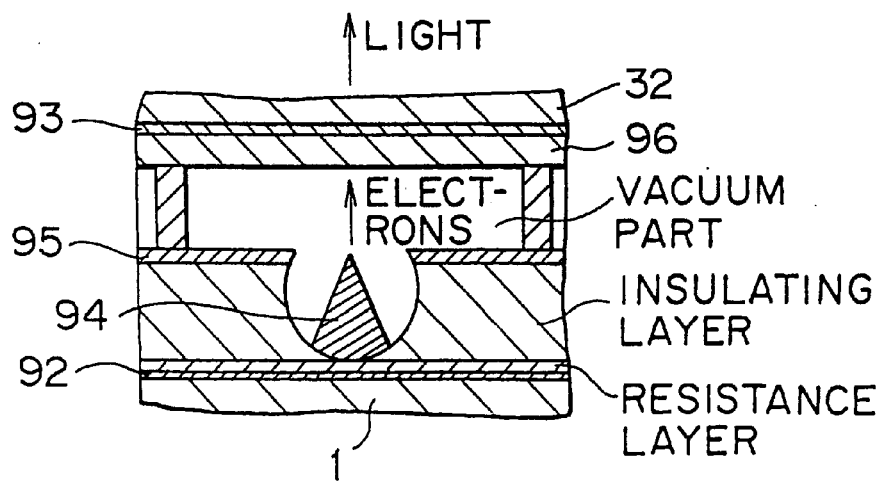

FIG. 77(B) shows a FED of a passive matrix drive wherein, in a vacuum part between the facing glass substrates 1–32, electrons discharged from a cold cathode 94 by applying a voltage between electrodes 92–93 are caused to be incident on a facing fluorescent material layer 96 by selecting a gate line 95, and luminescence of a predetermined color is obtained.

Here, an emitter line 92 is led to the peripheral drive circuit and is driven by a data voltage, and a MOSTFT using the monocrystalline silicon layer based on this invention is provided to the peripheral drive circuit which contributes to the high-speed drive of the emitter line 92. This FED can also be made to drive an active matrix by connecting the aforesaid MOSTFT to each pixel unit.

If a light-emitting polymer known in the art is used instead of the EL layer 90 in the element of FIG. 77(A), it can be used as a light-emitting polymer display (LEPD) for a passive-matrix or active matrix. It may also be used as a device similar to a FED using a diamond thin film on the cathode side in the element of FIG. 77(B). Further, it can be used to drive a light-emitting unit comprising, for example, a gallium type (e.g., gallium/aluminum/arsenic) film by means of a monocrystalline silicon MOSTFT heteroepitaxially grown according to this invention, in the light-emitting unit of a light-emitting diode.

In the embodiments described hereabove, various modifications are possible based on the technical concept of this invention For example, when the monocrystalline silicon film 7 is formed by catalytic CVD as described above, if diborane (B2H6), phosphine (PH3), arsine (A8H3) or stibine (SbH3) or the like are supplied and a suitable amount of, for example, boron, phosphorus, antimony or arsenic produced by decomposition of this supply gas is doped to the monocrystalline silicon layer, the P or N electrically conducting nature of the silicon epitaxial growth layer obtained and its carrier concentration can be controlled as desired. The monocrystalline silicon film 7 can also be formed by high density plasma CVD, for example ECR (electron cyclotron resonance) plasma CVD, etc.

A SiN film (for example, 50–200 nm thickness) and a $SiO_2$ film (for example, 100 nm thickness) may be formed on the substrate surface to prevent ion diffusion from the glass substrate, and the step 4 described hereabove may also be formed in these films. This step may further be formed by ion milling or the like in addition to RIE. In addition to the substrate 1, the step 4 may of course also be formed in the thickness of the crystalline sapphire film or a sapphire substrate itself, as mentioned above.

Instead of the sapphire (A1203) mentioned above, a material having a spinel structure (for example, magnesia spinel, $MgO/Al_2O_3$) having good lattice compatibility with monocrystalline silicon, or CaF2, SrF2, BaF2, BP, (Y203)m or (ZrO2)1−m may be used.

Although this invention is suitable for the TFT of a peripheral drive circuit, active regions of elements such as diodes, or passive regions such as resistances, capacitances or inductances, may also be formed by the monocrystalline silicon layer of this invention.

According to this invention, monocrystalline silicon is grown heteroepitaxially by catalytic CVD, high density plasma CD or the like using a substance film such as a crystalline sapphire film having good lattice compatibility with crystalline silicon is used as a seed, and the monocrystalline silicon layer obtained is used for a duel gate MOSTFT in a peripheral drive circuit unit of an electro-optic device such as an LCD comprising a display unit and peripheral drive circuit in a one-piece construction. The following remarkable advantages (A)–(H) are therefore obtained.

(A) A substance layer having good lattice compatibility with crystalline silicon (for example, a crystalline sapphire film) is formed on a substrate, and a monocrystalline silicon layer having a high electron mobility of not less than 540 $cm^2/v \cdot sec$ is obtained by performing heteroepitaxial growth using this material as a seed, so an electro-optic device such as a thin film semiconductor for a display having a high-performance built-in driver can be manufactured.

(B) The dual gate TFT formed from this monocrystalline silicon layer permits manufacture of a display unit comprising a nMOS, pMOS or cMOSTFT having an LDD structure with fast switching characteristics, and a peripheral drive circuit unit comprising a cMOS, nMOS or pMOSTFT or a combination thereof with high drive performance in a one-piece construction, thereby realizing a display panel with high image quality, fine detail, narrow frame edge, wide screen and high efficiency.

(C) As a dual gate type MOSTFT is used for the peripheral drive circuit, a cMOS, nMOS or pMOSTFT having a drive performance 1.5 to 2 times higher than a single gate TFT can be assembled, giving a TFT of higher performance and drive performance. This is particularly suitable when a TFT of high drive performance is required for a part of the peripheral drive circuit. For example, therefore, one of a pair of peripheral, vertical drive circuits be omitted, and this is an advantage when the invention is applied to electro-optic devices other than.LCD such as organic EL or FED. Further, the dual gate construction may be easily modified to top gate or bottom gate by selecting either the upper or lower gate, and if one of the upper or lower gates no longer functions, the other gate can be used.

(D) As the aforesaid substance layer is used as a seed for heteroepitaxial growth, and the monocrystalline silicon layer is formed on this substance layer by a low temperature technique by catalytic CVD (chemical vapor deposition using a catalyst, substrate temperature 200–800° C. and particularly 300–400° C.), the monocrystalline silicon layer can be formed uniformly at low temperature on the substrate. Therefore, substrates such as glass substrates or heat resistant organic substrates, which have a relatively low strain point, are easy to procure, are economical and have good physical properties, may be used, and large-size substrates can also be manufactured.

(E) Annealing and excimer laser annealing which require long periods at moderate temperature as in the case of solid phase growth are unnecessary, so productivity is high, and costly manufacturing equipment is not required thus permitting cost reductions.

(F) In this heteroepitaxial growth, a monocrystalline silicon thin film having a wide range of P or N electron conduction properties and high electron mobility is easily obtained by adjusting the crystallinity of the substance layer such as a crystalline sapphire film, gas composition ratio of catalytic CVD, substrate heating temperature and cooling rate, so it is easy to adjust Vth, and high-speed operation can be obtained by reducing resistance.

(G) Further, if a suitable amount of a Group III or Group V impurity element (boron, phosphorus, antimony, arsenic, bismuth or aluminum) is doped from a doping gas during film-forming of the monocrystalline silicon by catalytic CVD or a similar process, the type and/or concentration of the impurity element, i.e., the electrical conductance (P type/N type) and/or carrier concentration of the monocrystalline silicon layer formed by heteroepitaxial growth, may be controlled as desired.

(H) The aforesaid substance layer such as the crystalline sapphire film forms various atomic diffusion barriers, so diffusion of impurities from the glass substrate can be suppressed.

What is claimed is:

1. A method of manufacturing an electro-optic device comprising a display unit comprising a pixel electrode and a peripheral drive circuit unit on a first substrate, and a predetermined optical material interposed between this first substrate and a second substrate, said method comprising a process for forming a gate comprising a gate electrode and a gate insulation film on one of the surfaces of said first substrate, a process for forming a substance layer having good lattice compatibility with monocrystalline silicon on said surface of said first substrate, a process for heteroepitaxially growing a monocrystalline silicon layer on said first substrate comprising this substance layer and said gate using said substance layer as a seed by catalytic CVD or high density plasma CVD, a process for performing a predetermined processing on this monocrystalline silicon layer to form a channel region, source region and drain region, and a process for forming a first dual gate thin film transistor comprising said gate in the upper part and lower part respectively of said channel region, and forming at least part of said peripheral drive circuit unit.

2. A method of manufacturing an electro-optic device as defined in claim 1, wherein an insulating substrate is used as said first substrate, and said substance layer is formed from a substance chosen from sapphire, materials having a spinel structure, calcium fluoride, strontium fluoride, barium fluoride, boron phosphide, yttrium oxide and zirconium oxide.

3. A method of manufacturing an electro-optic device as defined in claim 1, wherein said monocrystalline silicon layer is formed at 200–800° C.

4. A method of manufacturing an electro-optic device as defined in claim 1, wherein, when said monocrystalline silicon layer is formed by said catalytic CVD, a gas having silicon hydride as its principal component is decomposed by bringing it into contact with a heated catalyst so that said monocrystalline silicon layer is deposited on said first substrate.

5. A method of manufacturing an electro-optic device as defined in claim 4, wherein a silane type gas such as a monosilane, disilane, trisilane or tetrasilane is used as said silicon hydride, and at least one material chosen from a group comprising tungsten, tungsten containing thorium oxide, molybdenum, platinum, palladium, silicon, alumina, ceramics with adhering metal and silicon carbide, is used as said catalyst.

6. A method of manufacturing an electro-optic device as defined in claim 1, wherein a Group III or Group V impurity element is introduced during the forming of said monocrystalline silicon layer, and the type and/or concentration of the impurity in said monocrystalline silicon layer is controlled.

7. A method of manufacturing an electro-optic device as defined in claim 1, wherein a diffusion barrier layer is formed on said first substrate, and said monocrystalline silicon layer is formed thereupon.

8. A method of manufacturing an electro-optic device as defined in claim 1, wherein a side end of said gate under said monocrystalline silicon layer has a trapezoidal shape.

9. A method of manufacturing an electro-optic device as defined in claim 1, wherein, apart from said first thin film transistor, a top gate, bottom gate or dual gate thin film transistor comprising a polycrystalline or amorphous silicon layer as channel region and having a gate in the upper part and/or lower part of this channel region, or a diode, resistance, capacitance or inductance element using said monocrystalline silicon layer, a polycrystalline silicon layer or an amorphous silicon layer, is provided to said peripheral drive circuit unit.

10. A method of manufacturing an electro-optic device as defined in claim 1, wherein a switching element for switching said pixel electrode is provided on said first substrate in said display unit.

11. A method of manufacturing an electro-optic device as defined in claim 10, wherein said first thin film transistor comprises at least a dual gate type chosen from a top gate, bottom gate or dual gate type having a gate in the upper part and/or lower part of a channel region, and said switching element is a second thin film transistor of said top gate, bottom gate or dual gate type.

12. A method of manufacturing an electro-optic device as defined in claim 11, wherein the gate electrode provided in the lower part of said channel region is formed of a heat resisting material.

13. A method of manufacturing an electro-optic device as defined in claim 11, wherein, when said second thin film transistor is a bottom gate or dual gate type, a lower gate is formed by providing a bottom gate electrode comprising a heat resisting material in the lower part of said channel region and forming a gate insulation film on this gate electrode, and said second thin film transistor is formed by a common process with said first thin film transistor comprising a process for forming said substance layer.

14. A method of manufacturing an electro-optic device as defined in claim 13, wherein said monocrystalline silicon layer is formed on said lower gate, a Group III or Group V impurity element is introduced in this monocrystalline silicon layer, and after forming a source and drain region, activation treatment is performed.

15. A method of manufacturing an electro-optic device as defined in claim 14, wherein after forming said monocrystalline silicon layer, the source and drain regions of said second thin film transistor are formed by ion implantation of said impurity element using a resist as a mask, said activation treatment is performed after this ion implantation to form a gate insulation film, an upper gate electrode of said first thin film transistor is formed, and an upper gate.electrode of said second thin film transistor is formed if necessary.

16. A method of manufacturing an electro-optic device as defined in claim 11, wherein, when said second thin film transistor is a top gate type, after forming said monocrystalline silicon layer, the source and drain regions of said second thin film transistor are formed by ion implantation of said impurity element using a resist as a mask, said activation treatment is performed after this ion implantation, and gates comprising a gate insulation film and gate electrode of said first and second thin film transistor are formed after an appropriate time.

17. A method of manufacturing an electro-optic device as defined in claim 11, wherein, after forming said monocrystalline silicon layer, gates are formed by forming gate electrodes comprising gate insulation films and heat resisting materials of said first and second thin film transistor, source and drain regions of said first and second thin film transistor are formed by ion implantation of an impurity element using these gates and a resist as a mask, and activation treatment is performed after this ion implantation.

18. A method of manufacturing an electro-optic device as defined in claim 11, wherein the thin film transistor of said peripheral drive circuit unit and said display unit is a n channel type, p channel type or complementary type of field effect insulated gate field effect transistor.

19. A method of manufacturing an electro-optic device as defined in claim 18, wherein said thin film transistor of said peripheral drive circuit unit is formed from a combination of complementary type and n channel type, a combination of complementary type and p channel type, or a combination of complementary type, n channel type and p channel type.

20. A method of manufacturing an electro-optic device as defined in claim 14, wherein at least part of the thin film transistor of said peripheral drive circuit and/or said display unit comprises a LDD (Lightly Doped Drain) structure, and this LDD structure is a single type having an LDD between a gate and a source or drain, or a double type having an LDD respectively between a gate, a source and a drain.

21. A method of manufacturing an electro-optic device as defined in claim 20, wherein a resist mask is left when said LDD structure is formed, and ion implantation .for forming a source region and drain region is performed using a resist mask covering this.

22. A method of manufacturing an electro-optic device as defined in claim 18, wherein a monocrystalline, polycrystalline or amorphous silicon layer is formed on one of the surfaces of said first substrate, and said second thin film transistor comprising said monocrystalline, polycrystalline or amorphous silicon layer as channel region, source region and drain region, and having a gate in the upper part and/or lower part thereof, is formed.

23. A method of manufacturing an electro-optic device as defined in claim 22, wherein the thin film transistor of said peripheral drive circuit unit is a n channel type, p channel type or complementary type of said first thin film transistor, and the thin film transistor of the display unit is n channel type, p channel type or complementary type when a monocrystalline silicon layer is the channel region, n channel type, p channel type or complementary type when a polycrystalline silicon layer is the channel region, and n channel type, p channel type or complementary type when an amorphous silicon layer is the channel region.

24. A method of manufacturing an electro-optic device as defined in claim 1, wherein a step is formed on said first substrate, said substance layer is formed on said first substrate comprising this step, and said monocrystalline silicon layer is formed on this substance layer.

25. A method of manufacturing an electro-optic device as defined in claim 24, wherein said step is formed as a depression having a side face perpendicular or slanting towards the lower end relative to the base plane in a section, and this step is a seed for epitaxial growth of said monocrystalline silicon layer together with said substance layer.

26. A method of manufacturing an electro-optic device as defined in claim 24, wherein said first thin film transistor is provided inside and/or outside a substrate depression due to said step formed in said first substrate and/or a film on said first substrate.

27. A method of manufacturing an electro-optic device as defined in claim 24, wherein said step is formed along at least one side of an element region formed in the channel region, source region and drain region of said first thin film transistor.

28. A method of manufacturing an electro-optic device as defined in claim 1, wherein said monocrystalline silicon layer is formed on said substance layer comprising this step.

29. A method of manufacturing an electro-optic device as defined in claim 28, wherein said step is formed as a depression having a side face perpendicular or slanting towards the lower end relative to the base plane in a section, and this step is a seed for epitaxial growth of said monocrystalline silicon layer together with said substance layer.

30. A method of manufacturing an electro-optic device as defined in claim 28, wherein said first thin film transistor is provided inside and/or outside a substrate depression due to said step formed in said first substrate and/or a film on said first substrate.

31. A method of manufacturing an electro-optic device as defined in claim 28, wherein said step is formed along at least one side of an element region formed in the channel region, source region and drain region of said first thin film transistor.

32. A method of manufacturing an electro-optic device as defined in claim 22, wherein a step is formed on one of the surfaces of said first substrate, a monocrystalline, polycrystalline or amorphous silicon layer is formed on said first substrate comprising this step, and said second thin film transistor comprising said monocrystalline, polycrystalline or amorphous silicon layer as channel region, source region and drain region, and having a gate in the upper part and/or lower part of said channel region, is formed.

33. A method of manufacturing an electro-optic device as defined in claim 30, wherein said step is formed as a depression having a side face perpendicular or slanting towards the lower end relative to the base plane in a section, and this step is a seed for epitaxial growth of said monocrystalline silicon layer.

34. A method of manufacturing an electro-optic device as defined in claim 30, wherein said source or drain electrode of said first and/or second thin film transistor is formed on a region comprising said step.

35. A method of manufacturing an electro-optic device as defined in claim 30, wherein said second thin film transistor is provided inside and/or outside a substrate depression due to said step formed in said first substrate and/or a film on said first substrate.

36. A method of manufacturing an electro-optic device as defined in claim 22, wherein the type and/or concentration of Group III or Group V impurities in said monocrystalline, polycrystalline or amorphous silicon layer is controlled.

37. A method of manufacturing an electro-optic device as defined in claim 30, wherein said step is formed along at least one side of an element region formed in said channel region, said source region and said drain region of said second thin film transistor.

38. A method of manufacturing an electro-optic device as defined in claim 22, wherein a side end of said gate electrode under said monocrystalline, polycrystalline or amorphous silicon layer has a trapezoidal shape.

39. A method of manufacturing an electro-optic device as defined in claim 22, wherein a diffusion barrier layer is provided between said first substrate and said monocrystalline, polycrystalline or amorphous silicon layer.

40. A method of manufacturing an electro-optic device as defined in claim 1, wherein said first substrate is a glass substrate or heat resisting organic substrate.

41. A method of manufacturing an electro-optic device as defined in claim 1, wherein said substrate is optically opaque or transparent.

42. A method of manufacturing an electro-optic device as defined in claim 1 wherein said pixel electrode is provided to either a reflecting type or transmitting type display unit.

43. A method of manufacturing an electro-optic device as defined in claim 30, wherein said display unit has a laminated structure comprising said pixel electrode and a color filter layer.

44. A method of manufacturing an electro-optic device as defined in claim 1, wherein when said pixel electrode is a reflecting electrode, an unevenness is formed on a resin film and the pixel electrode is provided thereon, and when said pixel electrode is a transparent electrode, the surface is flattened by a transparent flattening film and said pixel electrode is provided on this flattened surface.

45. A method of manufacturing an electro-optic device as defined in claim 10, wherein light emission or light adjustment is performed by driving said display unit by said switching element.

46. A method of manufacturing an electro-optic device as defined in claim 10, wherein a plurality of said pixel electrodes are aligned in a matrix, and said switching element is respectively connected to these pixel electrodes.

47. A method of manufacturing an electro-optic device as defined in claim 1, said device having the construction of a liquid crystal display device, electro-luminescence display device, field emission type display device, light-emitting polymer display device or light emitting diode display device.

48. A method of manufacturing a drive substrate for an electro-optic device comprising a display unit having a pixel electrode and a peripheral drive circuit unit provided on a substrate, said method comprising:
a process for forming a gate comprising a gate electrode and a gate insulation film on one of the surfaces of said substrate, a process for forming a substance layer having good lattice compatibility with monocrystalline silicon on said surface of said substrate, a process for heteroepitaxially growing a monocrystalline silicon layer on said substrate comprising this substance layer and said gate by catalytic CVD or high density plasma CVD using said substance layer as a seed, a process for performing a predetermined treatment on this monocrystalline silicon layer to form a channel region, source region and drain region, and a process for forming a first dual gate thin film transistor comprising said gate in the upper part and lower part respectively of said channel region, and forming at least part of said peripheral drive circuit unit.

49. A method of manufacturing an electro-optic device as defined in claim 48, wherein an insulating substrate is used as said substrate, and said substance layer is formed from a substance chosen from sapphire, materials having a spinel structure, calcium fluoride, strontium fluoride, barium fluoride, boron phosphide, yttrium oxide and zirconium oxide.

50. A method of manufacturing an electro-optic device as defined in claim 48, wherein said monocrystalline silicon layer is formed at 200–800° C.

51. A method of manufacturing an electro-optic device as defined in claim 48, wherein, when said monocrystalline silicon layer is formed by said catalytic CVD, a gas having silicon hydride as its principal component is decomposed by bringing it into contact with a heated catalyst so that said monocrystalline silicon layer is deposited on said substrate.

52. A method of manufacturing an electro-optic device as defined in claim 51, wherein a silane type gas such as a monosilane, disilane, trisilane or tetrasilane is used as said silicon hydride, and at least one material chosen from a group comprising tungsten, tungsten containing thorium oxide, molybdenum, platinum, palladium, silicon, alumina, ceramics with adhering metal and silicon carbide, is used as said catalyst.

53. A method of manufacturing an electro-optic device as defined in claim 48, wherein a Group III or Group V impurity element is introduced during the forming of said monocrystalline silicon layer, and the type and/or concentration of the impurity in said monocrystalline silicon layer is controlled.

54. A method of manufacturing an electro-optic device as defined in claim 48, wherein a diffusion barrier layer is formed on said first substrate, and said monocrystalline silicon layer is formed thereupon.

55. A method of manufacturing an electro-optic device as defined in claim 48, wherein a side end of said gate under said monocrystalline silicon layer has a trapezoidal shape.

56. A method of manufacturing an electro-optic device as defined in claim 48, wherein, apart from said thin film transistor, a top gate, bottom gate or dual gate thin film transistor comprising a polycrystalline or amorphous silicon layer as channel region, and having a gate in the upper part and/or lower part of this channel region, or a diode, resistance, capacitance or inductance element using a monocrystalline silicon layer, polycrystalline silicon layer or amorphous silicon layer, is provided to said peripheral drive circuit unit.

57. A method of manufacturing an electro-optic device as defined in claim 48, wherein a switching element for switching said pixel electrode is provided on said first substrate in said display unit.

58. A method of manufacturing an electro-optic device as defined in claim 57, wherein said first thin film transistor comprises at least a dual gate type chosen from a top gate, bottom gate or dual gate type having a gate in the upper part and/or lower part of the channel region, and said switching element is a second thin film transistor of said top gate, bottom gate or dual gate type.

59. A method of manufacturing an electro-optic device as defined in claim 58, wherein the gate electrode provided in the lower part of said channel region is formed of a heat resisting material.

60. A method of manufacturing an electro-optic device as defined in claim 58, wherein, when said second thin film transistor is a bottom gate or dual gate type, a lower gate is formed by providing a bottom gate electrode comprising a heat resisting material in the lower part of said channel region and forming a gate insulation film on this gate electrode, and said second thin film transistor is formed by a common process with said first thin film transistor comprising a process for forming said substance layer.

61. A method of manufacturing an electro-optic device as defined in claim 60, wherein said monocrystalline silicon layer is formed on said lower gate, a Group III or Group V impurity element is introduced in this monocrystalline silicon layer, and after forming a source and drain region, activation treatment is performed.

62. A method of manufacturing an electro-optic device as defined in claim 61, wherein after forming said monocrystalline silicon layer, the source and drain regions of said second thin film transistor are formed by ion implantation of said impurity element using a resist as a mask, said activation treatment is performed after this ion implantation to form a gate insulation film, an upper gate electrode of said first thin film transistor is formed, and an upper gate electrode of said second thin film transistor is formed if necessary.

63. A method of manufacturing an electro-optic device as defined in claim 58, wherein, when said second thin film transistor is a top gate type, after forming said monocrystalline silicon layer, the source and drain regions of said second thin film transistor are formed by ion implantation of said impurity element using a resist as a mask, said activation treatment is performed after this ion implantation, and gates comprising a gate insulation film and gate electrode of said first and second thin film transistor are formed after an appropriate time.

64. A method of manufacturing an electro-optic device as defined in claim 58, wherein, after forming said monocrystalline silicon layer, gates are formed by forming gate electrodes comprising gate insulation films and heat resisting materials of said first and second thin film transistor, source and drain regions of said first and second thin film transistor are formed by ion implantation of an impurity element using these gates and a resist as a mask, and activation treatment is performed after this ion implantation.

65. A method of manufacturing an electro-optic device as defined in claim 58, wherein the thin film transistor of said peripheral drive circuit unit and said display unit is a n channel type, p channel type or complementary type of field effect insulated gate field effect transistor.

66. A method of manufacturing an electro-optic device as defined in claim 65, wherein said thin film transistor of said peripheral drive circuit unit is formed from a combination of complementary type and n channel type, a combination of complementary type and p channel type, or a combination of complementary type, n channel type and p channel type.

67. A method of manufacturing an electro-optic device as defined in claim 61, wherein at least part of the thin film transistor of said peripheral drive circuit and/or said display unit comprises a LDD (Lightly Doped Drain) structure, and this LDD structure is a single type having an LDD between a gate and a source or drain, or a double type having an LDD respectively between a gate, and a source and a drain.

68. A method of manufacturing an electro-optic device as defined in claim 67, wherein a resist mask is left when said LDD structure is formed, and ion implantation for forming a source region and drain region is performed using a resist mask covering this.

69. A method of manufacturing an electro-optic device as defined in claim 65, wherein a monocrystalline, polycrystalline or amorphous silicon layer is formed on one of the surfaces of said first substrate, and said second thin film transistor comprising said monocrystalline, polycrystalline or amorphous silicon layer as channel region, source region and drain region, and having a gate in the upper part and/or lower part thereof, is formed.

70. A method of manufacturing an electro-optic device as defined in claim 69, wherein the thin film transistor of said peripheral drive circuit unit is a channel type, p channel type or complementary type of said first thin film transistor, and the thin film transistor of said display unit is n channel type, p channel type or complementary type when a monocrystalline silicon layer is the channel region, n channel type, p channel type or complementary type when a polycrystalline silicon layer is the channel region, and n channel type, p channel type or complementary type when an amorphous silicon layer is the channel region.

71. A method of manufacturing an electro-optic device as defined in claim 48, wherein a step is formed on said first substrate, said substance layer is formed on said first substrate comprising this step, and said monocrystalline silicon layer is formed on this substance layer.

72. A method of manufacturing an electro-optic device as defined in claim 71, wherein said step is formed as a depression having a side face perpendicular or slanting towards the lower end relative to the base plane in a section, and this step is a seed for epitaxial growth of said monocrystalline silicon layer together with said substance layer.

73. A method of manufacturing an electro-optic device as defined in claim 71, wherein said first thin film transistor is provided inside and/or outside a substrate depression due to said step formed in said first substrate and/or a film on said first substrate.

74. A method of manufacturing an electro-optic device as defined in claim 71, wherein said step is formed along at least one side of an element region formed in the channel region, source region and drain region of said first thin film transistor.

75. A method of manufacturing an electro-optic device as defined in claim 48, wherein said monocrystalline silicon layer is formed on said substance layer comprising this step.

76. A method of manufacturing an electro-optic device as defined in claim 75, wherein said step is formed as a depression having a side face perpendicular or slanting towards the lower end relative to the base plane in a section, and this step is a seed for epitaxial growth of said monocrystalline silicon layer together with said substance layer.

77. A method of manufacturing an electro-optic device as defined in claim 75, wherein said first thin film transistor is provided inside and/or outside a substrate depression due to said step formed in said first substrate and/or a film on said first substrate.

78. A method of manufacturing an electro-optic device as defined in claim 75, wherein said step is formed along at least one side of an element region formed in the channel region, source region and drain region of said first thin film transistor.

79. A method of manufacturing an electro-optic device as defined in claim 69, wherein a step is formed on one of the surfaces of said first substrate, a monocrystalline, polycrystalline or amorphous silicon layer is formed on said first substrate comprising this step, and said second thin film transistor comprising said monocrystalline, polycrystalline or amorphous silicon layer as channel region, source region and drain region, and having a gate in the upper part and/or lower part of said channel region, is formed.

80. A method of manufacturing an electro-optic device as defined in claim 79, wherein said step is formed as a depression having a side face perpendicular or slanting towards the lower end relative to the base plane in a section, and this step is a seed for epitaxial growth of said monocrystalline silicon layer.

81. A method of manufacturing an electro-optic device as defined in claim 76, wherein said source or drain electrode of said first and/or second thin film transistor is formed on a region comprising said step.

82. A method of manufacturing an electro-optic device as defined in claim 79, wherein said second thin film transistor is provided inside and/or outside a substrate depression due to said step formed in said first substrate and/or a film on said first substrate.

83. A method of manufacturing an electro-optic device as defined in claim 69, wherein the type and/or concentration of Group III or Group V impurities in said monocrystalline, polycrystalline or amorphous silicon layer is controlled.

84. A method of manufacturing an electro-optic device as defined in claim 79, wherein said step is formed along at least one side of an element region formed in said channel region, said source region and said drain region of said second thin film transistor.

85. A method of manufacturing an electro-optic device as defined in claim 69, wherein a side end of said gate electrode under said monocrystalline, polycrystalline or amorphous silicon layer has a trapezoidal shape.

86. A method of manufacturing an electro-optic device as defined in claim 69, wherein a diffusion barrier layer is provided between said first substrate and said monocrystalline, polycrystalline or amorphous silicon layer.

87. A method of manufacturing an electro-optic device as defined in claim 48, wherein said first substrate is a glass substrate or heat resisting organic substrate.

88. A method of manufacturing an electro-optic device as defined in claim 48, wherein said substrate is optically opaque or transparent.

89. A method of manufacturing an electro-optic device as defined in claim 48, wherein said pixel electrode is used for either a reflecting type or transmitting type display unit.

90. A method of manufacturing an electro-optic device as defined in claim 48, wherein said display unit has a laminated structure comprising said pixel electrode and a color filter layer.

91. A method of manufacturing an electro-optic device as defined in claim 48, wherein when said pixel electrode is a reflecting electrode, an unevenness is formed on a resin film and the pixel electrode is provided thereon, and when said pixel electrode is a transparent electrode, the surface is flattened by a transparent flattening film and said pixel electrode is provided on this flattened surface.

92. A method of manufacturing an electro-optic device as defined in claim 57, wherein light emission or light adjustment is performed by driving said display unit by said switching element.

93. A method of manufacturing an electro-optic device as defined in claim 57, wherein a plurality of said pixel electrodes are aligned in a matrix, and said switching element is respectively connected to these pixel electrodes.

94. A method of manufacturing an electro-optic device as defined in claim 48, said device having the construction of a liquid crystal display device, electro-luminescence display device, field emission type display device, luminescence polymer display device or light emitting diode display device.

* * * * *

UNITED STATES PATENT AND TRADEMARK OFFICE
CERTIFICATE OF CORRECTION

PATENT NO. : 6,521,525 B2
DATED : February 18, 2003
INVENTOR(S) : Hideo Yamanaka et al.

It is certified that error appears in the above-identified patent and that said Letters Patent is hereby corrected as shown below:

Column 44,
Line 63, "and an upper gate.electrode" should read -- and an upper gate electrode --.

Column 45,
Line 38, "implantation .for forming" should read -- implantation for forming --.

Column 48,
Line 26, "said.monocrystalline" should read -- said monocrystalline --.

Signed and Sealed this

Fifth Day of August, 2003

JAMES E. ROGAN
*Director of the United States Patent and Trademark Office*